(12) United States Patent
Poliquin et al.

(10) Patent No.: US 9,293,680 B2
(45) Date of Patent: Mar. 22, 2016

(54) CARTRIDGE-BASED THERMOELECTRIC SYSTEMS

(75) Inventors: Eric Poliquin, Arcadia, CA (US);
Douglas T. Crane, Altadena, CA (US);
Vladimir Jovovic, Pasadena, CA (US);
Joseph Dean, Upland, CA (US); Dmitri Kossakovski, S. Pasadena, CA (US);
John Walter LaGrandeur, Fallbrook, CA (US)

(73) Assignee: Gentherm Incorporated, Northville, MI (US)

( * ) Notice: Subject to any disclaimer, the term of this patent is extended or adjusted under 35 U.S.C. 154(b) by 574 days.

(21) Appl. No.: 13/489,237

(22) Filed: Jun. 5, 2012

(65) Prior Publication Data

US 2013/0104953 A1  May 2, 2013

Related U.S. Application Data

(60) Provisional application No. 61/493,871, filed on Jun. 6, 2011, provisional application No. 61/493,926, filed on Jun. 6, 2011, provisional application No. 61/566,194, filed on Dec. 2, 2011, provisional application No. 61/493,935, filed on Jun. 6, 2011.

(51) Int. Cl.
*H01L 35/32* (2006.01)
*H01L 35/30* (2006.01)
*H01M 14/00* (2006.01)
(Continued)

(52) U.S. Cl.
CPC ............... *H01L 35/32* (2013.01); *F01N 5/025* (2013.01); *F28F 1/24* (2013.01); *H01L 35/30* (2013.01); *H01M 14/00* (2013.01); *F25B 21/04* (2013.01);
(Continued)

(58) Field of Classification Search
None
See application file for complete search history.

(56) References Cited

U.S. PATENT DOCUMENTS

| 413,136 | A | 10/1889 | Dewey |
| 1,120,781 | A | 12/1914 | Altenkirch et al. |

(Continued)

FOREIGN PATENT DOCUMENTS

| CN | 1195090 | 10/1998 |
| CN | 1249067 A | 3/2000 |

(Continued)

OTHER PUBLICATIONS

Crane, D. T.: "Progress Towards Maximizing the Performance of a thermoelectric Power Generator", ICT '06, 25th, USA, IEEE, Aug. 1, 2006, 11-161.

(Continued)

*Primary Examiner* — Jeffrey T Barton
*Assistant Examiner* — Meisha Binkley
(74) *Attorney, Agent, or Firm* — Knobbe, Martens, Olson & Bear LLP

(57) ABSTRACT

Cartridge-based thermoelectric assemblies and systems are provided which include at least one shunt configured to extend around a conduit, a plurality of thermoelectric elements in thermal communication and in electrical communication with the at least one shunt with at least a portion of the at least one shunt sandwiched between the at least one first thermoelectric element and the at least one second thermoelectric element. The thermoelectric elements are electrically isolated from the conduit. The thermoelectric assemblies and systems further include at least one heat exchanger in thermal communication with the at least one shunt and configured to be in thermal communication with a second fluid.

35 Claims, 69 Drawing Sheets

(51) Int. Cl.
*F28F 1/24* (2006.01)
*F01N 5/02* (2006.01)
*F25B 21/04* (2006.01)
*F28D 7/10* (2006.01)

(52) U.S. Cl.
CPC ............ *F28D 7/106* (2013.01); *F28F 2265/10* (2013.01); *Y02T 10/16* (2013.01)

(56) References Cited

U.S. PATENT DOCUMENTS

| | | | |
|---|---|---|---|
| 2,027,534 A | 1/1936 | Ingersoll | |
| 2,362,259 A | 11/1944 | Findley | |
| 2,363,168 A | 11/1944 | Findley | |
| 2,499,901 A | 3/1950 | Brown, Jr. | |
| 2,519,241 A | 8/1950 | Findley | |
| 2,938,357 A | 5/1960 | Sheckler | |
| 2,944,404 A | 7/1960 | Fritts | |
| 2,992,538 A | 7/1961 | Siegfried | |
| 3,004,393 A | 10/1961 | Alsing | |
| 3,006,979 A | 10/1961 | Rich | |
| 3,019,609 A | 2/1962 | Pietsch | |
| 3,070,645 A | 12/1962 | Tracht | |
| 3,071,495 A | 1/1963 | Hanlein | |
| 3,126,116 A | 3/1964 | Clinehens | |
| 3,129,116 A | 4/1964 | Corry | |
| 3,137,142 A | 6/1964 | Venema | |
| 3,178,895 A | 4/1965 | Mole et al. | |
| 3,196,620 A | 7/1965 | Elfving et al. | |
| 3,197,342 A | 7/1965 | Neild, Jr. | |
| 3,213,630 A | 10/1965 | Mole | |
| 3,391,727 A | 7/1968 | Armenag Topouszian | |
| 3,505,728 A | 4/1970 | Hare et al. | |
| 3,522,106 A | 7/1970 | Debiesse et al. | |
| 3,527,621 A | 9/1970 | Newton | |
| 3,554,815 A | 1/1971 | Osborn | |
| 3,599,437 A | 8/1971 | Panas | |
| 3,607,444 A | 9/1971 | DeBucs | |
| 3,615,869 A * | 10/1971 | Barker et al. | 136/236.1 |
| 3,626,704 A | 12/1971 | Coe, Jr. | |
| 3,635,037 A | 1/1972 | Hubert | |
| 3,663,307 A | 5/1972 | Mole | |
| 3,681,929 A | 8/1972 | Schering | |
| 3,726,100 A | 4/1973 | Widakowich | |
| 3,817,043 A | 6/1974 | Zoleta | |
| 3,880,674 A | 4/1975 | Saunders | |
| 3,885,126 A | 5/1975 | Sugiyama et al. | |
| 3,958,324 A | 5/1976 | Alais et al. | |
| 3,973,524 A | 8/1976 | Rubin | |
| 4,038,831 A | 8/1977 | Gaudel et al. | |
| 4,047,093 A | 9/1977 | Levoy | |
| 4,055,053 A | 10/1977 | Elfving | |
| 4,056,406 A | 11/1977 | Markman et al. | |
| 4,065,936 A | 1/1978 | Fenton et al. | |
| 4,095,998 A | 6/1978 | Hanson | |
| 4,125,122 A | 11/1978 | Stachurski | |
| 4,211,889 A | 7/1980 | Kortier et al. | |
| 4,281,516 A | 8/1981 | Berthet et al. | |
| 4,297,841 A | 11/1981 | Cheng | |
| 4,297,849 A | 11/1981 | Buffet | |
| 4,386,596 A | 6/1983 | Tuckey | |
| 4,402,188 A | 9/1983 | Skala | |
| 4,420,940 A | 12/1983 | Buffet | |
| 4,448,028 A | 5/1984 | Chao et al. | |
| 4,448,157 A | 5/1984 | Eckstein et al. | |
| 4,494,380 A | 1/1985 | Cross | |
| 4,499,329 A | 2/1985 | Benicourt et al. | |
| 4,531,379 A | 7/1985 | Diefenthaler, Jr. | |
| 4,595,297 A | 6/1986 | Liu et al. | |
| 4,634,803 A | 1/1987 | Mathiprakasam | |
| 4,651,019 A | 3/1987 | Gilbert et al. | |
| 4,730,459 A | 3/1988 | Schlicklin et al. | |
| 4,753,682 A | 6/1988 | Cantoni | |
| 4,802,929 A | 2/1989 | Schock | |
| 4,885,087 A | 12/1989 | Kopf | |
| 4,907,060 A | 3/1990 | Nelson et al. | |
| 4,989,626 A | 2/1991 | Takagi et al. | |
| 5,006,178 A | 4/1991 | Bijvoets | |
| 5,038,569 A | 8/1991 | Shirota et al. | |
| 5,092,129 A | 3/1992 | Bayes et al. | |
| 5,171,372 A | 12/1992 | Recine, Sr. | |
| 5,180,293 A | 1/1993 | Hartl | |
| 5,193,347 A | 3/1993 | Apisdorf | |
| 5,228,923 A | 7/1993 | Hed | |
| 5,232,516 A | 8/1993 | Hed | |
| 5,254,178 A | 10/1993 | Yamada et al. | |
| 5,291,960 A | 3/1994 | Brandenburg et al. | |
| 5,316,078 A | 5/1994 | Cesaroni | |
| 5,385,020 A | 1/1995 | Gwilliam et al. | |
| 5,419,780 A | 5/1995 | Suski | |
| 5,419,980 A | 5/1995 | Okamoto et al. | |
| 5,429,680 A | 7/1995 | Fuschetti | |
| 5,430,322 A | 7/1995 | Koyanagi et al. | |
| 5,431,021 A | 7/1995 | Gwilliam et al. | |
| 5,456,081 A | 10/1995 | Chrysler et al. | |
| 5,497,625 A | 3/1996 | Manz et al. | |
| 5,544,487 A | 8/1996 | Attey et al. | |
| 5,549,153 A | 8/1996 | Baruschke et al. | |
| 5,561,981 A | 10/1996 | Quisenberry et al. | |
| 5,563,368 A | 10/1996 | Yamaguchi | |
| 5,566,774 A | 10/1996 | Yoshida | |
| 5,576,512 A | 11/1996 | Doke | |
| 5,584,183 A | 12/1996 | Wright et al. | |
| 5,592,363 A | 1/1997 | Atarashi et al. | |
| 5,594,609 A | 1/1997 | Lin | |
| 5,682,748 A | 11/1997 | DeVilbiss et al. | |
| 5,705,770 A | 1/1998 | Ogasawara et al. | |
| 5,713,426 A | 2/1998 | Okamura | |
| 5,724,818 A | 3/1998 | Iwata et al. | |
| 5,822,993 A | 10/1998 | Attey | |
| 5,860,472 A | 1/1999 | Batchelder | |
| 5,867,990 A | 2/1999 | Ghoshal | |
| 5,917,144 A | 6/1999 | Miyake et al. | |
| 5,959,341 A | 9/1999 | Tsuno et al. | |
| 5,966,941 A | 10/1999 | Ghoshal | |
| 5,987,890 A | 11/1999 | Chiu et al. | |
| 6,000,225 A | 12/1999 | Ghoshal | |
| 6,028,263 A | 2/2000 | Kobayashi et al. | |
| 6,050,326 A | 4/2000 | Evans | |
| 6,082,445 A | 7/2000 | Dugan | |
| 6,084,172 A | 7/2000 | Kishi et al. | |
| 6,096,966 A | 8/2000 | Nishimoto et al. | |
| 6,127,766 A | 10/2000 | Roidt | |
| 6,213,198 B1 | 4/2001 | Shikata et al. | |
| 6,223,539 B1 | 5/2001 | Bell | |
| 6,226,994 B1 | 5/2001 | Yamada et al. | |
| 6,270,015 B1 | 8/2001 | Hirota | |
| 6,282,907 B1 | 9/2001 | Ghoshal | |
| 6,302,196 B1 | 10/2001 | Haussmann | |
| 6,320,280 B1 | 11/2001 | Kanesaka | |
| 6,334,311 B1 | 1/2002 | Kim et al. | |
| 6,346,668 B1 | 2/2002 | McGrew | |
| 6,347,521 B1 | 2/2002 | Kadotani et al. | |
| 6,357,518 B1 | 3/2002 | Sugimoto et al. | |
| 6,367,261 B1 | 4/2002 | Marshall et al. | |
| 6,385,976 B1 | 5/2002 | Yamamura et al. | |
| 6,393,842 B2 | 5/2002 | Kim | |
| 6,446,442 B1 | 9/2002 | Batchelor et al. | |
| 6,474,073 B1 | 11/2002 | Uetsuji et al. | |
| 6,477,844 B2 | 11/2002 | Ohkubo et al. | |
| 6,499,306 B2 | 12/2002 | Gillen | |
| 6,530,231 B1 | 3/2003 | Nagy et al. | |
| 6,539,725 B2 | 4/2003 | Bell | |
| 6,541,139 B1 | 4/2003 | Cibuzar | |
| 6,548,750 B1 | 4/2003 | Picone | |
| 6,560,968 B2 | 5/2003 | Ko | |
| 6,563,039 B2 | 5/2003 | Caillat et al. | |
| RE38,128 E | 6/2003 | Gallup et al. | |
| 6,580,025 B2 | 6/2003 | Guy | |
| 6,598,403 B1 | 7/2003 | Ghoshal | |
| 6,598,405 B2 | 7/2003 | Bell | |
| 6,605,773 B2 | 8/2003 | Kok | |
| 6,606,866 B2 | 8/2003 | Bell | |
| 6,625,990 B2 | 9/2003 | Bell | |

(56) References Cited

U.S. PATENT DOCUMENTS

| | | |
|---|---|---|
| 6,637,210 B2 | 10/2003 | Bell |
| 6,650,968 B2 | 11/2003 | Hallum et al. |
| 6,672,076 B2 | 1/2004 | Bell |
| 6,700,052 B2 | 3/2004 | Bell |
| 6,705,089 B2 | 3/2004 | Chu et al. |
| 6,779,348 B2 | 8/2004 | Taban |
| 6,812,395 B2 | 11/2004 | Bell |
| 6,880,346 B1 | 4/2005 | Tseng et al. |
| 6,886,356 B2 | 5/2005 | Kubo et al. |
| 6,907,739 B2 | 6/2005 | Bell |
| 6,948,321 B2 | 9/2005 | Bell |
| 6,959,555 B2 | 11/2005 | Bell |
| 6,973,799 B2 | 12/2005 | Kuehl et al. |
| 6,975,060 B2 | 12/2005 | Styblo et al. |
| 6,986,247 B1 | 1/2006 | Parise |
| 7,100,369 B2 | 9/2006 | Yamaguchi et al. |
| 7,111,465 B2 | 9/2006 | Bell |
| 7,134,288 B2 | 11/2006 | Crippen et al. |
| 7,150,147 B2 | 12/2006 | Murata |
| 7,171,955 B2 | 2/2007 | Perkins |
| 7,222,489 B2 | 5/2007 | Pastorino |
| 7,231,772 B2 | 6/2007 | Bell |
| 7,235,735 B2 | 6/2007 | Venkatasubramanian et al. |
| 7,273,981 B2 | 9/2007 | Bell |
| 7,380,586 B2 | 6/2008 | Gawthrop |
| 7,421,845 B2 | 9/2008 | Bell |
| 7,430,875 B2 | 10/2008 | Sasaki et al. |
| 7,475,551 B2 | 1/2009 | Ghoshal |
| 7,523,607 B2 | 4/2009 | Sullivan |
| 7,587,902 B2 | 9/2009 | Bell |
| 7,608,777 B2 | 10/2009 | Bell et al. |
| 7,629,530 B2 | 12/2009 | Inaoka |
| 7,788,933 B2 | 9/2010 | Goenka |
| 7,870,745 B2 | 1/2011 | Goenka |
| 7,921,640 B2 | 4/2011 | Major |
| 7,926,293 B2 | 4/2011 | Bell |
| 7,932,460 B2 | 4/2011 | Bell |
| 7,942,010 B2 | 5/2011 | Bell et al. |
| 7,946,120 B2 | 5/2011 | Bell |
| 8,039,726 B2 | 10/2011 | Zhang et al. |
| 8,069,674 B2 | 12/2011 | Bell |
| 8,079,223 B2 | 12/2011 | Bell |
| 8,297,049 B2 | 10/2012 | Ohtani |
| 8,327,634 B2 | 12/2012 | Orihashi et al. |
| 8,375,728 B2 | 2/2013 | Bell |
| 8,424,315 B2 | 4/2013 | Goenka |
| 8,445,772 B2 | 5/2013 | Bell et al. |
| 8,495,884 B2 | 7/2013 | Bell et al. |
| 8,540,466 B2 | 9/2013 | Halliar |
| 8,613,200 B2 | 12/2013 | Lagrandeur et al. |
| 8,640,466 B2 | 2/2014 | Bell et al. |
| 8,656,710 B2 | 2/2014 | Bell et al. |
| 8,701,422 B2 | 4/2014 | Bell et al. |
| 8,800,263 B2 | 8/2014 | Eder et al. |
| 9,105,809 B2 | 8/2015 | Lofy |
| 2001/0029974 A1 | 10/2001 | Cohen et al. |
| 2002/0014261 A1 | 2/2002 | Caillat et al. |
| 2002/0024154 A1 | 2/2002 | Hara et al. |
| 2003/0041892 A1 | 3/2003 | Fleurial et al. |
| 2003/0084935 A1 | 5/2003 | Bell |
| 2003/0094265 A1 | 5/2003 | Chu et al. |
| 2003/0106677 A1 | 6/2003 | Memory et al. |
| 2003/0140636 A1 | 7/2003 | Van Winkle |
| 2003/0140957 A1 | 7/2003 | Akiba |
| 2003/0217738 A1 | 11/2003 | Ryon |
| 2003/0223919 A1 | 12/2003 | Kwak et al. |
| 2004/0025516 A1 | 2/2004 | Van Winkle |
| 2004/0045594 A1 | 3/2004 | Hightower |
| 2004/0076214 A1 | 4/2004 | Bell et al. |
| 2004/0089336 A1 | 5/2004 | Hunt |
| 2004/0177876 A1 | 9/2004 | Hightower |
| 2004/0221577 A1 | 11/2004 | Yamaguchi et al. |
| 2004/0261831 A1 | 12/2004 | Tsuneoka et al. |
| 2004/0267408 A1 | 12/2004 | Kramer |
| 2005/0000473 A1 | 1/2005 | Ap et al. |
| 2005/0074646 A1 | 4/2005 | Rajashekara et al. |
| 2005/0081834 A1 | 4/2005 | Perkins |
| 2005/0105224 A1 | 5/2005 | Nishi |
| 2005/0121065 A1 | 6/2005 | Otey |
| 2005/0139692 A1 | 6/2005 | Yamamoto |
| 2005/0172993 A1 | 8/2005 | Shimoji et al. |
| 2005/0194034 A1 | 9/2005 | Yamaguchi et al. |
| 2005/0217714 A1 | 10/2005 | Nishijima et al. |
| 2005/0247336 A1 | 11/2005 | Inaoka |
| 2005/0263176 A1 | 12/2005 | Yamaguchi et al. |
| 2005/0279105 A1 | 12/2005 | Pastorino |
| 2006/0005548 A1 | 1/2006 | Ruckstuhl |
| 2006/0005873 A1 | 1/2006 | Kambe |
| 2006/0080979 A1 | 4/2006 | Kitanovski et al. |
| 2006/0086118 A1 | 4/2006 | Venkatasubramanian et al. |
| 2006/0118159 A1 | 6/2006 | Tsuneoka et al. |
| 2006/0124165 A1 | 6/2006 | Bierschenk et al. |
| 2006/0130888 A1 | 6/2006 | Yamaguchi et al. |
| 2006/0157102 A1 | 7/2006 | Nakajima et al. |
| 2006/0168969 A1 | 8/2006 | Mei et al. |
| 2006/0174633 A1 | 8/2006 | Beckley |
| 2006/0179820 A1 | 8/2006 | Sullivan |
| 2006/0219281 A1 | 10/2006 | Kuroyanagi et al. |
| 2006/0240369 A1 | 10/2006 | Duesel, Jr. et al. |
| 2006/0254284 A1 | 11/2006 | Ito et al. |
| 2007/0000255 A1 | 1/2007 | Elliot et al. |
| 2007/0045044 A1 | 3/2007 | Sullivan |
| 2007/0125413 A1 | 6/2007 | Olsen et al. |
| 2007/0193617 A1 | 8/2007 | Taguchi |
| 2007/0220902 A1* | 9/2007 | Matsuoka ............... H01L 35/32 62/3.3 |
| 2007/0261729 A1 | 11/2007 | Hu |
| 2007/0272290 A1 | 11/2007 | Sims et al. |
| 2008/0028769 A1 | 2/2008 | Goenka |
| 2008/0035195 A1 | 2/2008 | Bell |
| 2008/0083445 A1 | 4/2008 | Chakraborty |
| 2008/0090137 A1 | 4/2008 | Buck et al. |
| 2008/0115818 A1 | 5/2008 | Cheng et al. |
| 2008/0283110 A1 | 11/2008 | Jin et al. |
| 2008/0289677 A1 | 11/2008 | Bell |
| 2009/0000310 A1 | 1/2009 | Bell et al. |
| 2009/0007572 A1 | 1/2009 | Bell et al. |
| 2009/0007952 A1 | 1/2009 | Kondoh et al. |
| 2009/0038302 A1 | 2/2009 | Yamada et al. |
| 2009/0133734 A1 | 5/2009 | Takahashi et al. |
| 2009/0151342 A1 | 6/2009 | Major |
| 2009/0293499 A1 | 12/2009 | Bell et al. |
| 2009/0301103 A1 | 12/2009 | Bell et al. |
| 2009/0301539 A1 | 12/2009 | Watts |
| 2010/0024859 A1 | 2/2010 | Bell et al. |
| 2010/0031987 A1 | 2/2010 | Bell |
| 2010/0052374 A1 | 3/2010 | Bell et al. |
| 2010/0095996 A1 | 4/2010 | Bell |
| 2010/0101238 A1 | 4/2010 | Lagrandeur et al. |
| 2010/0101239 A1 | 4/2010 | Lagrandeur et al. |
| 2010/0186399 A1 | 7/2010 | Huttinger |
| 2010/0236595 A1 | 9/2010 | Bell |
| 2010/0326092 A1 | 12/2010 | Goenka |
| 2010/0331657 A1 | 12/2010 | Mensinger et al. |
| 2011/0005562 A1 | 1/2011 | Bisges |
| 2011/0067742 A1 | 3/2011 | Bell et al. |
| 2011/0107772 A1 | 5/2011 | Goenka |
| 2011/0162389 A1 | 7/2011 | Bell |
| 2011/0185715 A1 | 8/2011 | Limbeck et al. |
| 2011/0209740 A1 | 9/2011 | Bell et al. |
| 2011/0244300 A1 | 10/2011 | Closek et al. |
| 2011/0247668 A1 | 10/2011 | Bell et al. |
| 2011/0258995 A1 | 10/2011 | Limbeck et al. |
| 2011/0271994 A1 | 11/2011 | Gilley |
| 2011/0308771 A1 | 12/2011 | Heckenberger et al. |
| 2012/0073276 A1 | 3/2012 | Meisner et al. |
| 2012/0102934 A1 | 5/2012 | Magnetto |
| 2012/0111386 A1 | 5/2012 | Bell et al. |
| 2012/0174567 A1 | 7/2012 | Limbeck et al. |
| 2012/0174568 A1 | 7/2012 | Bruck et al. |
| 2012/0177864 A1 | 7/2012 | Limbeck et al. |
| 2012/0266608 A1 | 10/2012 | Kadle et al. |
| 2012/0305043 A1 | 12/2012 | Kossakovski et al. |
| 2013/0037073 A1 | 2/2013 | Lagrandeur |

(56) References Cited

U.S. PATENT DOCUMENTS

| | | |
|---|---|---|
| 2013/0068273 A1 | 3/2013 | Kanno et al. |
| 2013/0104953 A1 | 5/2013 | Poliquin et al. |
| 2013/0160809 A1 | 6/2013 | Mueller |
| 2013/0167894 A1 | 7/2013 | Brueck et al. |
| 2013/0186448 A1 | 7/2013 | Ranalli et al. |
| 2013/0255739 A1 | 10/2013 | Kossakovski et al. |
| 2013/0276849 A1 | 10/2013 | Kossakovski et al. |
| 2013/0327368 A1 | 12/2013 | Crane |
| 2013/0327369 A1 | 12/2013 | Jovoic et al. |
| 2013/0340802 A1 | 12/2013 | Jovovic et al. |
| 2014/0034102 A1 | 2/2014 | Ranalli et al. |
| 2014/0096807 A1 | 4/2014 | Ranalli |
| 2014/0190185 A1 | 7/2014 | Bell et al. |
| 2014/0224291 A1 | 8/2014 | Bell et al. |
| 2014/0325997 A1 | 11/2014 | Bell et al. |
| 2015/0176872 A1 | 6/2015 | Goenka |
| 2015/0194590 A1 | 7/2015 | LaGrandeur et al. |

FOREIGN PATENT DOCUMENTS

| | | |
|---|---|---|
| CN | 1295345 | 5/2001 |
| CN | 1343294 A | 4/2002 |
| CN | 200510068776.8 | 5/2010 |
| DE | 43 29 816 | 3/1994 |
| DE | 10 2008 063701 | 6/2010 |
| DE | 10 2009 003 737 | 10/2010 |
| DE | 10 2010 012 629 | 9/2011 |
| DE | 10 2010 035 152 | 2/2012 |
| EP | 0 272 937 | 6/1988 |
| EP | 0 878 851 | 11/1998 |
| EP | 1 174 996 A1 | 1/2002 |
| EP | 1174996 | 1/2002 |
| EP | 1 324 400 A | 7/2003 |
| EP | 1 366 328 A | 12/2003 |
| EP | 1 475 532 A | 11/2004 |
| EP | 1 515 376 | 3/2005 |
| EP | 1 679 480 A | 7/2006 |
| EP | 1 780 807 A1 | 5/2007 |
| EP | 2 159 854 | 3/2010 |
| EP | 2 180 534 | 4/2010 |
| EP | 2 439 799 | 10/2010 |
| EP | 1 906 463 A3 | 3/2011 |
| EP | 2 381 083 | 10/2011 |
| EP | 2 275 755 | 11/2012 |
| EP | 2 378 577 | 12/2012 |
| EP | 2 541 634 A1 | 1/2013 |
| EP | 2 313 938 B1 | 10/2013 |
| FR | 1 280 711 A | 1/1962 |
| FR | 2 261 638 A | 9/1975 |
| FR | 2 316 557 | 1/1977 |
| FR | 2 419 479 A | 10/1979 |
| FR | 2 481 786 | 11/1981 |
| FR | 2543275 | 9/1984 |
| FR | 2 512 499 | 10/1984 |
| FR | 2 550 324 A | 2/1985 |
| FR | 2806666 | 9/2001 |
| FR | 2 879 728 | 6/2006 |
| GB | 231 192 A | 5/1926 |
| GB | 817 077 | 7/1959 |
| GB | 952 678 | 3/1964 |
| GB | 1151947 | 5/1969 |
| GB | 2 027 534 | 2/1980 |
| GB | 2 267 338 | 12/1993 |
| GB | 2 333 352 | 7/1999 |
| JP | 45-8280 | 4/1970 |
| JP | 59097457 | 6/1984 |
| JP | 50-80044 | 7/1985 |
| JP | 63-262076 A | 10/1988 |
| JP | 01 131830 A | 5/1989 |
| JP | 01 200122 | 8/1989 |
| JP | 03-102219 A2 | 4/1991 |
| JP | 03-263382 | 11/1991 |
| JP | 04-165234 | 6/1992 |
| JP | 05-195765 | 8/1993 |
| JP | 5-219765 | 8/1993 |
| JP | 06-038560 | 2/1994 |
| JP | 06-089955 | 3/1994 |
| JP | 6-342940 | 12/1994 |
| JP | 7-198284 | 1/1995 |
| JP | A-7-7187 | 1/1995 |
| JP | 07-074397 | 3/1995 |
| JP | 07-111344 | 4/1995 |
| JP | H07 111334 | 4/1995 |
| JP | 09-321355 | 5/1995 |
| JP | 7 156645 | 6/1995 |
| JP | A-7-202275 | 8/1995 |
| JP | 07-253264 | 2/1996 |
| JP | 08-037322 A | 2/1996 |
| JP | 08-098569 | 4/1996 |
| JP | 08-222771 | 8/1996 |
| JP | A-8-293627 | 11/1996 |
| JP | 09042801 | 2/1997 |
| JP | 9-089284 A | 4/1997 |
| JP | 09-275692 | 10/1997 |
| JP | 9-276076 | 10/1997 |
| JP | 09-276076 | 10/1997 |
| JP | 10 012935 | 1/1998 |
| JP | 10035268 | 2/1998 |
| JP | 10 163538 | 6/1998 |
| JP | H10-325561 | 8/1998 |
| JP | 10238406 A | 9/1998 |
| JP | 10-275943 | 10/1998 |
| JP | 10290590 | 10/1998 |
| JP | 11-317481 | 11/1998 |
| JP | 11-032492 | 2/1999 |
| JP | 11 046021 | 2/1999 |
| JP | 11-182907 | 7/1999 |
| JP | 11-201475 A | 7/1999 |
| JP | 11-274574 | 10/1999 |
| JP | 11-274575 | 10/1999 |
| JP | 11-041959 | 12/1999 |
| JP | 2000 018095 | 1/2000 |
| JP | H2000-58930 | 2/2000 |
| JP | 00 208823 | 7/2000 |
| JP | 2000-208823 | 7/2000 |
| JP | 2002-21534 | 7/2000 |
| JP | H2000-214934 | 8/2000 |
| JP | 2000-274788 | 10/2000 |
| JP | 2000-274871 A | 10/2000 |
| JP | 2000-274874 | 10/2000 |
| JP | 2000 286469 A | 10/2000 |
| JP | 2000 323759 | 11/2000 |
| JP | 01 007263 A | 1/2001 |
| JP | 2001-24240 | 1/2001 |
| JP | 2001 210879 | 8/2001 |
| JP | 2001-267642 A | 9/2001 |
| JP | 2001304778 | 10/2001 |
| JP | 2001-336853 | 1/2002 |
| JP | 2002-13758 | 1/2002 |
| JP | 2002059736 A | 2/2002 |
| JP | 2002 111078 | 4/2002 |
| JP | 2002 199761 | 7/2002 |
| JP | 2002 232028 A | 8/2002 |
| JP | 2002 325470 | 11/2002 |
| JP | 2003 86223 | 3/2003 |
| JP | 2003 175720 A | 6/2003 |
| JP | 2003 259671 | 9/2003 |
| JP | 2003 332642 | 11/2003 |
| JP | 2004 079883 | 3/2004 |
| JP | 2004-332596 | 11/2004 |
| JP | 2004 343898 | 12/2004 |
| JP | 2004 360522 | 12/2004 |
| JP | 2004-360681 | 12/2004 |
| JP | 2005-151661 A | 6/2005 |
| JP | 2005-519256 | 6/2005 |
| JP | 2005 212564 | 8/2005 |
| JP | 07-111334 | 10/2005 |
| JP | 2005-299417 | 10/2005 |
| JP | 2005-212564 | 11/2005 |
| JP | 2005 317648 | 11/2005 |
| JP | 2006 214350 | 8/2006 |
| JP | 2006-250524 | 9/2006 |
| JP | 2008 042994 | 2/2008 |

(56) References Cited

FOREIGN PATENT DOCUMENTS

| | | |
|---|---|---|
| JP | 2008 274790 | 11/2008 |
| JP | 2008 300465 | 12/2008 |
| JP | 2008-546954 | 12/2008 |
| JP | 2009-010138 | 1/2009 |
| JP | 2009 033806 | 2/2009 |
| LU | 66619 | 2/1973 |
| RU | 2 099 642 C1 | 12/1997 |
| RU | 2 142 178 | 11/1999 |
| RU | 2 154 875 C2 | 8/2000 |
| RU | 2174475 | 10/2001 |
| SE | 329 870 | 10/1970 |
| SE | 337 227 | 5/1971 |
| SU | 184886 A | 7/1966 |
| SU | 1142711 A | 2/1985 |
| SU | 1170234 A | 7/1985 |
| WO | WO 95/20721 | 8/1995 |
| WO | WO 9722486 | 6/1997 |
| WO | WO 97/47930 | 12/1997 |
| WO | WO 98/34451 | 10/1998 |
| WO | WO 98/50686 | 11/1998 |
| WO | WO 98/56047 | 12/1998 |
| WO | WO 99/10191 | 3/1999 |
| WO | WO 01/52332 | 7/2001 |
| WO | WO 02/065030 | 8/2002 |
| WO | WO 02/081982 | 10/2002 |
| WO | WO 03/074951 | 9/2003 |
| WO | WO 03/090286 | 10/2003 |
| WO | WO 03/104726 | 12/2003 |
| WO | WO 2004/019379 | 3/2004 |
| WO | WO 2004/026757 | 4/2004 |
| WO | WO 2004/059139 | 7/2004 |
| WO | WO 2004/092662 | 10/2004 |
| WO | WO 2005/020422 | 3/2005 |
| WO | WO 2005/023571 | 3/2005 |
| WO | WO 2005/098225 | 10/2005 |
| WO | WO 2006/001827 | 4/2006 |
| WO | WO 2006/037178 | 4/2006 |
| WO | WO 2006/043514 | 4/2006 |
| WO | WO 2006/064432 | 6/2006 |
| WO | WO 2007/001289 | 1/2007 |
| WO | WO 2007/002891 | 1/2007 |
| WO | WO 2007/109368 | 9/2007 |
| WO | WO 2008/013946 | 1/2008 |
| WO | WO 2008/042077 | 4/2008 |
| WO | WO 2008/091293 | 7/2008 |
| WO | WO 2008/123330 | 10/2008 |
| WO | WO 2010/014958 | 2/2010 |
| WO | WO 2010/135173 | 11/2010 |
| WO | WO 2011/011795 | 1/2011 |
| WO | WO 2012/022684 | 2/2012 |
| WO | WO 2012/031980 | 3/2012 |
| WO | WO 2012/045542 | 4/2012 |
| WO | WO 2012/170443 | 12/2012 |

OTHER PUBLICATIONS

Derwent-ACC-No. 1998-283540, Kwon, H et al., Hyundai Motor Co., corresponding to KR 97026106 A, published Jun. 24, 1997 (2 pages).

Diller, R. W., et al.: "Experimental results confirming improved performance of systems using thermal isolation" Thermoelectrics, 2002. Proceedings ICT '02. Twenty-First International Conference on Aug. 25-29, 2002, Piscataway, NJ USA, IEEE, Aug. 25, 2002, pp. 548-550, XP010637541 ISBN: 0-7803-7683-8.

Diller, R.W., et al., "Experimental Results Confirming Improved Efficiency of Thermoelectric Power Generation Systems with Alternate Thermodynamic Cycles," 22nd International Conference on Thermoelectrics, 2003, pp. 571-573.

Fleurial, et al., "Development of Segmented Thermoelectric Multicopule Converter Technology," Aerospace Conference, 2006 IEEE Big Sky, Mt., Mar. 4-11, 2006, pp. 1-10.

Hendricks, Terry et al., "Advanced Thermoelectric Power System Investigations for Light-Duty and Heavy Duty Applications," National Renewable Energy Laboratory, Center for Transportation Technology & Systems, Colorado, 2002.

Menchen, et al., "Thermoelectric Conversion to Recover Heavy Duty Diesel Exhaust Energy", Proceedings of the Annual Automotive Technology Development Contractors Meeting, pp. 445-449, Apr. 1991.

Miner, A., et al. "Thermo-Electro-Mechanical Refrigeration Based on Transient Thermoelectric Effects", Applied Physics letters, vol. 75, pp. 1176-1178 (1999).

Snyder, G. Jeffrey, et al., "Thermoelectric Efficiency and Compatibility," The American Physical Society, Oct. 2, 2003, vol. 91, No. 14.

Snyder, G. Jeffrey: "Application of the compatibility factor to the design of segmented and cascaded thermoelectric generators" Applied Physics Letters, AIP, American Institute of Physics, Melville, NY, vol. 84, No. 13, Mar. 29, 2004, pp. 2436-2438, XP012060957 ISSN: 0003-6951.

Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).

Ursell, T.S. et al., "Compatibility of Segmented Thermoelectric Generators," 21st International Conference on Thermoelectronics, 2002, p. 412-417.

Korean Office Action (Notice Requesting Submission of Opinion), Application No. 10-2013-7035180, delivered May 21, 2015.

Ikoma, K., et al., "Thermoelectric Module and Generator for Gasoline Engine Vehicles," 17th Int'l Conf. on Thermo-electrics, Nagoya, Japan, pp. 464-467 (1998).

Lofy, John et al., "Thermoelectrics for Environmental Control Automobiles," 21st International Conference on Thermoelectronics, 2002, p. 471-476.

English Translation of Notice of Rejection Grounds for Japanese Patent Application No. 2014-514564 mailed on Feb. 10, 2015.

Funahashi et al., "Preparation and properties of thermoelectric pipe-type modules", ICT 25th International Conference on Aug. 6-10, 2006, Thermoelectrics, 2006, pp. 58-61.

Funahashi, et al., "A portable thermoelectric-power-generating module composed of oxide devices," Journal of Applied Physics 99, 066117 (2006).

Min et al., "Ring-structured thermoelectric module," Semiconductor Science and Technology, Semicond. Sci. Technol. 22 (2007) 880-8.

Stockholm, John G.: "Large-Scale Cooling: Integrated Thermoelectric Element Technology," CRC Handbook of Thermoelectrics, Chapter 53, pp. 657-666. 0-8493-0146, Jul. 1995.

Thermoelectrics Handbook: Macro to Nano, 2006, Chpt. 11, Section 11.7, pp. 11-11 to 11-15, CRC Press, Boca Raton, FL.

Kambe et al., "Encapsulated Thermoelectric Modules and Compliant Pads for Advanced Thermoelectric Systems," J. Electronic Materials, vol. 39, No. 9, 1418-21 (2010).

U.S. Appl. No. 14/760,680, filed Jul. 13, 2015, Piggott et al.

* cited by examiner

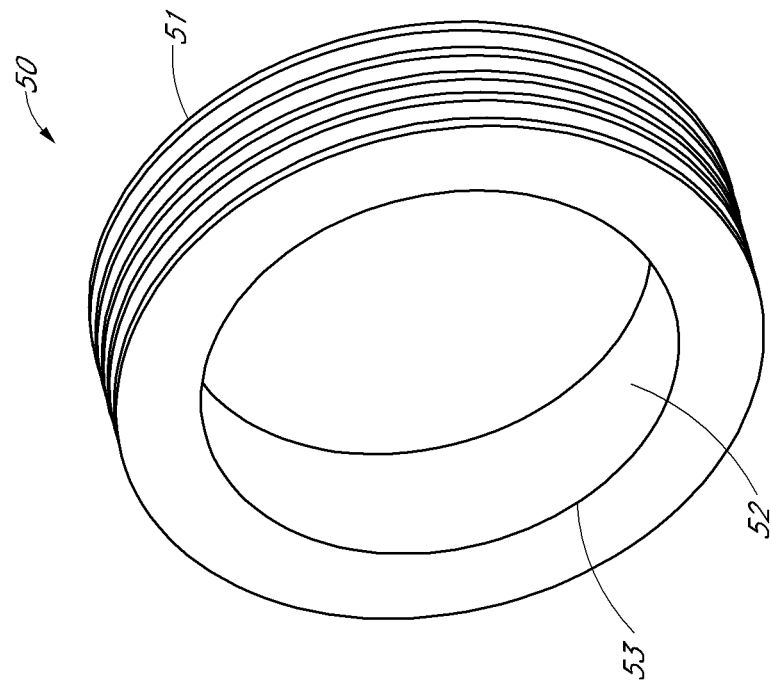
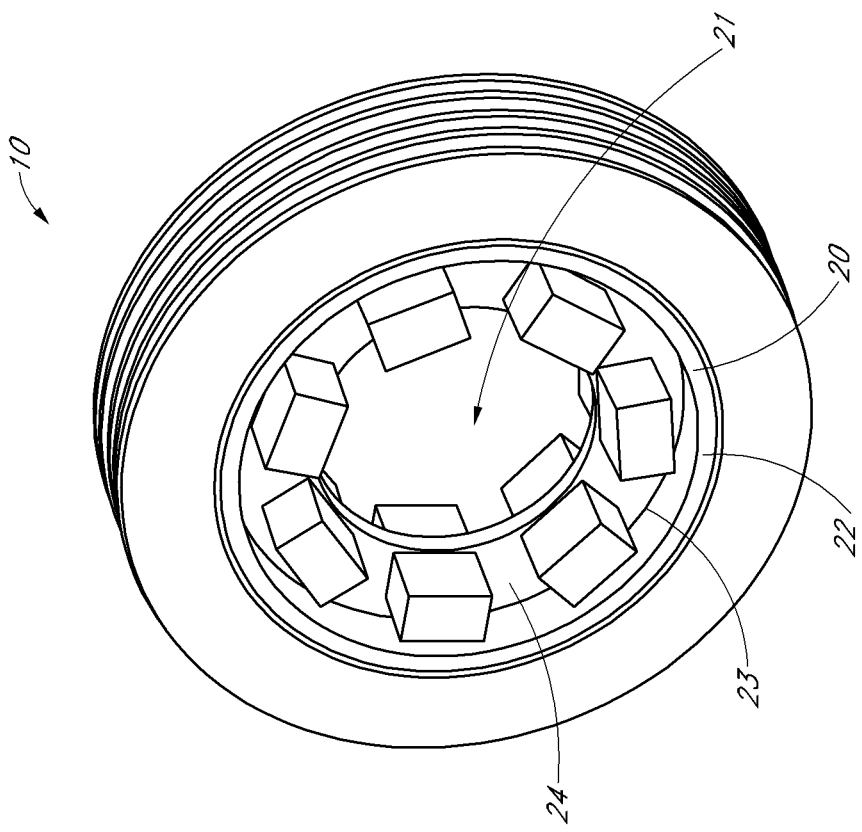
FIG. 2A
FIG. 2B

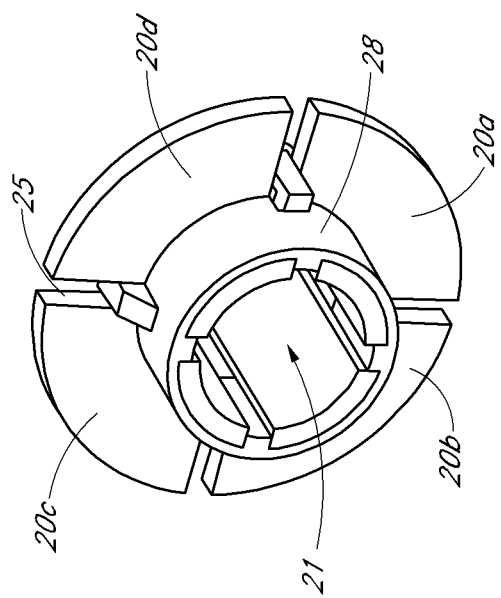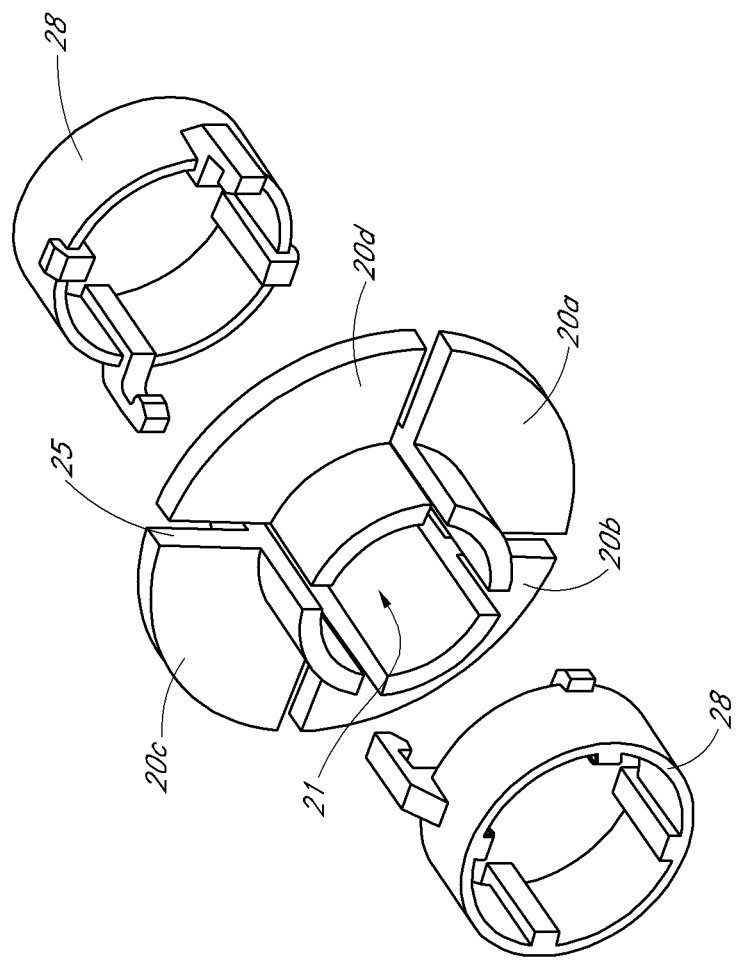
FIG. 2D

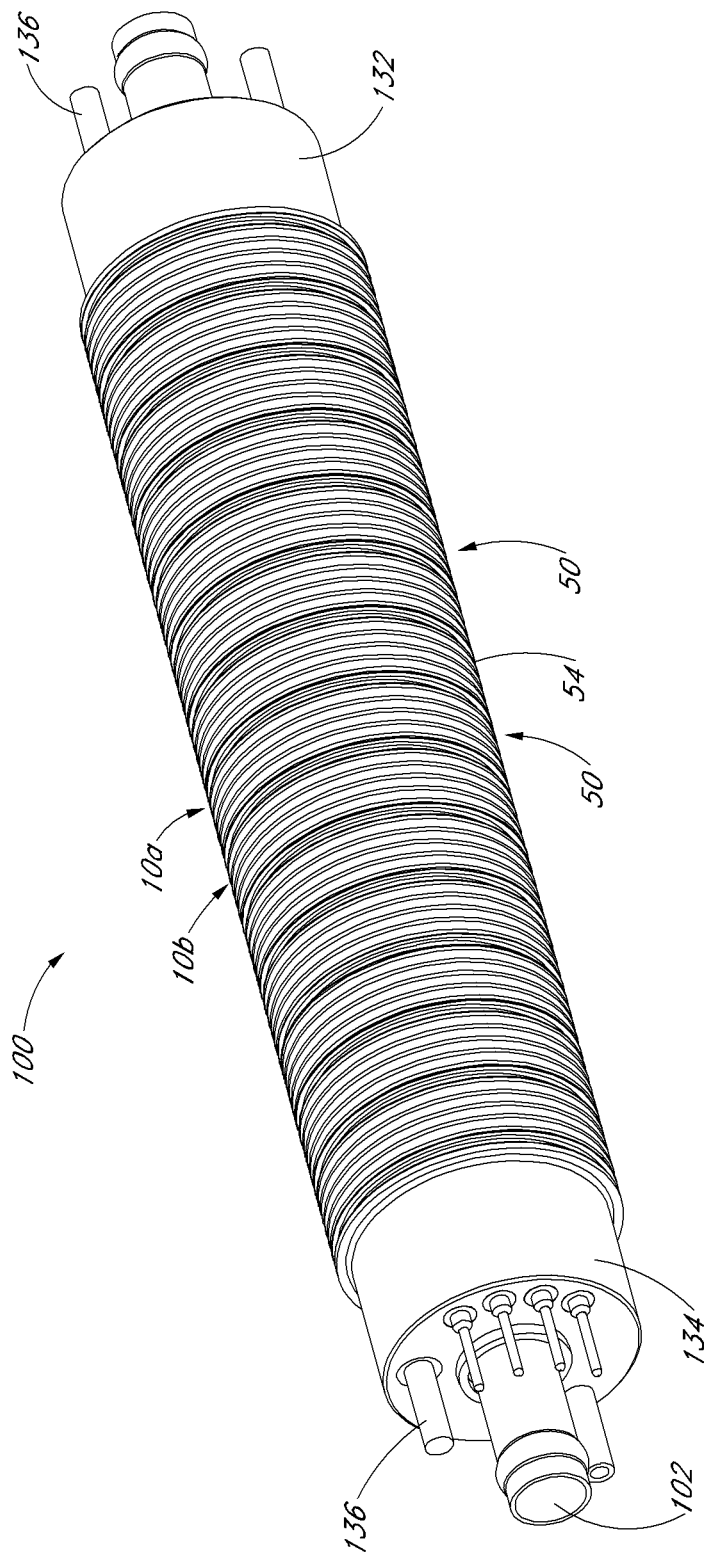

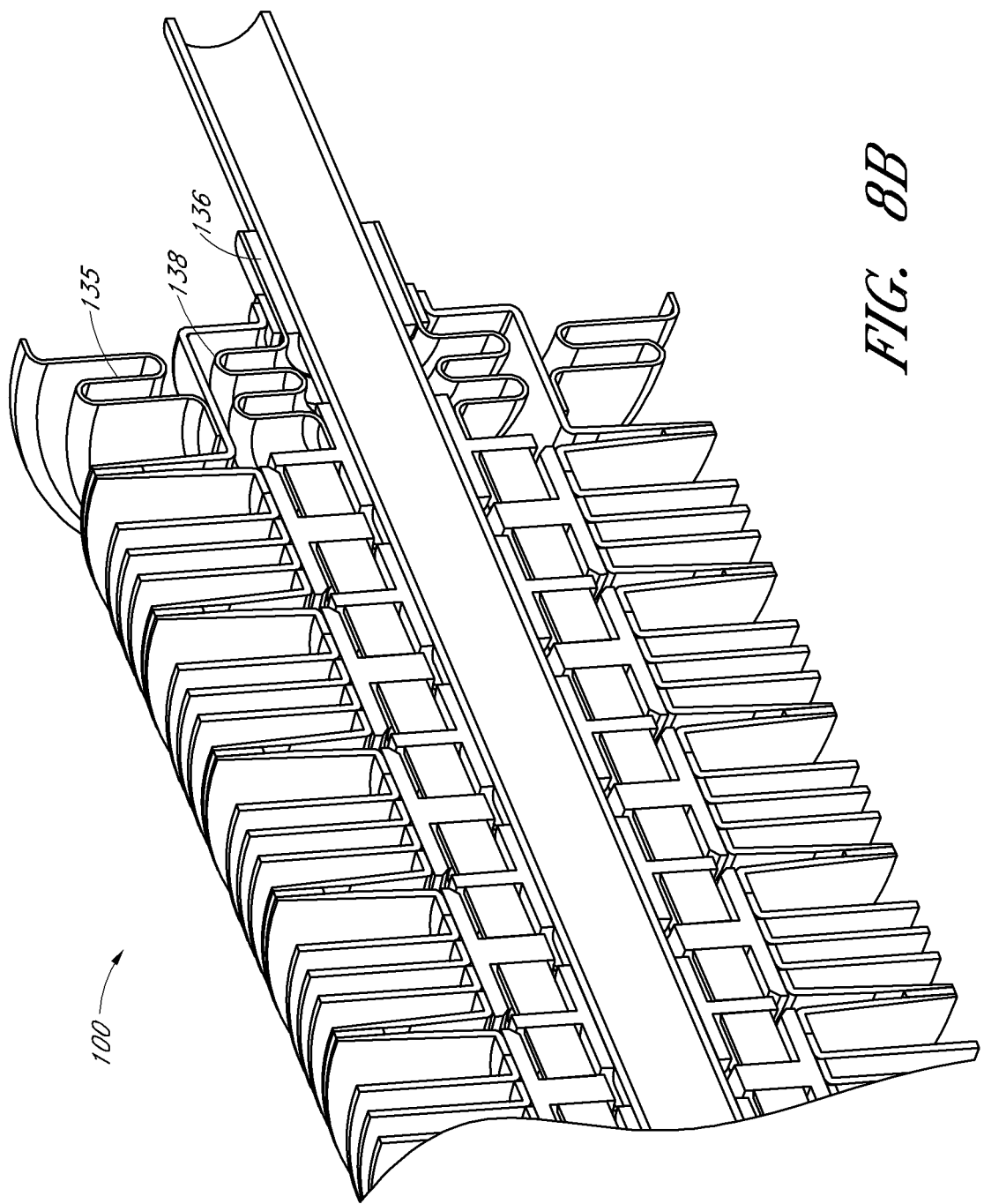

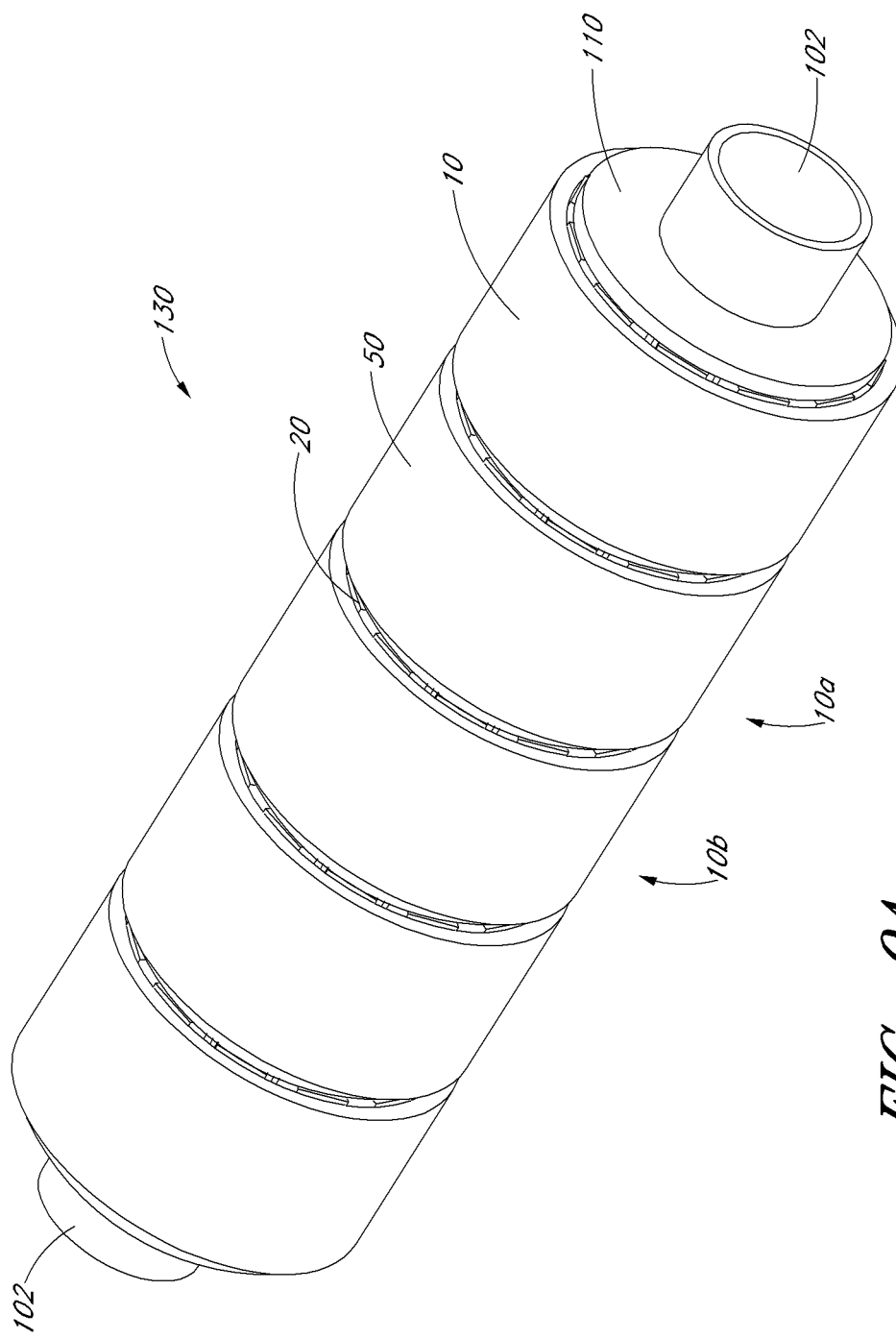

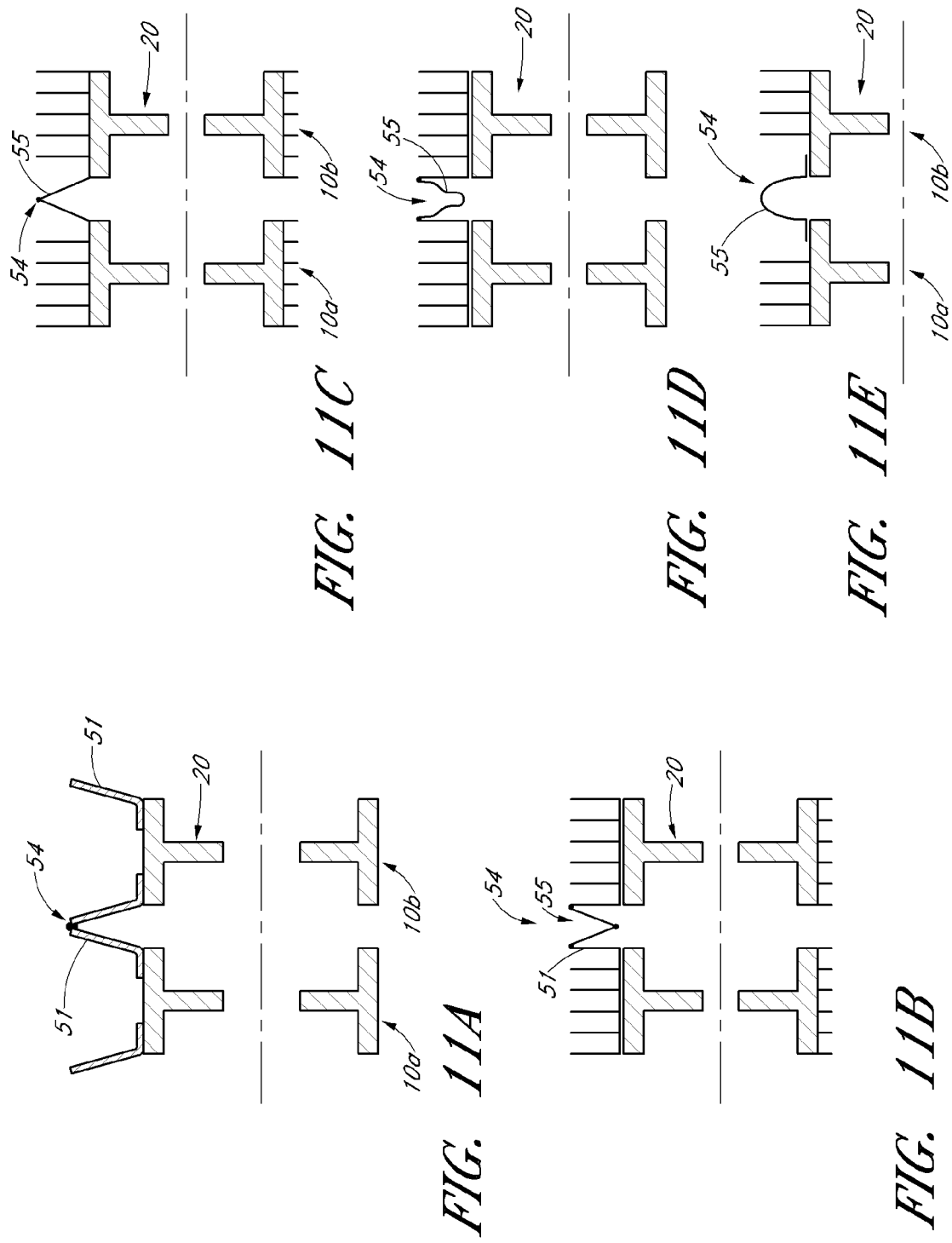

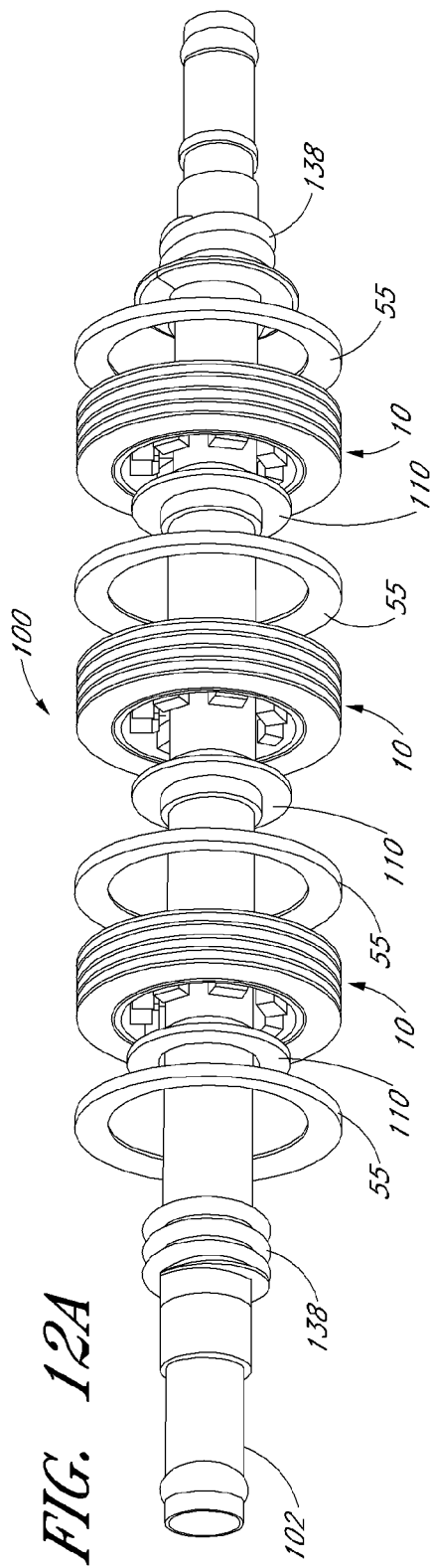
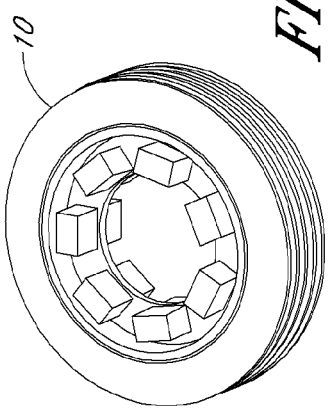
FIG. 12A
FIG. 12B
FIG. 12C
FIG. 12D

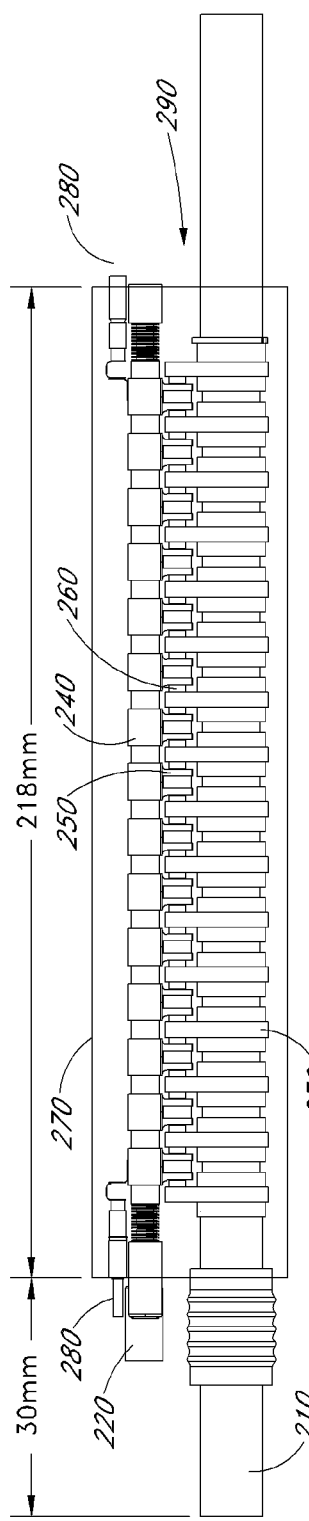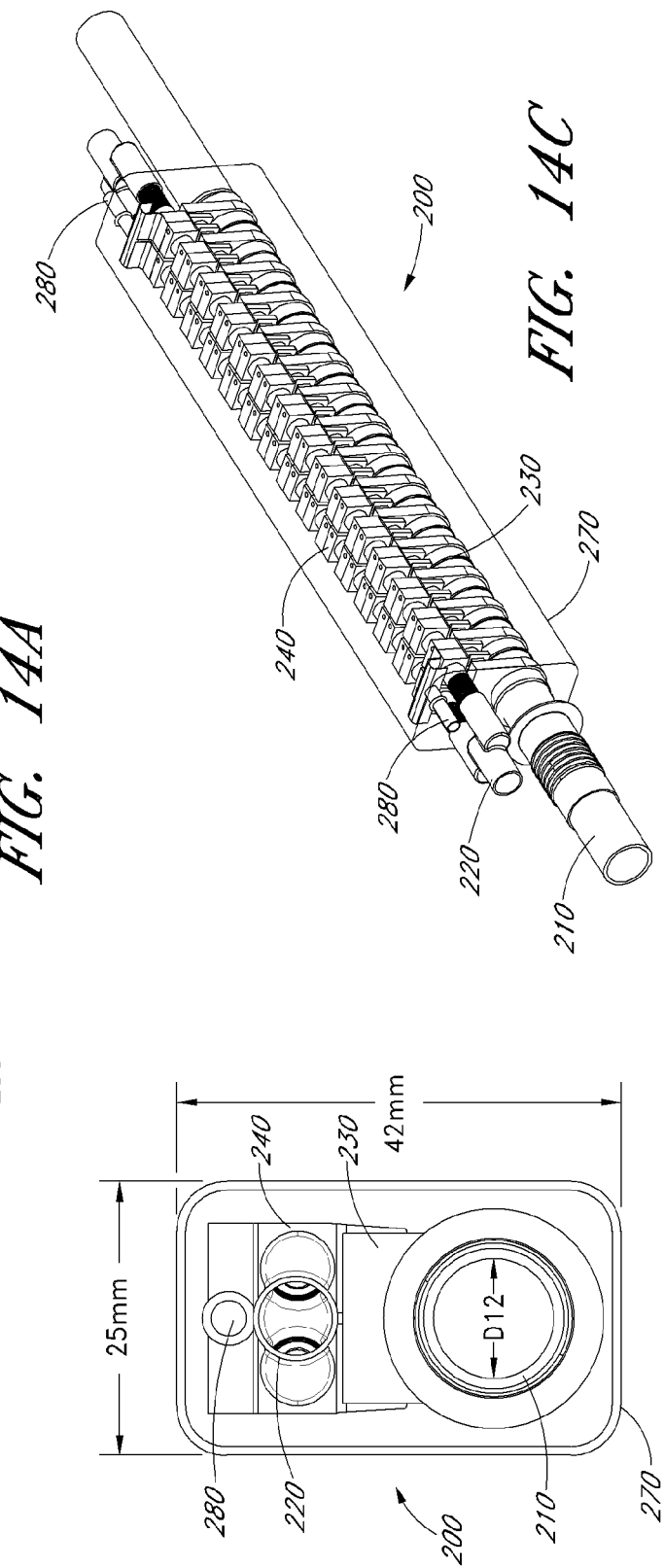
FIG. 14A
FIG. 14B
FIG. 14C

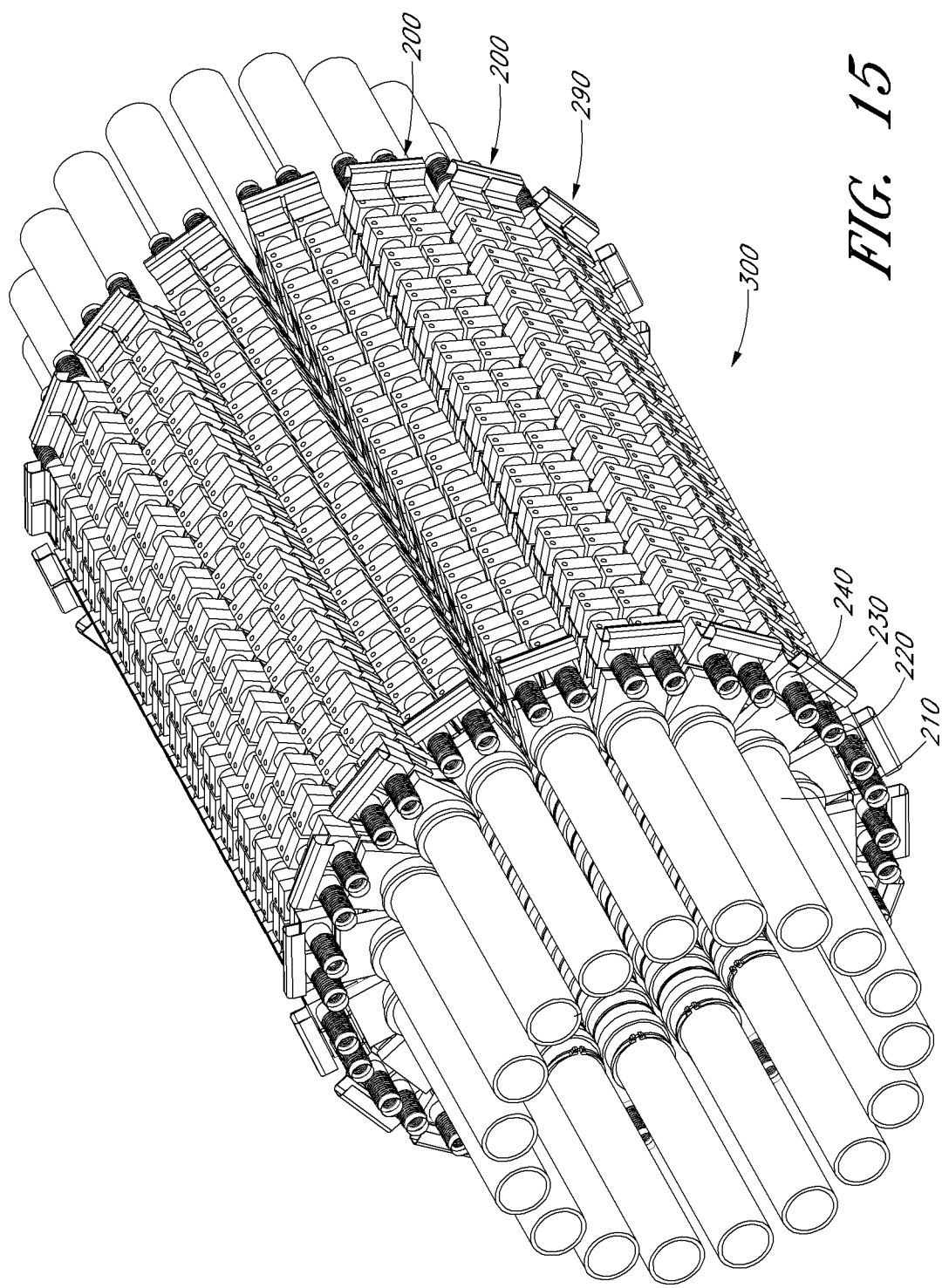

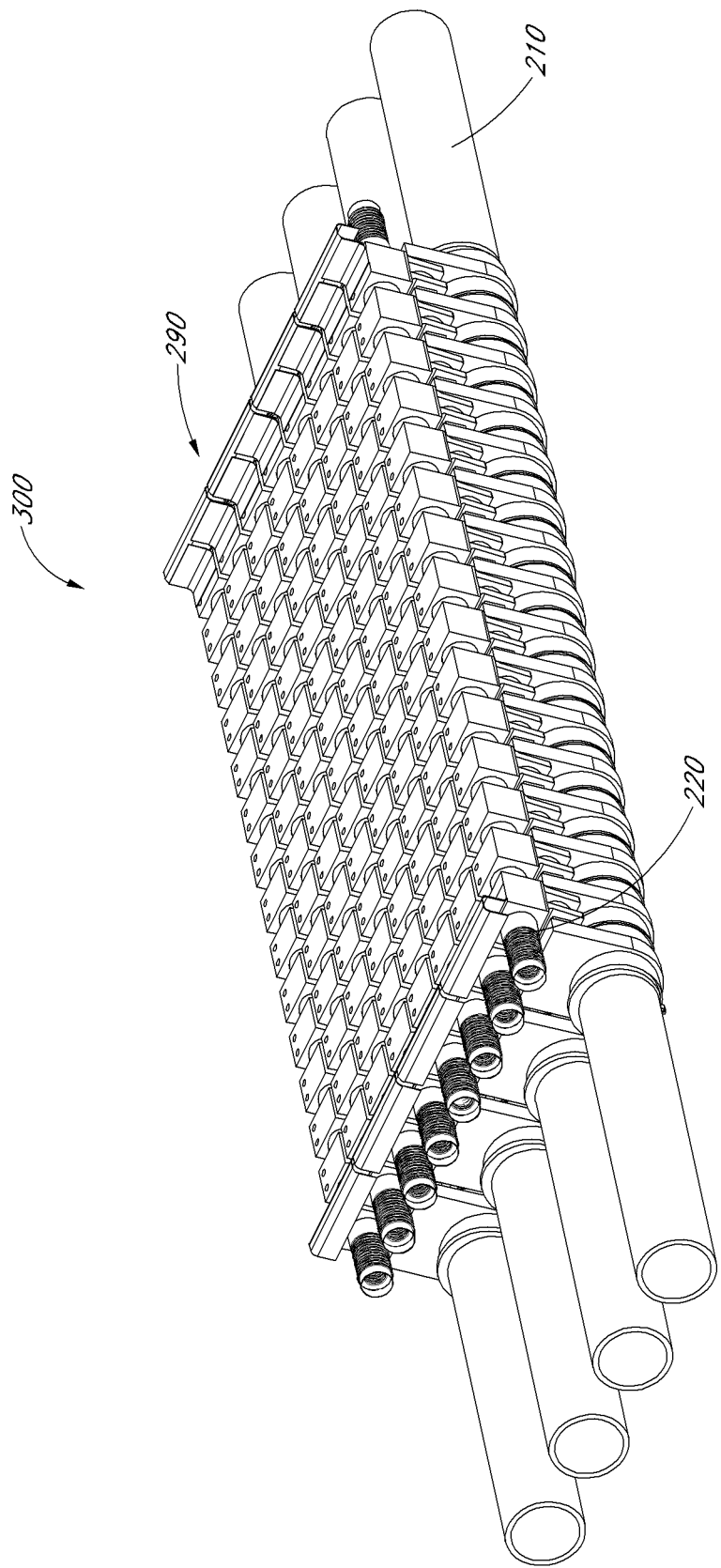

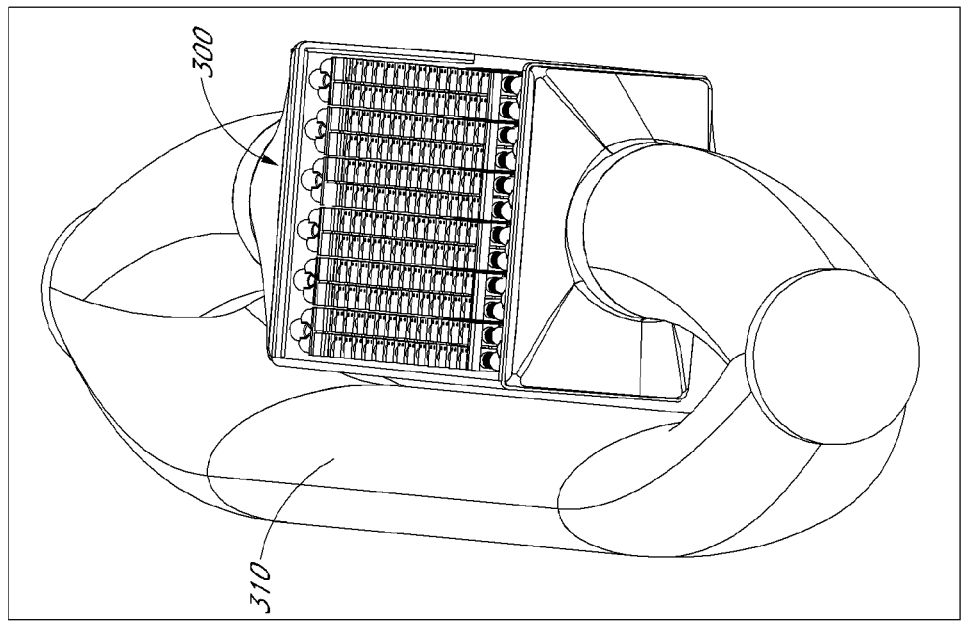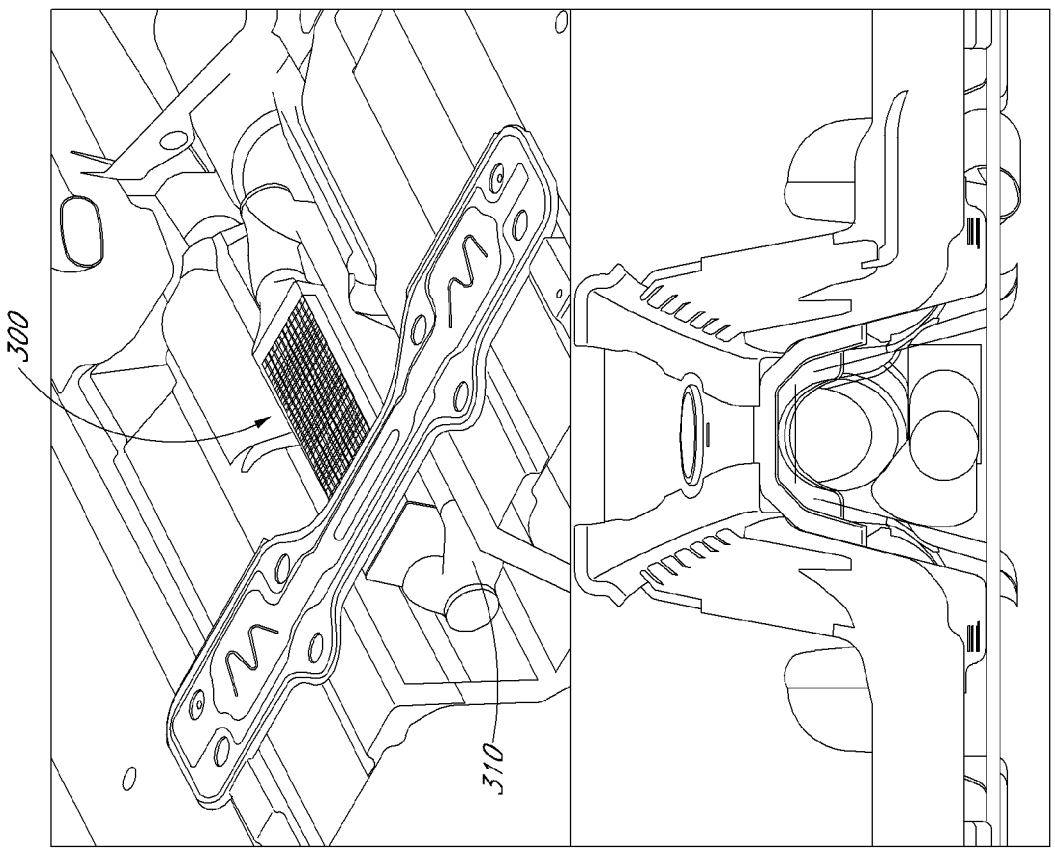
FIG. 17

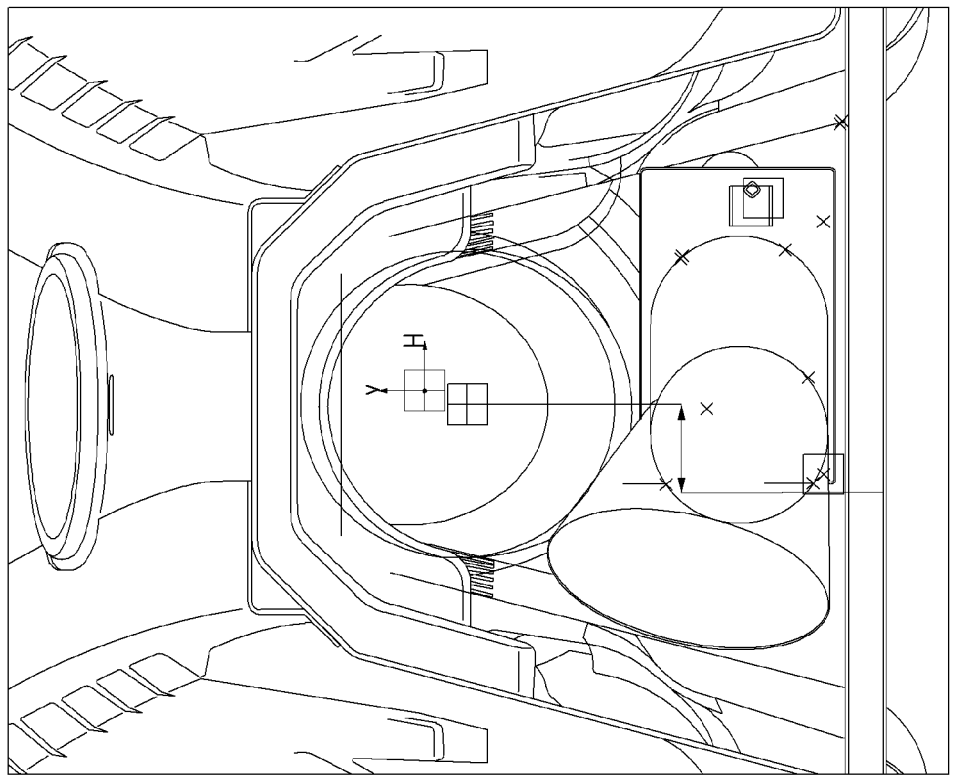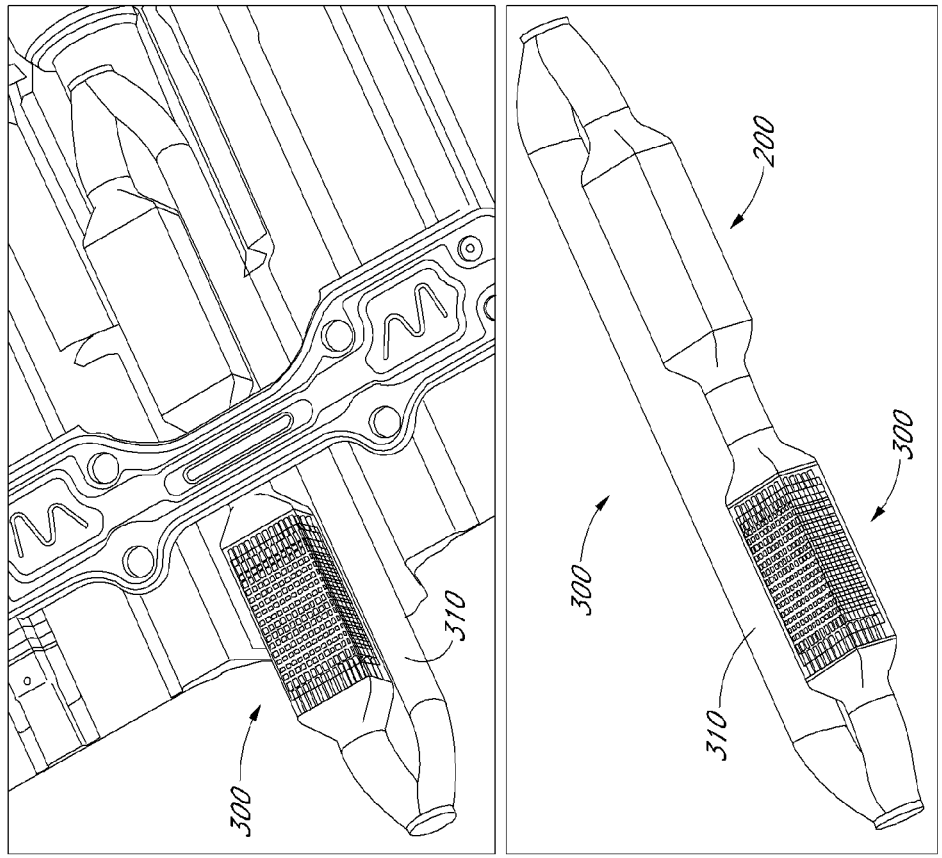
FIG. 18

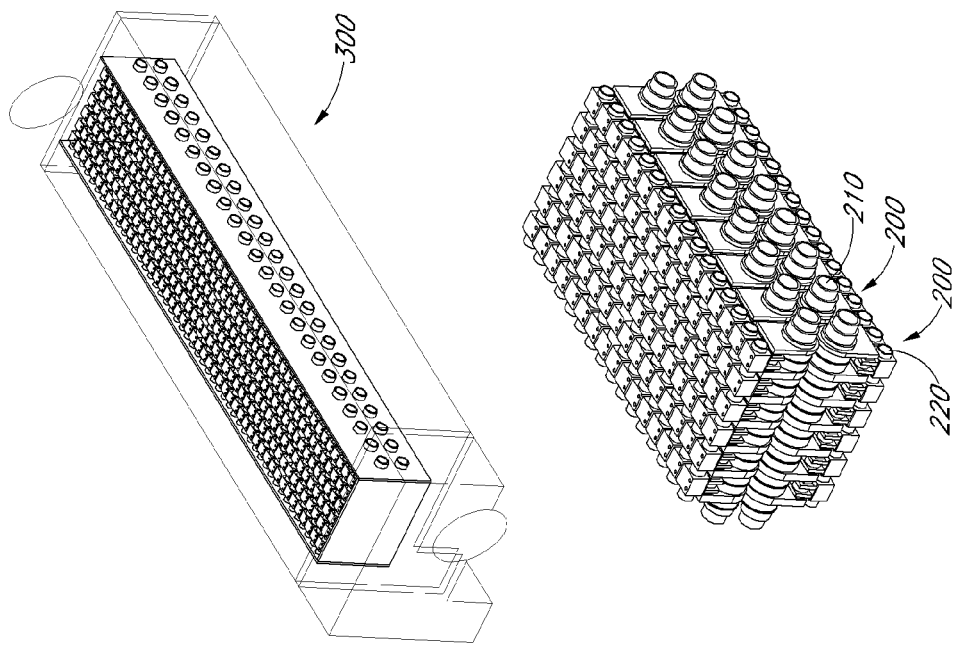
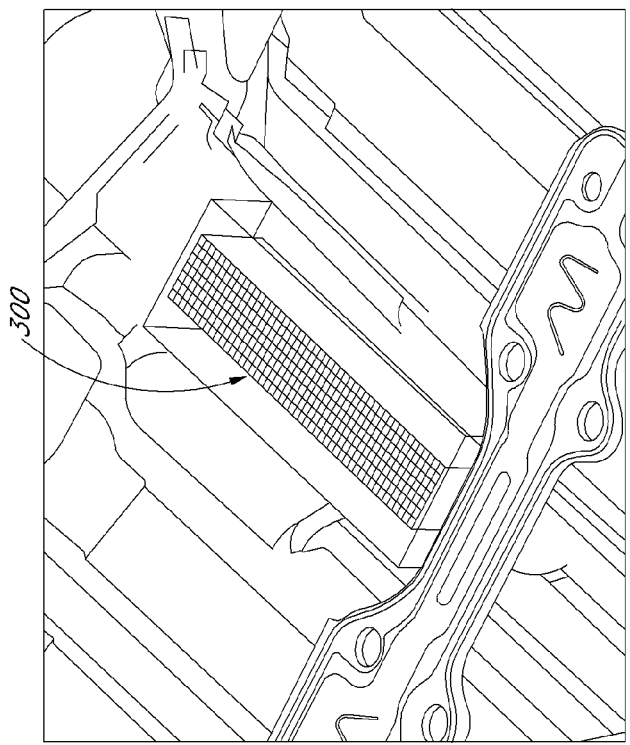
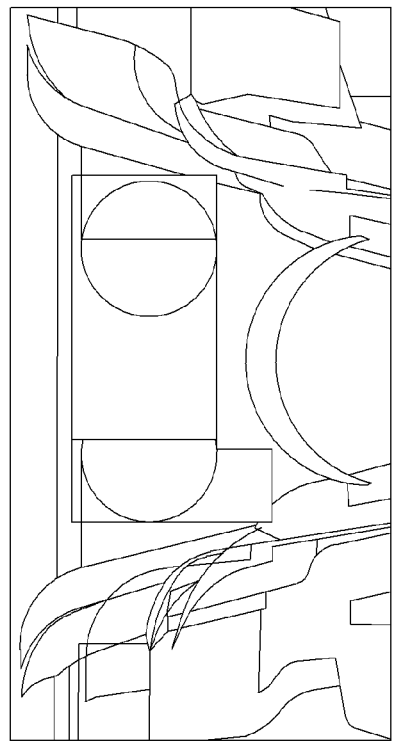
FIG. 19

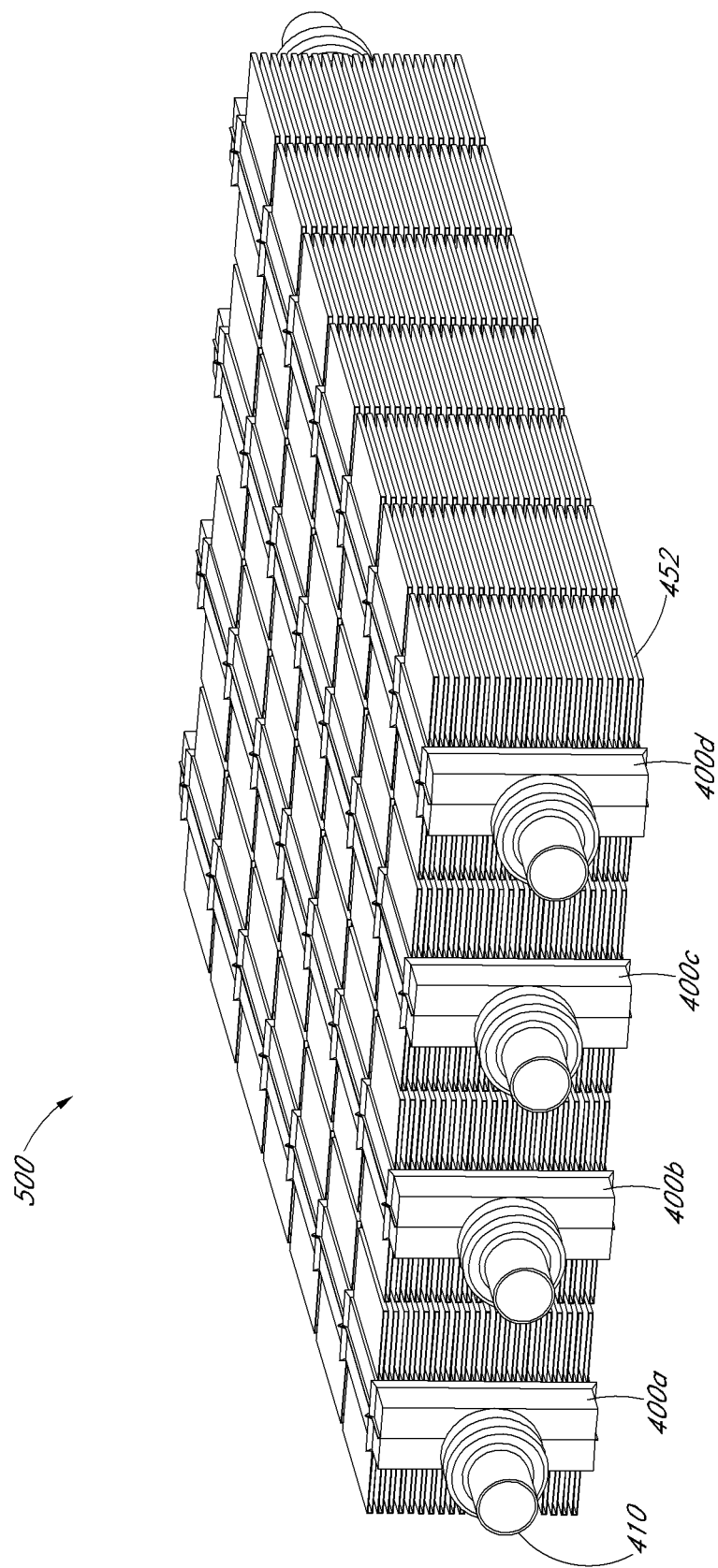

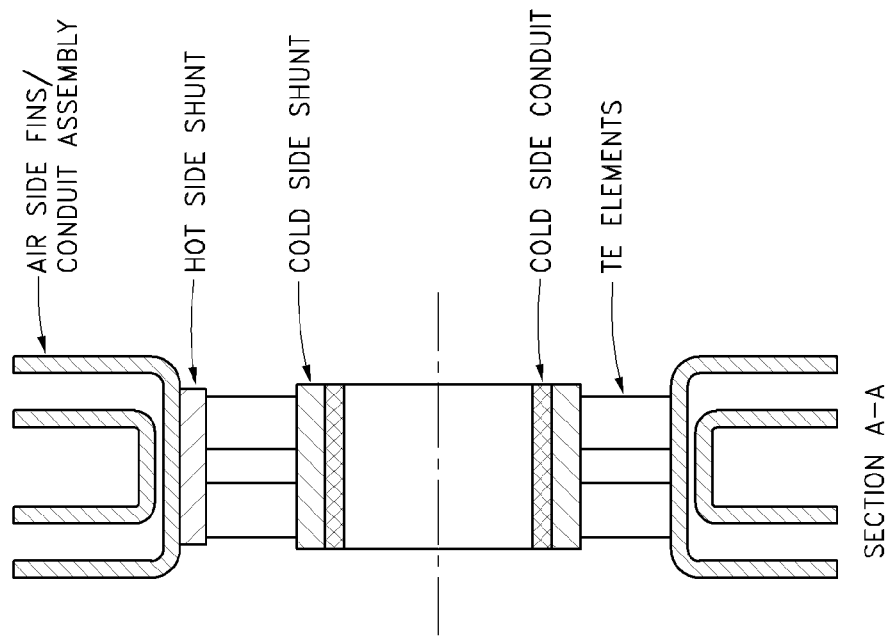
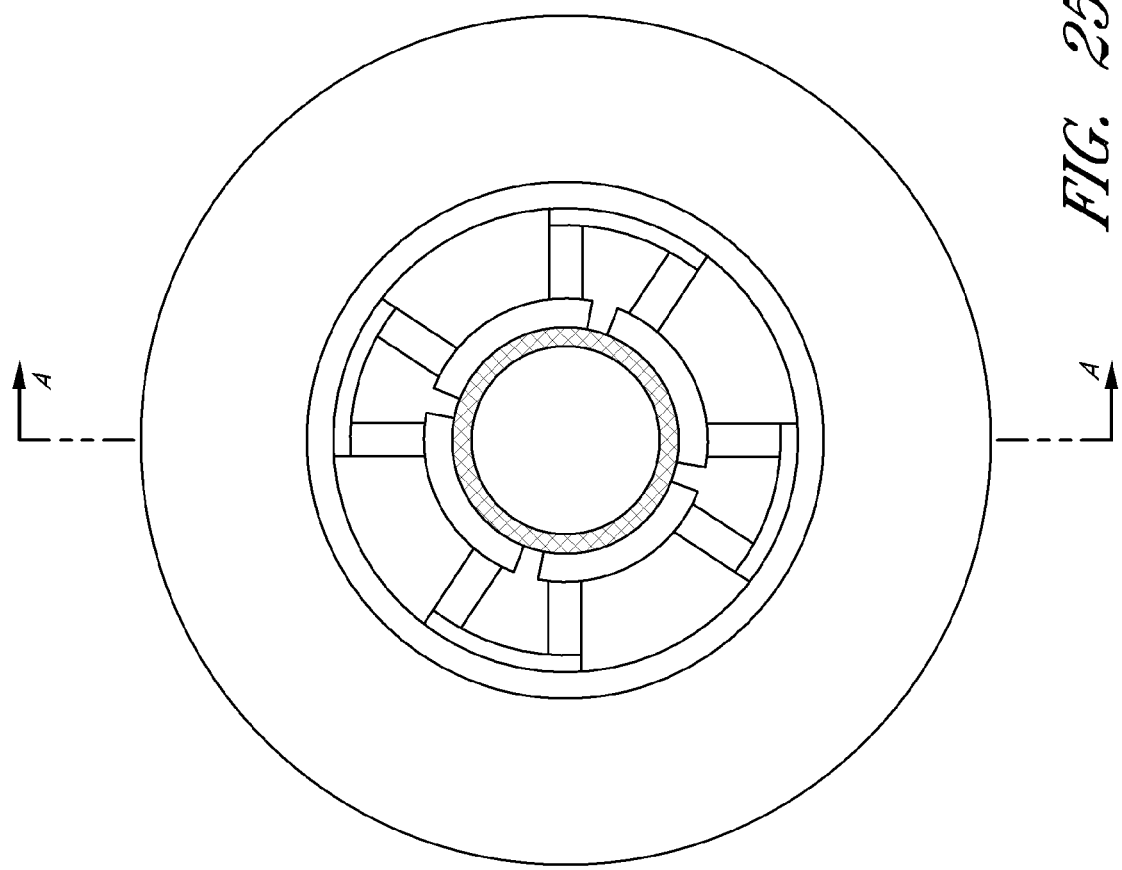
FIG. 25A

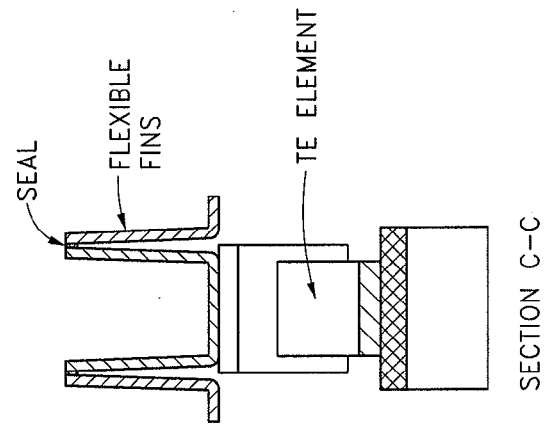
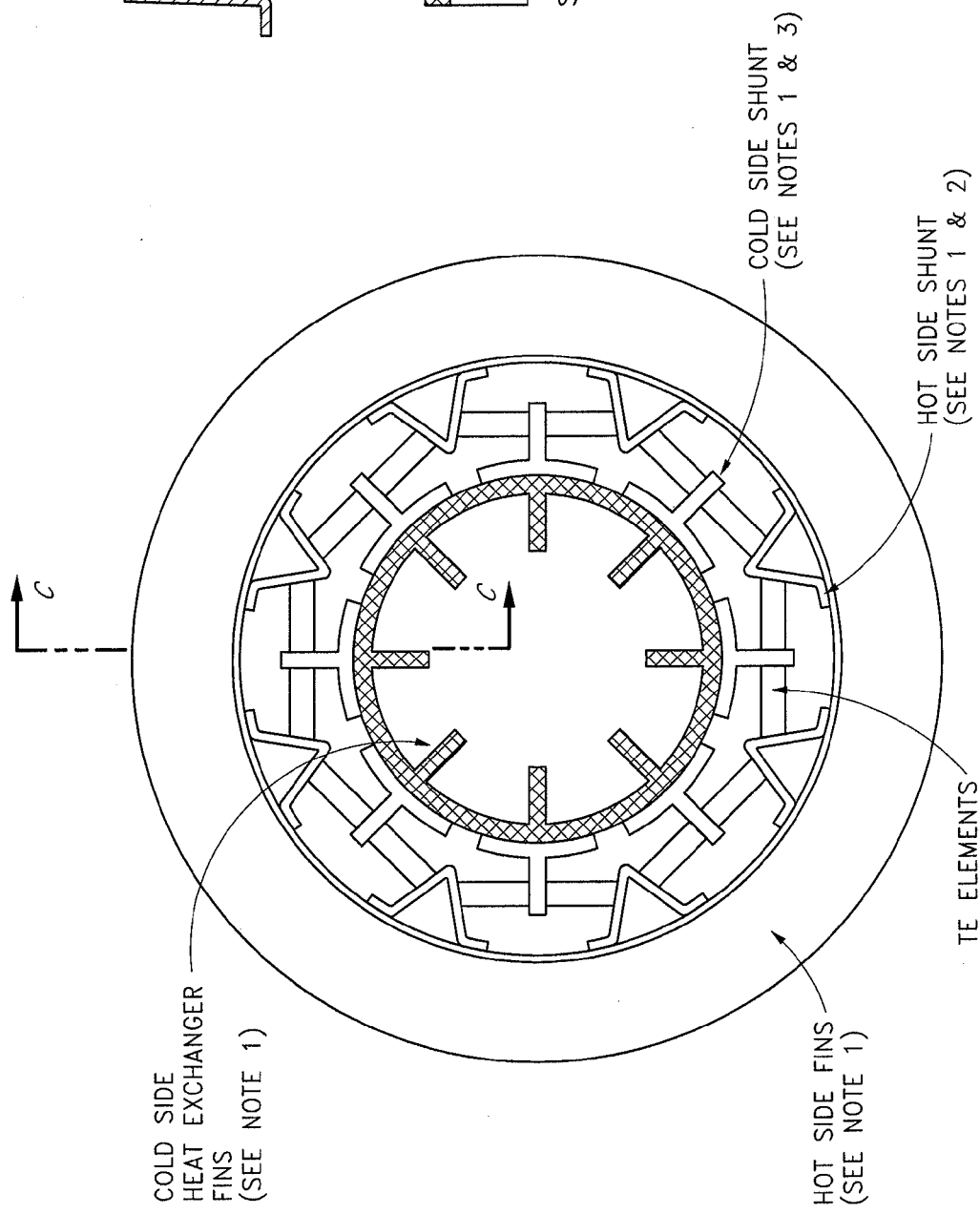
FIG. 26B
FIG. 26A

CARTRIDGE-BASED THERMOELECTRIC SYSTEMS

CROSS-REFERENCE TO RELATED APPLICATIONS

This application claims the benefit of priority to U.S. Provisional Appl. No. 61/493,871, filed Jun. 6, 2011, U.S. Provisional Appl. No. 61/493,926, filed Jun. 6, 2011, U.S. Provisional Appl. No. 61/493,935, filed Jun. 6, 2011, and U.S. Provisional Appl. No. 61/566,194, filed Dec. 2, 2011, each of which is incorporated in its entirety by reference herein. This application is related to U.S. patent application Ser. No. 13/489,192, entitled "Systems and Method for Reducing Current and Increasing Voltage in Thermoelectric Systems," filed on even date herewith and incorporated in its entirety by reference herein. This application is also related to U.S. patent application Ser. No. 13/488,989, entitled "Thermoelectric Devices With Reduction of Interfacial Losses," filed on even date herewith and incorporated in its entirety by reference herein.

STATEMENT REGARDING FEDERALLY SPONSORED R&D

The U.S. Government may claim to have certain rights in this invention or parts of this invention under the terms of Contract No. DOE DE-FC26-04NT42279 and DOE DE-EE0005387.

BACKGROUND

1. Field of the Invention

The present application relates generally to thermoelectric cooling, heating, and power generation systems.

2. Description of the Related Art

Thermoelectric (TE) modules (e.g., 40 mm×40 mm squares) have been manufactured for specific niche heating and cooling applications. These modules include TE materials connected together with electrodes and sandwiched between two ceramic substrates. These modules have been used as building blocks for thermoelectric devices and systems. They have often been connected to heat exchangers, sandwiched between hot and cold (or waste and main) sides. Often, the thermal resistance created by the ceramic substrates of the module, as well as by the interfacial material used to connect them to the heat exchangers, is quite large and detrimental to the performance of the thermoelectric device. In addition, for liquid-to-gas TE applications, the gas side is often one of the main limiting factors. It is often difficult to have a design with a large enough heat transfer surface area to compensate for the low heat transfer coefficients of the gas as compared to that of the liquid. This causes an impedance mismatch for the TE device and again a drop in performance.

SUMMARY

A thermoelectric assembly is provided which is configured to be in thermal communication with a generally tubular fluid conduit configured to have a first fluid flowing through the conduit along a direction. The thermoelectric assembly comprises at least one shunt configured to extend around the conduit. The thermoelectric assembly further comprises at least one first thermoelectric element in thermal communication and in electrical communication with the at least one shunt. The thermoelectric assembly further comprises at least one second thermoelectric element in thermal communication and in electrical communication with the at least one shunt. At least a portion of the at least one shunt is sandwiched between the at least one first thermoelectric element and the at least one second thermoelectric element. The at least one first thermoelectric element and the at least one second thermoelectric element are electrically isolated from the conduit. The thermoelectric assembly further comprises at least one heat exchanger in thermal communication with the at least one shunt and configured to be in thermal communication with a second fluid.

A thermoelectric system is provided which comprises at least a portion of a generally tubular fluid conduit configured to allow a first fluid to flow through the at least a portion of the generally tubular fluid conduit along a direction. The thermoelectric system further comprises a first thermoelectric assembly and a second thermoelectric assembly, wherein each of the first thermoelectric assembly and the second thermoelectric assembly is in thermal communication with the conduit and comprises: at least one first shunt extending around the conduit; at least one first thermoelectric element in thermal communication and in electrical communication with the at least one first shunt; at least one second thermoelectric element in thermal communication and in electrical communication with the at least one first shunt, wherein at least a portion of the at least one first shunt is sandwiched between the at least one first thermoelectric element and the at least one second thermoelectric element, wherein the at least one first thermoelectric element and the at least one second thermoelectric element are electrically isolated from the conduit; and at least one heat exchanger in thermal communication with the at least one first shunt and in thermal communication with a second fluid. The thermoelectric system further comprises at least one second shunt extending around the conduit and in thermal communication with the conduit. At least a portion of the at least one second shunt is electrically isolated from the conduit and is in thermal communication with, in electrical communication with, and sandwiched between the at least one second thermoelectric element of the first thermoelectric assembly and the at least one first thermoelectric element of the second thermoelectric assembly. The first thermoelectric assembly, the at least one second shunt, and the second thermoelectric assembly are in series electrical communication with one another such that the thermoelectric system has an electrical current flow path through the at least one first thermoelectric element of the first thermoelectric assembly, the at least one first shunt of the first thermoelectric assembly, the at least one second thermoelectric element of the first thermoelectric assembly, the at least one second shunt, the at least one first thermoelectric element of the second thermoelectric assembly, the at least one first shunt of the second thermoelectric assembly, and the at least one second thermoelectric element of the second thermoelectric assembly.

A thermoelectric system is provided which comprises at least a portion of a generally tubular fluid conduit having a first fluid flowing through the at least a portion of the generally tubular fluid conduit along a direction. The thermoelectric system further comprises a plurality of thermoelectric assemblies, wherein each thermoelectric assembly of the plurality of thermoelectric assemblies is in thermal communication with the conduit and comprises: at least one first shunt extending around the conduit; at least one first thermoelectric element in thermal communication and in electrical communication with the at least one first shunt; and at least one second thermoelectric element in thermal communication and in electrical communication with the at least one first shunt, wherein at least a portion of the at least one first shunt is sandwiched between the at least one first thermoelectric element and the at least one second thermoelectric element, wherein the at least one first thermoelectric element and the at least one second thermoelectric element are electrically isolated from the conduit; and a plurality of heat exchangers in thermal communication with the at least one first shunt and in thermal communication with a second fluid. The thermoelectric system further comprises a plurality of second shunts, wherein each second shunt of the plurality of second shunts extends around the conduit and is in thermal communication with the conduit. At least a portion of each second shunt of the plurality of second shunts is electrically isolated from the conduit and is in thermal communication with, in electrical communication with, and sandwiched between two thermoelectric assemblies of the plurality of thermoelectric assemblies. At least some of the plurality of thermoelectric assemblies and at least some of the plurality of second shunts are in series electrical communication with one another.

A thermoelectric system is provided which comprises at least a portion of a generally tubular fluid conduit configured to allow a fluid to flow through the at least a portion of the generally tubular fluid conduit along a direction. The thermoelectric system further comprises at least two thermoelectric assemblies extending around the conduit and in thermal communication with the conduit, the at least two thermoelectric assemblies comprising a first thermoelectric assembly and a second thermoelectric assembly. Each of the first thermoelectric assembly and the second thermoelectric assembly comprises: at least one first shunt; a plurality of thermoelectric elements in thermal communication and in electrical communication with the at least one first shunt and electrically isolated from the conduit, wherein at least a portion of the at least one first shunt is sandwiched between at least two thermoelectric elements of the plurality of thermoelectric elements; and at least one heat exchanger in thermal communication with the at least one first shunt. The thermoelectric system further comprises at least one compliant element mechanically coupling the first thermoelectric assembly and the second thermoelectric assembly together, wherein the at least one compliant element is compliant in response to motion among portions of the thermoelectric system.

A thermoelectric assembly is provided which comprises at least one first fluid conduit configured to allow a first fluid to flow through the at least one first fluid conduit generally along a first direction. The thermoelectric assembly further comprises at least one second fluid conduit configured to allow a second fluid to flow through the at least one second fluid conduit generally parallel to the first direction. The thermoelectric assembly further comprises a plurality of first shunts configured to extend around at least a portion of the at least one first fluid conduit and to be in thermal communication with the at least a portion of at least one first fluid conduit. The thermoelectric assembly further comprises a plurality of second shunts configured to extend around at least a portion of the at least one second fluid conduit and to be in thermal communication with the at least a portion of the at least one second fluid conduit. The thermoelectric assembly further comprises a plurality of first thermoelectric elements in thermal communication and in electrical communication with the plurality of first shunts and electrically isolated from the at least one first fluid conduit and from the at least one second fluid conduit. The thermoelectric assembly further comprises a plurality of second thermoelectric elements in thermal communication and in electrical communication with the plurality of first shunts and the plurality of second shunts, wherein each first shunt of the plurality of first shunts is sandwiched between at least one first thermoelectric element of the plurality of first thermoelectric elements and at least one second thermoelectric element of the plurality of second thermoelectric elements, and each second shunt of the plurality of second shunts is sandwiched between at least one first thermoelectric element of the plurality of first thermoelectric elements and at least one second thermoelectric element of the plurality of second thermoelectric elements.

A thermoelectric system is provided which comprises a plurality of thermoelectric assemblies. Each thermoelectric assembly of the plurality of thermoelectric assemblies comprises: at least one first fluid conduit configured to allow a first fluid to flow through the at least one first fluid conduit generally along a first direction; at least one second fluid conduit configured to allow a second fluid to flow through the at least one second fluid conduit generally parallel to the first direction; a plurality of first shunts configured to extend around at least a portion of the at least one first fluid conduit and to be in thermal communication with the at least a portion of at least one first fluid conduit; a plurality of second shunts configured to extend around at least a portion of the at least one second fluid conduit and to be in thermal communication with the at least a portion of the at least one second fluid conduit; a plurality of first thermoelectric elements in thermal communication and in electrical communication with the plurality of first shunts and electrically isolated from the at least one first fluid conduit and from the at least one second fluid conduit; a plurality of second thermoelectric elements in thermal communication and in electrical communication with the plurality of first shunts and the plurality of second shunts, wherein each first shunt of the plurality of first shunts is sandwiched between at least one first thermoelectric element of the plurality of first thermoelectric elements and at least one second thermoelectric element of the plurality of second thermoelectric elements, and each second shunt of the plurality of second shunts is sandwiched between at least one first thermoelectric element of the plurality of first thermoelectric elements and at least one second thermoelectric element of the plurality of second thermoelectric elements; and a housing configured to enclose the at least a portion of the at least one first fluid conduit, the at least a portion of the at least one second fluid conduit, the plurality of first shunts, the plurality of second shunts, the plurality of first thermoelectric elements, and the plurality of second thermoelectric elements. The thermoelectric assemblies are generally parallel to one another.

A thermoelectric assembly is provided which comprises a fluid conduit having a first surface. The thermoelectric assembly further comprises a housing having a second surface. The thermoelectric assembly further comprises a plurality of thermoelectric elements enclosed within the housing, wherein the plurality of thermoelectric elements are sandwiched between, in thermal communication with, and electrically isolated from the first surface and the second surface. The thermoelectric assembly further comprises a plurality of electrically conductive and thermally conductive shunts, wherein the plurality of shunts are in thermal communication and electrical communication with the plurality of thermoelectric elements, wherein the plurality of shunts comprises a first set of shunts in thermal communication with the fluid conduit and a second set of shunts in thermal communication with the housing. The thermoelectric assembly further comprises a plurality of heat exchangers in thermal communication with the housing and extending away from the housing.

The paragraphs above recite various features and configurations of a thermoelectric assembly, a thermoelectric system, or both, that have been contemplated by the inventors. It is to be understood that the inventors have also contemplated thermoelectric assemblies and thermoelectric systems which comprise combinations of these features and configurations from the above paragraphs, as well as thermoelectric assemblies and thermoelectric systems which comprise combinations of these features and configurations from the above paragraphs with other features and configurations disclosed in the following paragraphs.

BRIEF DESCRIPTION OF THE DRAWINGS

Various configurations are depicted in the accompanying drawings for illustrative purposes, and should in no way be interpreted as limiting the scope of the thermoelectric assemblies or systems described herein. In addition, various features of different disclosed configurations can be combined with one another to form additional configurations, which are part of this disclosure. Any feature or structure can be removed, altered, or omitted. Throughout the drawings, reference numbers may be reused to indicate correspondence between reference elements.

FIG. 2A schematically illustrates a perspective view of an example configuration of a thermoelectric assembly with the at least one shunt comprising an outer ring section and an inner section having a plurality of plates spaced from one another by slots.

FIG. 2B schematically illustrates a perspective view of at least one heat exchanger comprising a plurality of fins and a ring or tube brazed to the fins.

FIG. 2D schematically illustrates an example shunt comprising four sections with gaps or slots between the sections to electrically isolate the sections from one another.

FIG. 6A schematically illustrates another example thermoelectric system (e.g., cartridge).

FIG. 8B schematically illustrates at least one example spring between the plurality of thermoelectric assemblies and at least one of the first cap and the second cap.

FIGS. 9A-9D schematically illustrate various views of an example thermoelectric system in which the electrical current flow path passes once through the each thermoelectric assembly and each second shunt.

FIG. 11A schematically illustrates the at least one heat exchangers of adjacent thermoelectric assemblies mechanically coupled to one another by at least one compliant element.

FIGS. 11B and 11C schematically illustrate example compliant elements comprising at least one bellows mechanically coupled to the first and second thermoelectric assemblies and mounted in a regular configuration (FIG. 11B) or in an inverted configuration (FIG. 11C).

FIGS. 11D and 11E schematically illustrate example bellows that is a single unitary piece formed to have one or more convolutions.

FIG. 12A schematically illustrates an exploded perspective view of an example thermoelectric system which shows an example fabrication process for forming the thermoelectric system and FIGS. 12B-12D schematically illustrate an example bellows, an example second shunt, and an example thermoelectric assembly, respectively.

FIGS. 14A-14C schematically illustrate various views of an example thermoelectric assembly.

FIG. 15 schematically illustrates an example thermoelectric system in which at least some of the thermoelectric assemblies are arranged in a generally circular configuration.

FIG. 16B schematically illustrates an example thermoelectric system comprising a plurality of thermoelectric assemblies compatible with FIGS. 14A-14C.

FIG. 17 schematically illustrates an example packaging configuration of a thermoelectric system comprising one set of multiple thermoelectric assemblies for a vehicle exhaust application.

FIG. 18 schematically illustrates an example packaging configuration of a thermoelectric system comprising two sets of multiple thermoelectric assemblies, with the two sets in series with one another, for a vehicle exhaust application.

FIG. 19 schematically illustrates an example packaging configuration of a thermoelectric system for a vehicle exhaust application in which the exhaust flows transversely to the thermoelectric assemblies.

FIGS. 23A and 23B schematically illustrate example thermoelectric systems each comprising four thermoelectric assemblies in accordance with the example thermoelectric assembly of FIGS. 20-22.

FIG. 25A schematically illustrates radially connected example thermoelectric elements in a stonehenge configuration.

FIGS. 26A and 26B schematically illustrate example modular designs in which the thermoelectric elements are arranged so that heat transfer and current flow through the elements is generally in a circumferential direction.

DETAILED DESCRIPTION

Figure 1A:
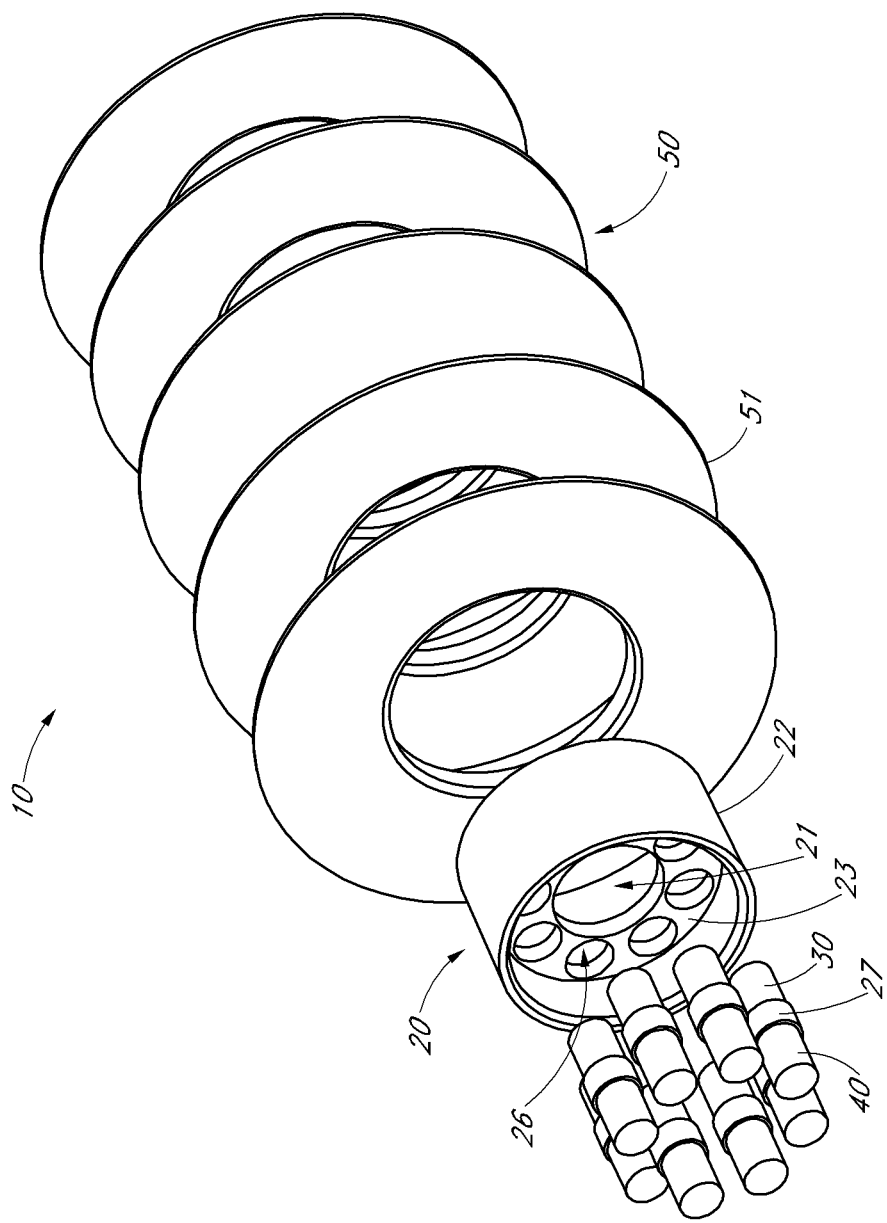
FIG. 1A schematically illustrates an exploded view of an example thermoelectric assembly configured to be in thermal communication with a tubular fluid conduit configured to have a first fluid flowing through the conduit along a direction.

Although certain configurations and examples are disclosed herein, the subject matter extends beyond the examples in the specifically disclosed configurations to other alternative configurations and/or uses, and to modifications and equivalents thereof. Thus, the scope of the claims appended hereto is not limited by any of the particular configurations described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain configurations; however, the order of description should not be construed to imply that these operations are order dependent. Additionally, the structures, systems, and/or devices described herein may be embodied as integrated components or as separate components. For purposes of comparing various configurations, certain aspects and advantages of these configurations are described. Not necessarily all such aspects or advantages are achieved by any particular configuration. Thus, for example, various configurations may be carried out in a manner that achieves or optimizes one advantage or group of advantages as taught herein without necessarily achieving other aspects or advantages as may also be taught or suggested herein.

A thermoelectric system as described herein can be a thermoelectric generator (TEG) which uses the temperature difference between two fluids to produce electrical power via thermoelectric materials. Alternatively, a thermoelectric system as described herein can be a heater, cooler, or both which serves as a solid state heat pump used to move heat from one fluid to another, thereby creating a temperature difference between the two fluids via the thermoelectric materials. Each of the fluids can be liquid, gas, or a combination of the two, and the two fluids can both be liquid, both be gas, or one can be liquid and the other can be gas.

The thermoelectric system can include a single thermoelectric assembly (e.g., a single cartridge) or a group of thermoelectric assemblies (e.g., a group of cartridges), depending on usage, power output, heating/cooling capacity, coefficient of performance (COP) or voltage. Although the examples described herein may be described in connection with either a power generator or a heating/cooling system, the described features can be utilized with either a power generator or a heating/cooling system.

Because the thermoelectric assembly and thermoelectric system may be exposed to significant temperature differences (for example, up to 600° C.), there are many features described herein which allow for thermal expansion and stress relief on the portions of the thermoelectric assemblies, the compression system, the main support, and the power terminal.

Certain example thermoelectric assemblies and systems as described herein can be higher performing than other designs and can provide a means for modularity that did not exist before, allowing for a path to lower cost manufacturing and applicability to more applications and package sizes.

Certain example thermoelectric assemblies and systems described herein can also be used in heating, cooling, or power generation modes for one application. There are processes that utilize temperature control (both heating and cooling) during particular operation phases (such as warm-up) but then provide a temperature difference during other phases of operation to provide for effective power generation. Heating and cooling can again be utilized to prevent failures such as overheating, accelerated aging, or low performance due to low temperatures. Example configurations using a modular design can provide a means to integrate the thermoelectric system (e.g., cartridge) into a shell and to utilize tube heat exchangers that could ideally fit into processes with such a range of phases. Thermoelectrics can then provide a unique solution in their ability to provide heating, cooling, and power generation.

Certain example thermoelectric systems as described herein provide a new modular approach to thermoelectric heating and cooling and thermoelectric power generation. These new modules or cartridges can include the hot and cold heat transfer surfaces and can integrate the thermoelectric material more directly into the heat exchangers. This more direct integration can reduce thermal resistances, which improves the performance (e.g., COP or maximum temperature difference) of the thermoelectric system.

By using the gas on the shell side and the liquid on the tube side, certain example thermoelectric systems as described herein with finned outer tubes can provide for a much larger heat transfer surface area on the gas side than other previous thermoelectric systems. Certain such configurations can reduce or prevent thermal impedance mismatch between the gas and liquid sides of the thermoelectric system.

As used herein, the terms "shunt" and "heat exchanger" have their broadest reasonable interpretation, including but not limited to a component (e.g., a thermally conductive device or material) that allows heat to flow from one portion of the component to another portion of the component. Shunts can be in thermal communication with one or more thermoelectric materials (e.g., one or more thermoelectric elements) and in thermal communication with one or more heat exchangers of the thermoelectric assembly or system. Shunts described herein can also be electrically conductive and in electrical communication with the one or more thermoelectric materials so as to also allow electrical current to flow from one portion of the shunt to another portion of the shunt (e.g., thereby providing electrical communication between multiple thermoelectric materials or elements). Heat exchangers can be in thermal communication with the one or more shunts and one or more working fluids of the thermoelectric assembly or system. Various configurations of one or more shunts and one or more heat exchangers can be used (e.g., one or more shunts and one or more heat exchangers can be portions of the same unitary element, one or more shunts can be in electrical communication with one or more heat exchangers, one or more shunts can be electrically isolated from one or more heat exchangers, one or more shunts can be in direct thermal communication with the thermoelectric elements, one or more shunts can be in direct thermal communication with the one or more heat exchangers, an intervening material can be positioned between the one or more shunts and the one or more heat exchangers). Furthermore, as used herein, the words "cold," "hot," "cooler," "hotter" and the like are relative terms, and do not signify a particular temperature or temperature range.

Thermoelectric Assembly

Figure 1B:
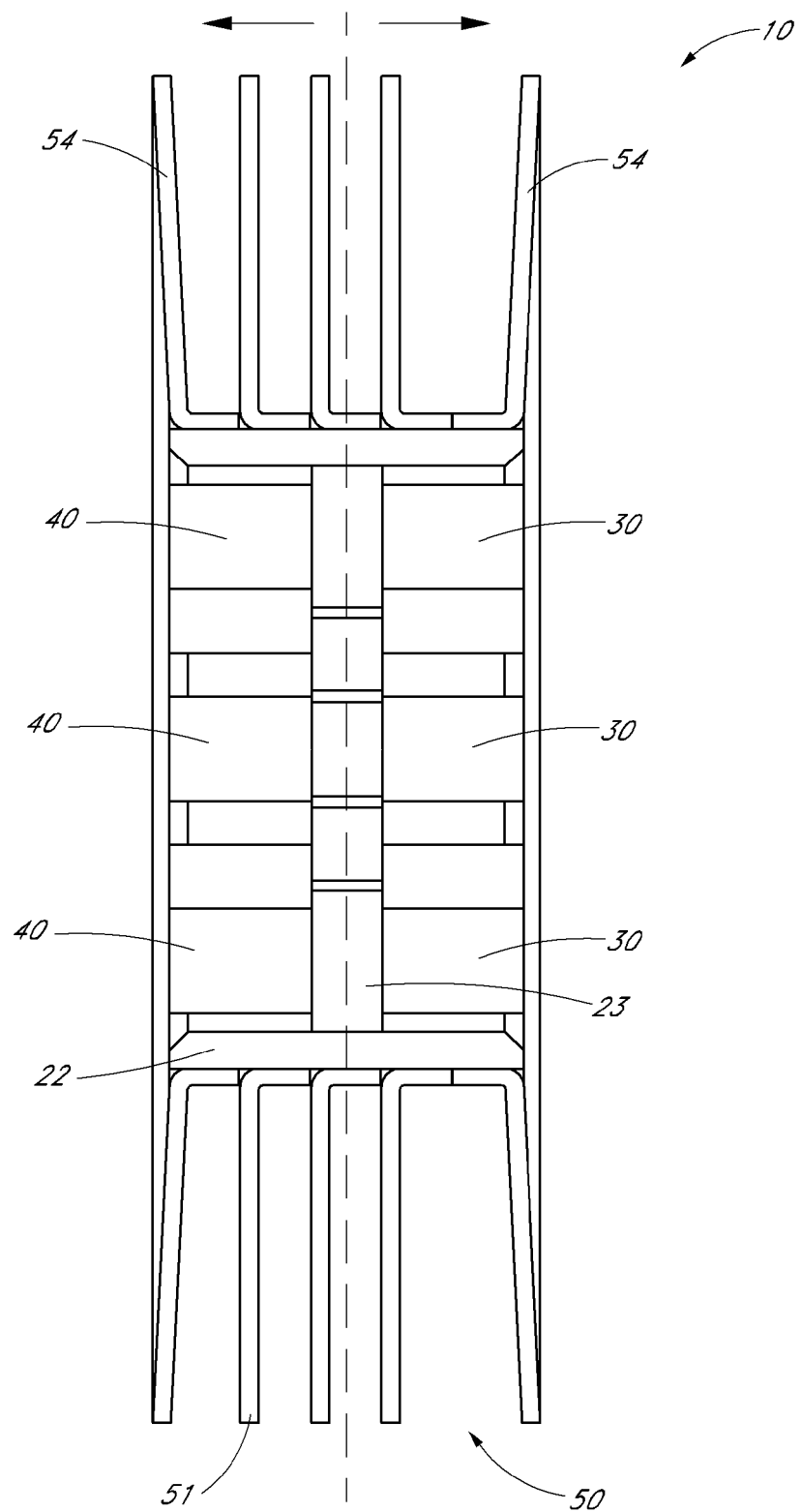
FIG. 1B schematically illustrates a partial side view of an axial cut of the example thermoelectric assembly of FIG. 1A in a plane perpendicular to the direction.

FIG. 1A schematically illustrates an exploded view of an example thermoelectric assembly 10 configured to be in thermal communication with a tubular or generally tubular fluid conduit (not shown) configured to have a first fluid flowing through the conduit along or generally along a direction, and FIG. 1B schematically illustrates a partial side view of an axial cut of the example thermoelectric assembly 10 of FIG. 1A in a plane perpendicular to the direction. While FIGS. 1A and 1B show one example structure of the thermoelectric assembly 10, other features, structures, or configurations can be used in addition or alternatively to those shown if FIGS. 1A and 1B, as described more fully below.

The thermoelectric assembly 10 comprises at least one shunt 20 configured to extend around the conduit. The thermoelectric assembly 10 further comprises at least one first thermoelectric element 30 in thermal communication and in electrical communication with the at least one shunt 20, and at least one second thermoelectric element 40 in thermal communication and in electrical communication with the at least one shunt 20. At least a portion of the at least one shunt 20 is sandwiched between the at least one first thermoelectric element 30 and the at least one second thermoelectric element 40. The at least one first thermoelectric element 30 and the at least one second thermoelectric element are electrically isolated from the conduit. The thermoelectric assembly 10 further comprises at least one heat exchanger 50 in thermal communication with the at least one shunt 20 and configured to be in thermal communication with a second fluid. For example, the conduit can have an elongated shape extending in the direction, and the at least one shunt 20 can be configured to encircle the conduit generally perpendicularly to the direction, and the at least one heat exchanger 50 can be configured to encircle the conduit generally perpendicularly to the direction.

The at least one shunt 20 can comprise one or more electrically and thermally conductive materials (e.g., copper, aluminum). As described more fully below, the at least one shunt 20 can further comprise one or more electrically insulating (e.g., dielectric) materials or layers configured to provide electrical isolation between components of the thermoelectric assembly 10 (e.g., to electrically isolate the at least one shunt 20 from the conduit and/or to thermally isolate the at least one shunt 20 from the conduit). While FIGS. 1A and 1B show a single unitary annular shunt 20, the at least one shunt 20 of other configurations can comprise multiple shunts 20 or shunt sections that are coupled together. For example, the at least one shunt 20 can comprise a plurality of sections each having a shape of a sector of an annulus, but other shapes (e.g., pie-shaped, wedge-shaped, trapezoidal, rectangular, polygonal, irregular) can also be used. In certain configurations in which the at least one shunt 20 comprises a plurality of pie-wedge-shaped sections, the sections can comprise an electrically insulating layer along their edges to provide electrical isolation from one pie-wedge-shaped section to another, which can advantageously help to increase the voltage and to reduce the current for the thermoelectric assembly 10. The at least one shunt 20 can be formed wholly or partially by machining, casting, forging, or other fabrication techniques. The materials of the at least one shunt 20 can be selected to provide the desired thermal expansion or contraction in response to changes of temperature, as described more fully below.

The shunt 20 can have a hole 21 (e.g., at the center of the shunt 20) that is configured to have the conduit extend through the hole 21. For example, the direction of fluid flow through the conduit can be along or generally along an axis of the conduit, and the shunt 20 can be configured to encircle the conduit perpendicularly or generally perpendicularly to the axis. The shunt 20 shown in FIGS. 1A and 1B has an annular shape which is configured to extend around a tubular or generally tubular fluid conduit having a generally circular cross-section in a plane perpendicular to the fluid flow through the conduit. In such a configuration, the hole 21 can be generally circular. For other configurations, the hole 21, the outer perimeter of the cross-section of the conduit, and the outer perimeter of the shunt 20 can have other shapes (e.g., oval, rectangular, square, polygonal, irregular) depending on usage. While FIGS. 1A and 1B show the hole 21 and the outer perimeter of the shunt 20 having the same general shape, in other configurations the shapes of the hole 21 and the outer perimeter of the shunt 20 can be different from one another.

Figure 1C:
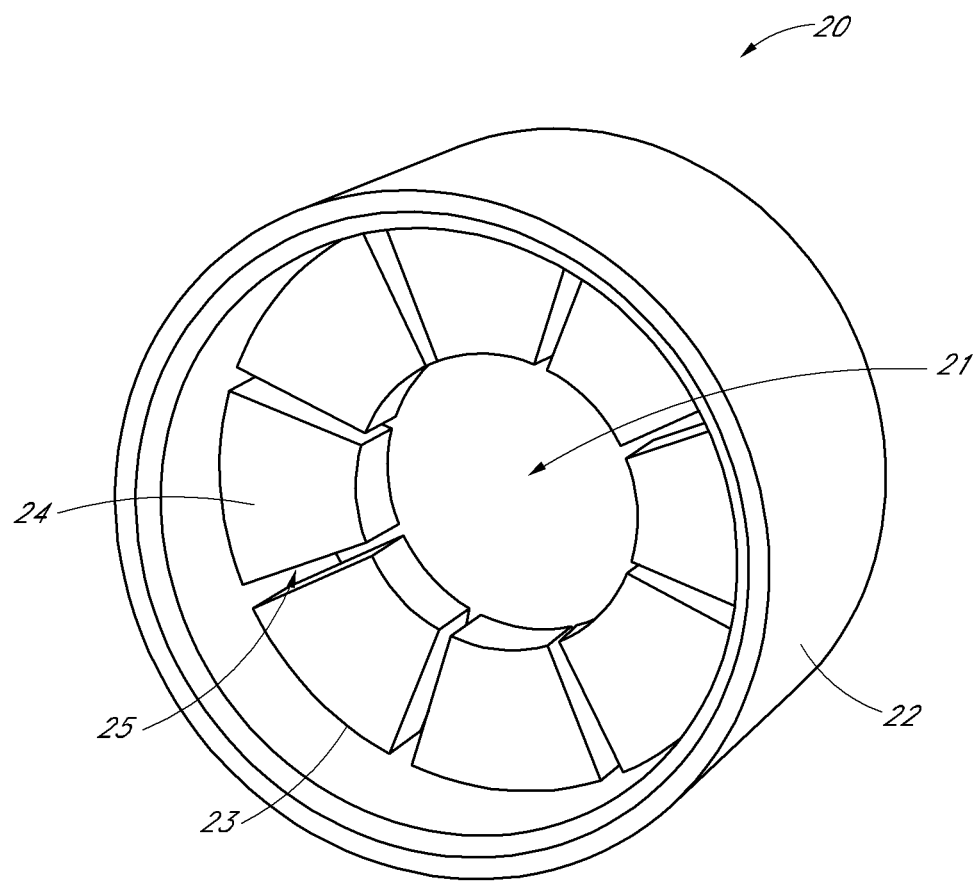
FIG. 1C schematically illustrates a perspective view of another example configuration of the at least one shunt in which the inner section comprises a plurality of plates spaced from one another.

The at least one shunt 20 can comprise an outer section 22 (e.g., an outer ring) and an inner section 23 in thermal communication with the outer section 22 and extending in an inward (e.g., radial) direction from the outer section 22. The outer section 22 and the inner section 23 can be portions of a single unitary piece, or can be separate pieces which are coupled together to form the shunt 20. In FIGS. 1A and 1B, the outer section 22 comprises a unitary ring and the inner section 23 comprises a unitary circular plate comprising the hole 21 which is configured to allow the conduit to extend through the hole 21. FIG. 1C schematically illustrates a perspective view of another example configuration of the at least one shunt 20 in which the inner section 23 comprises a plurality of plates 24 spaced from one another (e.g., by gaps or slots or by an electrically insulating material). Each plate 24 shown by FIG. 1C has a shape of a sector of an annulus, but other shapes (e.g., pie-shaped, wedge-shaped, trapezoidal, rectangular, polygonal, irregular) can also be used, in part depending on the cross-sectional shape of the conduit and the at least one shunt 20.

FIG. 2A schematically illustrates a perspective view of an example configuration of a thermoelectric assembly 10 with the at least one shunt 20 comprising an outer ring section 22 and an inner section 23 having a plate 24. While not shown in FIG. 2A, the at least one shunt 20 can provide spaces for electrical wiring to pass through the thermoelectric assembly 10. FIG. 2B schematically illustrates a perspective view of at least one heat exchanger 50 comprising a plurality of fins 51 (e.g., stainless steel) and a ring or tube 52 (e.g., stainless steel) brazed to the fins 51. As described more fully herein, the inner surface of the tube 52 can comprise an electrically insulating coating (e.g., plasma spray alumina).

Figure 2C:
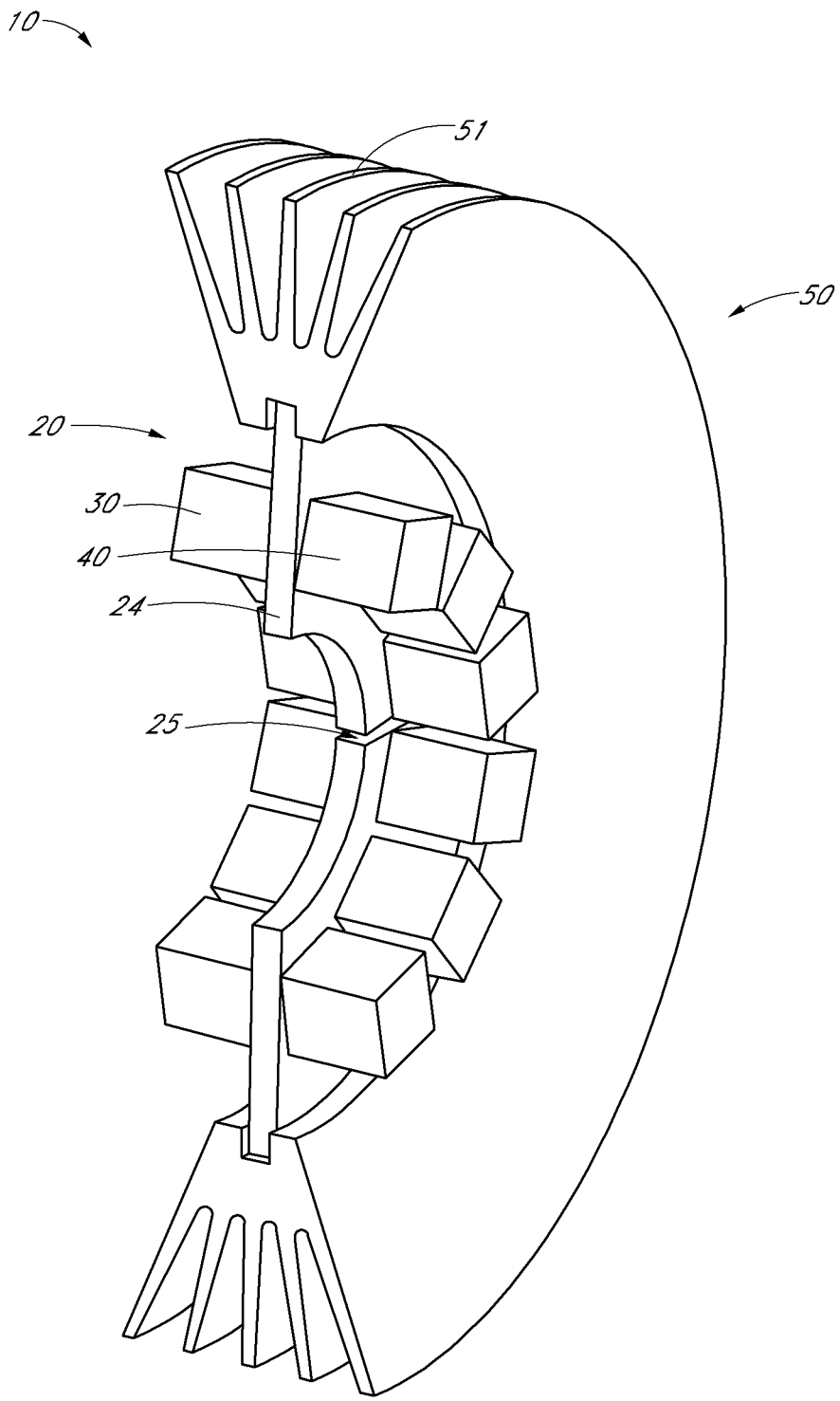
FIG. 2C schematically illustrates another example configuration of a thermoelectric assembly with the at least one shunt comprising a plurality of plates.

FIG. 2C schematically illustrates another example configuration of a thermoelectric assembly 10 with the at least one shunt 20 comprising a plurality of plates 24 spaced from one another by slots 25. The slots 25 can allow the plates 24 to expand upon heating. The at least one shunt 20 comprises four plates 24 that are each a quarter-sector of an annulus with slots 25 between the plates 24 (e.g., to electrically isolate the plates 24 from one another)(only two of the four plates 24 are shown in FIG. 2C). Each of the plates 24 has a plurality of first thermoelectric elements 30 on a first side and a plurality of second thermoelectric elements 40 on a second side. Each plate 24 extends one-quarter-way around the conduit and is each mechanically coupled and in thermal communication with the heat exchanger 50, which comprises a plurality of fins 51, which can be tapered as shown in FIG. 2C.

Figure 2E:
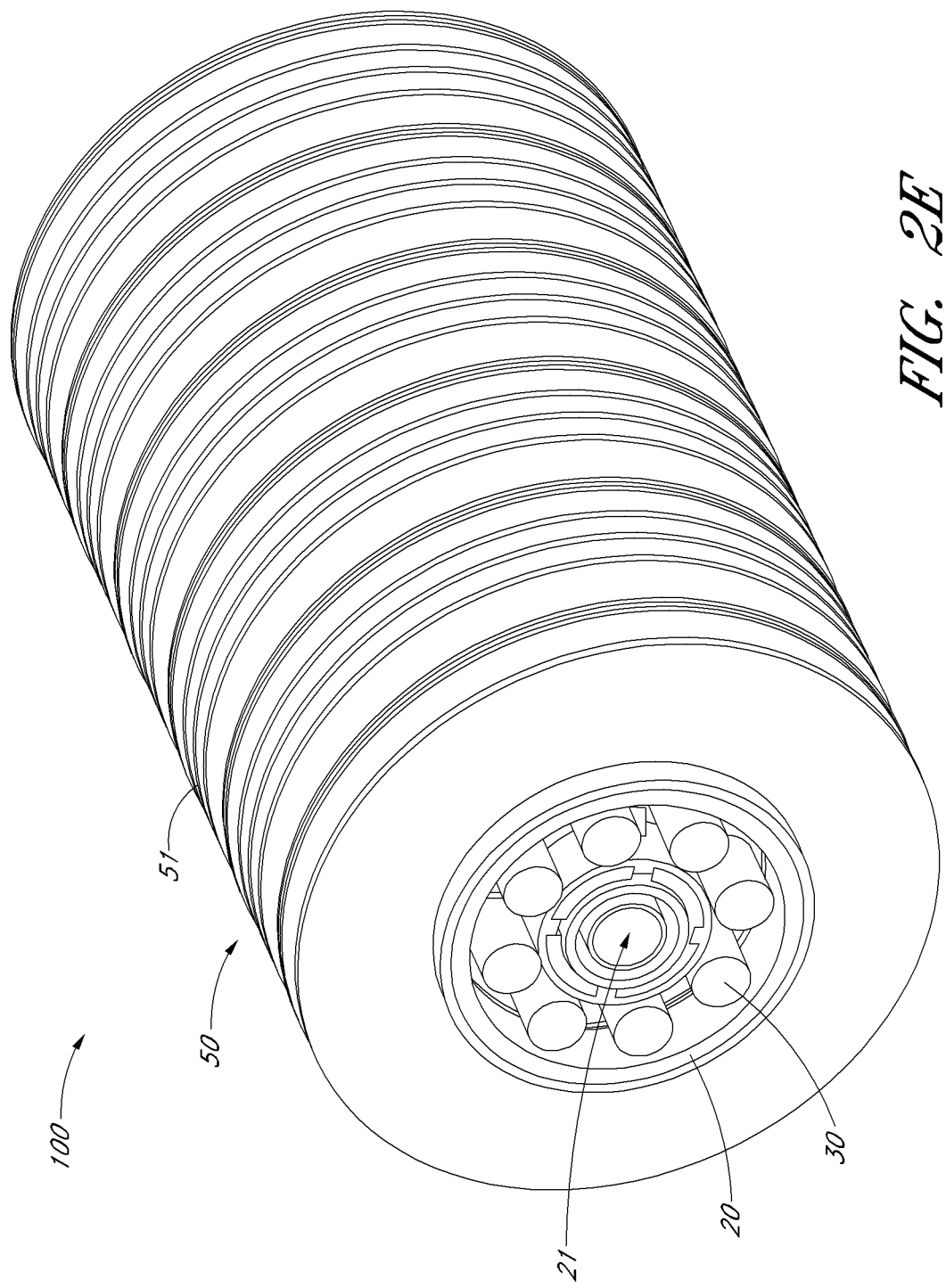
FIG. 2E schematically illustrates an example thermoelectric system comprising a plurality of thermoelectric assemblies in accordance with FIGS. 2C and 2D.

FIG. 2D schematically illustrates an example shunt 20 comprising four sections 20a, 20b, 20c, 20d with gaps or slots 25 between the sections to electrically isolate the sections from one another. The shunt 20 can also comprise a pair of couplers 28 that are configured to be affixed to one another (e.g., snapped) and comprising protrusions configured to space the four sections 20a, 20b, 20c, 20d from one another. The couplers 28 can comprise an electrically insulating material to maintain the electrical isolation of the four sections from one another. FIG. 2E schematically illustrates an example thermoelectric system 100 comprising a plurality of thermoelectric assemblies 10 in accordance with FIGS. 2C and 2D.

As shown in FIGS. 1B and 1C, the outer section 22 and the inner section 23 can give the shunt 20 a "T"-shaped cross-section in a plane parallel to the direction of fluid flow through the conduit, while in other configurations, the shunt 20 can have other shapes (e.g., "Y"-shaped, "I"-shaped). While the outer section 22 shown in FIGS. 1B and 1C extends in two directions generally parallel to the fluid flow direction, in other configurations, the outer section 22 can extend in only one such direction along or generally along the conduit, can extend in one or more directions that are not parallel to the fluid flow direction (e.g., perpendicular or generally perpendicular to the fluid flow direction), or can not extend along or generally along the conduit beyond the inner section 23.

The at least one shunt 20 can be configured to be substantially thermally isolated from the conduit such that there is not an appreciable thermal path directly from the conduit to the at least one shunt 20 (e.g., the at least one shunt 20 is not in direct thermal communication with the conduit). For example, the inner section 23 of the at least one shunt 20 can be configured to be spaced from the conduit (e.g., by a gap or by a thermally insulating material). The spacing of the inner section 23 from the conduit can also provide electrical isolation between the at least one shunt 20 and the conduit.

Figure 1D:
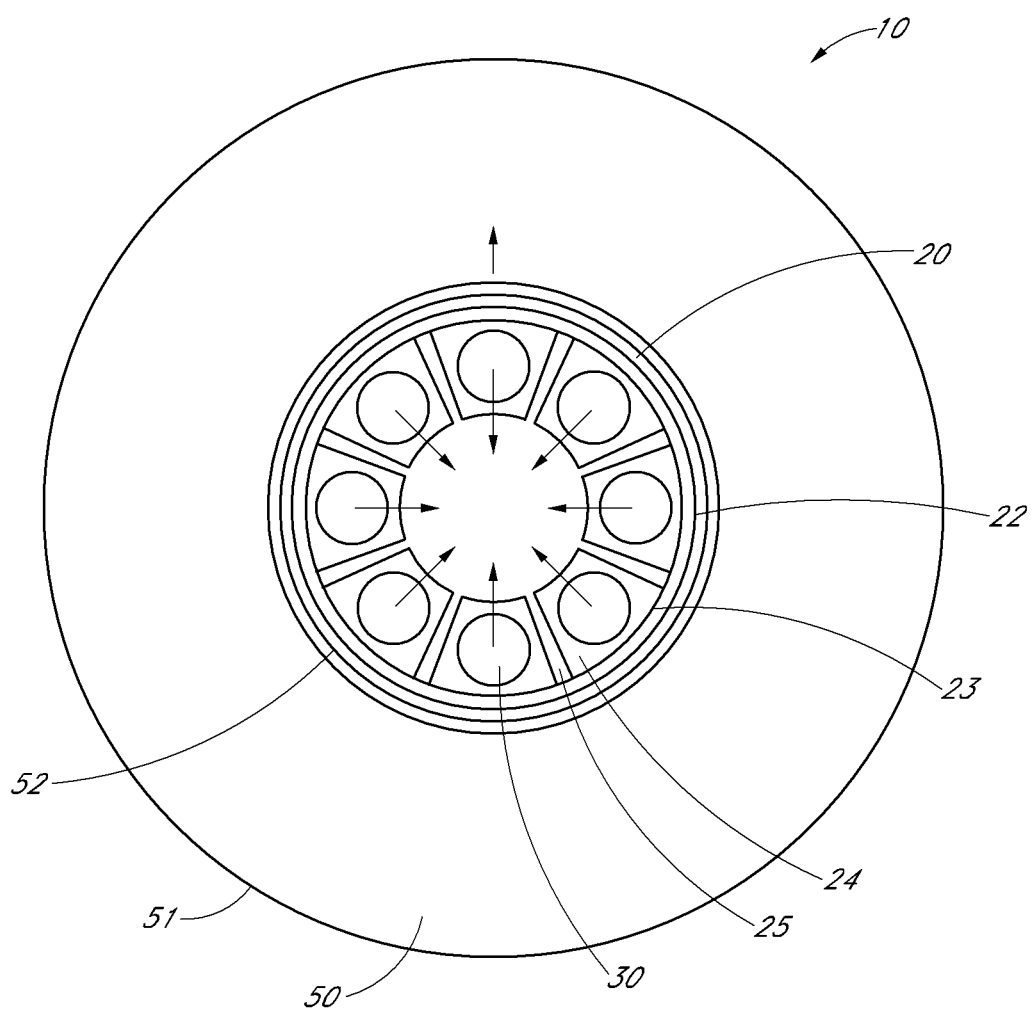
FIG. 1D schematically illustrates a front view of an example thermoelectric assembly having the at least one shunt comprising an outer ring section, an inner section comprising a plurality of plates, and thermoelectric elements coupled to the plates.

The outer section 22 can have a first coefficient of thermal expansion and the inner section 23 can have a second coefficient of thermal expansion that is greater than the first coefficient of thermal expansion (e.g., for configurations in which the at least one shunt 20 is the hot side shunt). For example, FIG. 1D schematically illustrates a front view of an example thermoelectric assembly 10 having the at least one shunt 20 comprising an outer ring section 22, an inner section 23 comprising a plurality of plates 24, and thermoelectric elements 30 coupled to the plates 24. In response to temperature increases of the at least one shunt 20, the outer ring section 22 will expand and increase in diameter and the plates 24 will increase their length and expand towards the conduit (indicated by arrows). By having the coefficient of thermal expansion of the plates 24 greater than the coefficient of thermal expansion of the outer ring section 22, movement of the thermoelectric elements 30 in a inwardly or outwardly direction from the conduit can advantageously be minimized. In other configurations, the first coefficient of thermal expansion can be greater than the second coefficient of thermal expansion (e.g., for configurations in which the at least one shunt 20 is the cold side shunt).

The at least one first thermoelectric element 30 and the at least one second thermoelectric element 40 each comprise one or more thermoelectric materials that are configured either to have a temperature difference applied across the one or more thermoelectric materials to produce a voltage difference across the one or more thermoelectric materials (e.g., for power generation applications) or to have a voltage difference applied across the one or more thermoelectric materials to produce a temperature difference across the one or more thermoelectric materials (e.g., for heating/cooling applications). The at least one first thermoelectric element 30 can include thermoelectric elements of a first doping type (e.g., n-type or p-type) and the at least one second thermoelectric element 40 can include thermoelectric elements of a second doping type (e.g., p-type or n-type) different from the first doping type. For example, the at least one first thermoelectric element 30 can comprise only n-type thermoelectric materials and the at least one second thermoelectric element 40 can comprise only p-type thermoelectric materials, or portions of the at least one first thermoelectric element can comprise both n-type and p-type materials and portions of the at least one second thermoelectric element can comprise both n-type and p-type materials.

The at least one first thermoelectric element 30 and the at least one second thermoelectric element 40 can each comprise one or more layers of one or more materials and can have a shape (e.g., planar, cylindrical, parallelepiped, rhomboid, cubic, plug-shaped, block-shaped) configured to fit within the thermoelectric assembly 10 and the overall thermoelectric system 100, as described more fully below, to facilitate the thermal path or overall efficiency of the thermoelectric assembly 10 or the overall thermoelectric system 100. The at least one first thermoelectric element 30 and the at least one second thermoelectric element 40 can be coupled to or integrated with the at least one shunt 20 so as to facilitate the thermal path or overall efficiency of the thermoelectric assembly 10 or the overall thermoelectric system 100. The at least one first thermoelectric element 30 can be configured to be in thermal communication with the conduit (e.g., either directly or by other components of the thermoelectric assembly 10, such as a second shunt in thermal communication with the conduit, as described more fully below) and the at least one first thermoelectric element 30 can be configured to be in thermal communication with the conduit (e.g., either directly or by other components of the thermoelectric assembly 10, such as a third shunt in thermal communication with the conduit, as described more fully below).

The at least one first thermoelectric element 30 can be positioned on a first side of the at least one shunt 20 and the at least one second thermoelectric element 40 can be positioned on a second side of the at least one shunt 20 such that at least a portion of the at least one shunt 20 is sandwiched between the at least one first thermoelectric element 30 and the at least one second thermoelectric element 40. For example, as shown in FIGS. 1A, 1B, and 2, at least a portion of the inner section 23 of the shunt 20 (e.g., at least a portion of one or more of the plates 24) is sandwiched between the at least one first thermoelectric element 30 and the at least one second thermoelectric element 40. The at least one first thermoelectric element 30 can be directly mechanically coupled to the shunt 20, or the thermoelectric assembly 10 can comprise an intervening material (e.g., a bonding material) between the at least one first thermoelectric element 30 and the shunt 20. Similarly, the at least one second thermoelectric element 40 can be directly mechanically coupled to the shunt 20, or the thermoelectric assembly 10 can comprise an intervening material (e.g., a bonding material) between the at least one second thermoelectric element 40 and the shunt 20.

The inner section 23 of the at least one shunt 20 can comprise a first portion in thermal communication with the outer ring section 22 and extending in an inward direction from the outer ring section 22, and the first portion can comprise a plurality of recesses or holes 26. The inner section 23 can further comprise a second portion mechanically coupled to the first portion and comprising a plurality of inserts 27. The inserts 26 can be configured to fit within the recesses or holes 26 (e.g., extending through the plurality of holes 26), and the inserts 27 can be sandwiched between the at least one first thermoelectric element 30 and the at least one second thermoelectric element 40 with at least some of the inserts 27 electrically isolated from one another. Each insert 27 can be in thermal and electrical communication with the at least one first thermoelectric element 30 and the at least one second thermoelectric element 40 to which it is mechanically coupled, such that the at least one first thermoelectric element 30 is in series electrical communication with the at least one second thermoelectric element, and there is a thermal path from the outer section 22, through the insert 27 of the inner section 23, to the at least one first thermoelectric element 30 and to the at least one second thermoelectric element 40.

For example, as schematically illustrated by FIG. 1A, each insert 27 can comprise a copper disk or cylinder sandwiched between a corresponding first thermoelectric element 30 (e.g., cylindrical pellet) mounted on the insert 27 and a corresponding second thermoelectric element 40 (e.g., cylindrical pellet) mounted on the insert 27. The holes 26 and the inserts 27 are distributed generally symmetrically along the inner section 23. Other shapes (e.g., square, triangular, oval, polygonal, irregular) and distributions (e.g., asymmetric, non-symmetric) of the holes 26 and the inserts 27 can also be used. Each of the inserts 27 can be placed within a corresponding hole 26 and mechanically coupled to the material of the inner section 23 surrounding the hole 26 (e.g., by brazing, welding, or using adhesive). The inserts 27 can comprise the same material or a different material than does the surrounding portion of the inner section 23.

The portion of the at least one shunt 20 can be electrically isolated from the remaining portion of the at least one shunt 20 while remaining in thermal communication with the remaining portion of the at least one shunt 20. For example, the shunt 20 of FIG. 1A can comprise one or more electrically insulating layers between the inserts 27 and the rest of the shunt 20, with the one or more electrically insulating layers being sufficiently thermally conductive and sufficiently electrically insulating so that the inserts 27 are in thermal communication with the rest of the shunt 20 but are electrically isolated from the rest of the shunt 20. The one or more electrically insulating layers can be on the outer perimeter of the inserts 27, the inner surface of the recesses or holes 26, or both. For example, the electrically insulating layer can be deposited onto the outer perimeter of the insert 27 or on the inner surface of the recess or hole 26 by plasma spraying of a electrically insulating material (e.g., aluminum oxide, nitrides, cuprites, aluminates).

Figure 3:
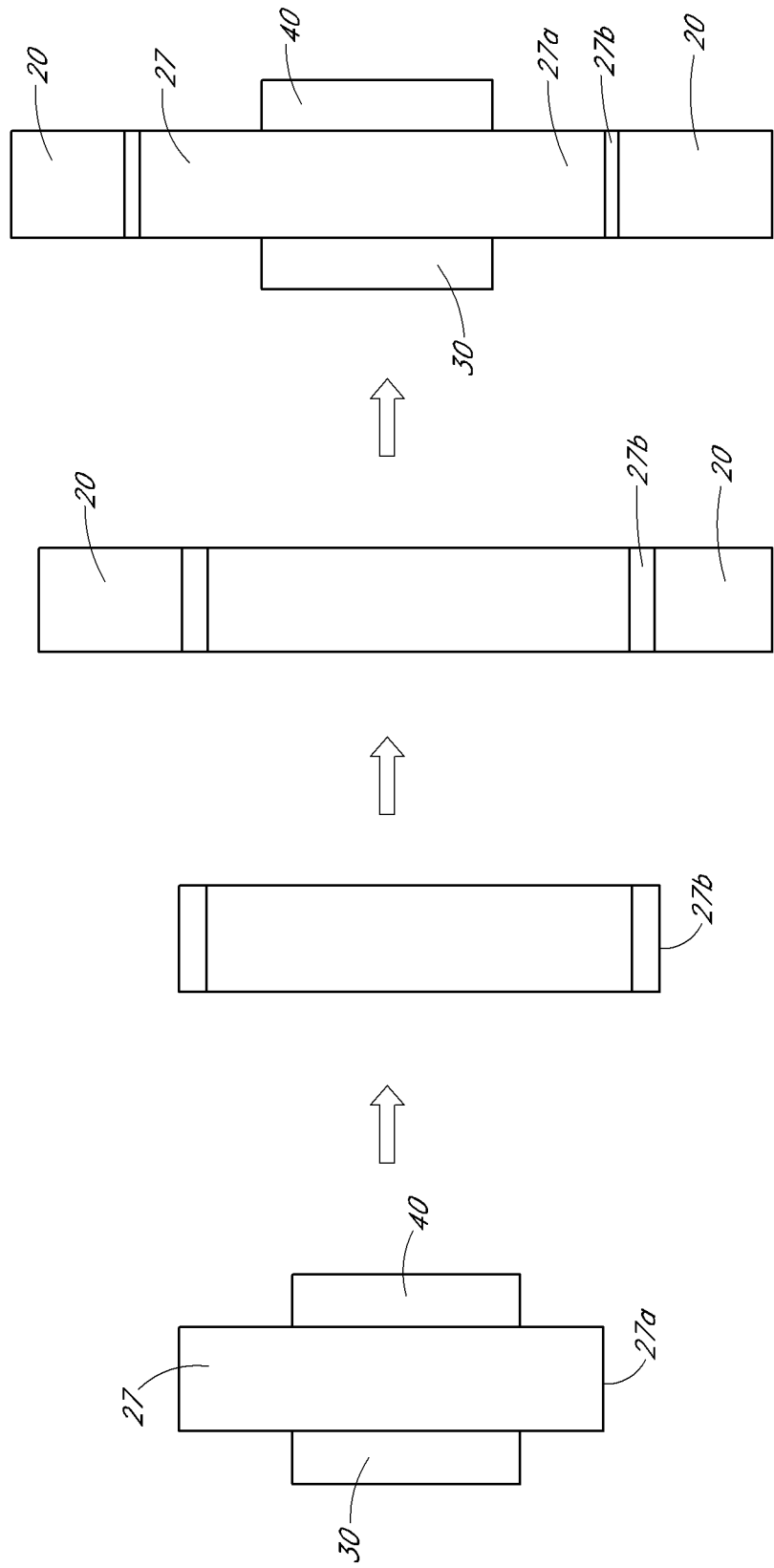
FIG. 3 schematically illustrates a cross-sectional view of another example configuration in which each insert is in thermal communication with the rest of the shunt but is electrically isolated from the rest of the shunt.

FIG. 3 schematically illustrates a cross-sectional view of another example configuration in which each insert 27 is in thermal communication with the rest of the shunt 20 but is electrically isolated from the rest of the shunt 20. The insert 27 can comprise an electrically conductive portion 27a and an electrically insulating portion 27b (e.g., one or more dielectric layers, spacers, or ring). The electrically conductive portion 27a can be mounted to the thermoelectric elements 30, 40 (e.g., by bonding, soldering, sintering, compressing) to be in thermal and electrical communication with the thermoelectric elements 30, 40, and the electrically insulating portion 27b can be fitted, mounted, or deposited on either the electrically conductive portion 27a or the inner surface of the hole 26. The electrically conductive portion 27a can be inserted in the hole 26 with the electrically insulating portion 27b positioned between the electrically conductive portion 27a and the surrounding region of the shunt 20.

The at least one heat exchanger 50 can comprise one or more materials (e.g., aluminum, copper, stainless steel alloy). In configurations in which the at least one heat exchanger 50 is exposed to corrosive environments, stainless steel alloy can be advantageously used to withstand corrosion. The at least one heat exchanger 50 can be brazed, soldered, pressed on, affixed using adhesive, or otherwise mechanically coupled to the at least one shunt 20 to provide thermal communication between the at least one heat exchanger 50 and the at least one shunt 20. The at least one heat exchanger 50 and the at least one shunt 20 can comprise the same material, and can be portions of the same unitary component. The at least one heat exchanger 50 can comprise one or more materials that are responsive to temperature (e.g., are "active") such that the at least one heat exchanger 50 varies its shape, configuration, orientation, or other attribute in response to excessively high temperatures. For example, the at least one heat exchanger 50 can comprise a shape memory alloy that is configured to move and become thermally insulated or decoupled from the at least one shunt 20 (e.g., by moving to create a gap which reduces the heat flux to the at least one shunt 20) to advantageously protect the thermoelectric elements 30, 40 from excessive temperatures.

The thermoelectric assembly 20 can comprise at least one electrically insulating layer between the at least one shunt 20 and the at least one heat exchanger 50 to electrically isolate the at least one heat exchanger 50 from the at least one shunt 20 (and to electrically isolate the at least one heat exchanger 50 from the at least one first thermoelectric element 30 and the at least one second thermoelectric element 40) while providing thermal communication between the at least one heat exchanger 50 and the at least one shunt 20. For example, FIG. 2B schematically illustrates at least one heat exchanger 50 comprising a plurality of fins 51 and a ring or tube 52 brazed to the fins 51. An electrically insulating (e.g., dielectric) layer 53 can be between the tube 52 and the at least one shunt 20 (e.g., on an inner surface of the tube 52 or on an outer surface of the at least one shunt 20). The fins 51 and tube 52 can comprise stainless steel and the electrically insulating layer 53 can comprise alumina (e.g., coated or plasma sprayed onto an inner surface of the tube 52 or an outer surface of the at least one shunt 20). The tube 52 can be affixed (e.g., brazed) to the at least one shunt 20, resulting in a thermoelectric assembly 20 with the at least one shunt 20 in thermal communication with, but electrically isolated from, the at least one heat exchanger 50.

The at least one heat exchanger 50 can be configured to encircle the conduit (e.g., perpendicularly or generally perpendicularly to the axis of the conduit). For example, as schematically illustrated by FIGS. 1A and 1B, the at least one heat exchanger 50 can comprise a plurality of fins 51 mechanically coupled to the at least one shunt 20 so as to be in thermal communication with the at least one shunt 20. The plurality of fins 51 of FIGS. 1A and 1B are each unitary, annular, and planar, and extend generally outwardly from the at least one shunt 20 parallel or generally parallel to one another each in a plane perpendicular to the direction of fluid flow within the conduit. The fins 51 are configured to be in thermal communication with a second fluid (e.g., a fluid flowing in a direction generally perpendicular to the fluid flow direction within the conduit).

Figure 1E:
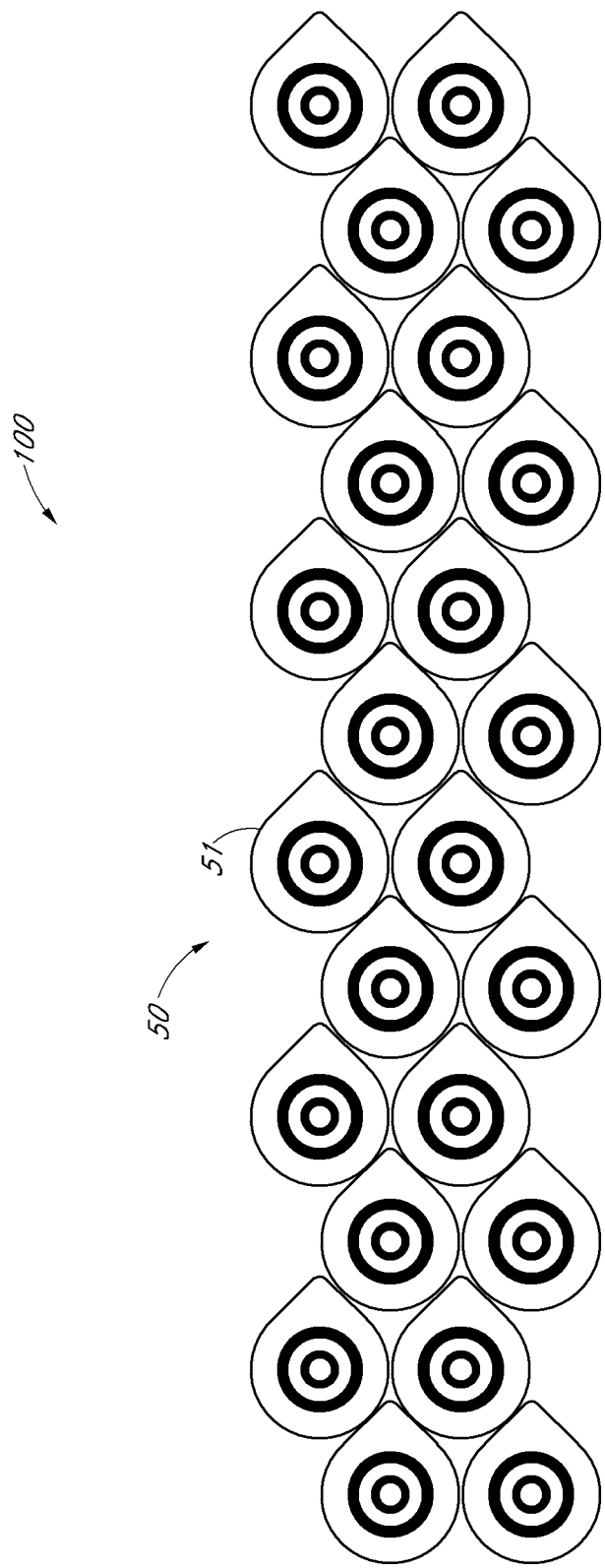
FIG. 1E schematically illustrates a plurality of example thermoelectric assemblies having at least one heat exchanger comprising fins having a general tear-drop shape.

Other shapes of fins 51 (e.g., rectangular, corrugated, non-planar, spiral, tapered), configurations (e.g., perforated, segmented or comprising separate sections, non-parallel to one another) and orientations can be used. For example, as schematically illustrated by FIG. 1E, each thermoelectric assembly 10 of a plurality of thermoelectric assemblies 10 can comprise at least one heat exchanger 50 comprising fins 51 having a tear-drop shape. Such fin shapes, as well as other non-uniform fin shapes, can advantageously provide a more aerodynamic shape, can reduce pressure drop, and/or can increase the heat transfer surface area where further heat transfer is needed between the fins 51 and the second fluid.

At least some of the fins 51 can extend axially along or generally along the length of the conduit (e.g., planar in a plane parallel or generally parallel to the fluid flow direction within the conduit), can extend in a plane perpendicular to the fluid flow direction within the conduit (e.g., as shown in FIGS. 1A, 1B, 2A), or can extend at a non-zero angle relative to the direction of fluid flow within the conduit (e.g., as shown in FIG. 2C). The fins 51 can be segmented to help manage thermal expansion issues. For example, the at least one heat exchanger 50 can comprise two half-annular portions, one of which is shown in FIG. 2C, with each portion having its fins 51 extending half-way around the conduit and in thermal communication with two quarter-sector plates 24 of the at least one shunt 20. The thermoelectric system 100 can comprise pairs of such half-annular portions, with the two half-annular portions of each pair generally planar with one another, and with gaps or slots between the half-annular portions making up the pair. Such gaps or slots can help manage thermal expansion issues.

Figure 4:
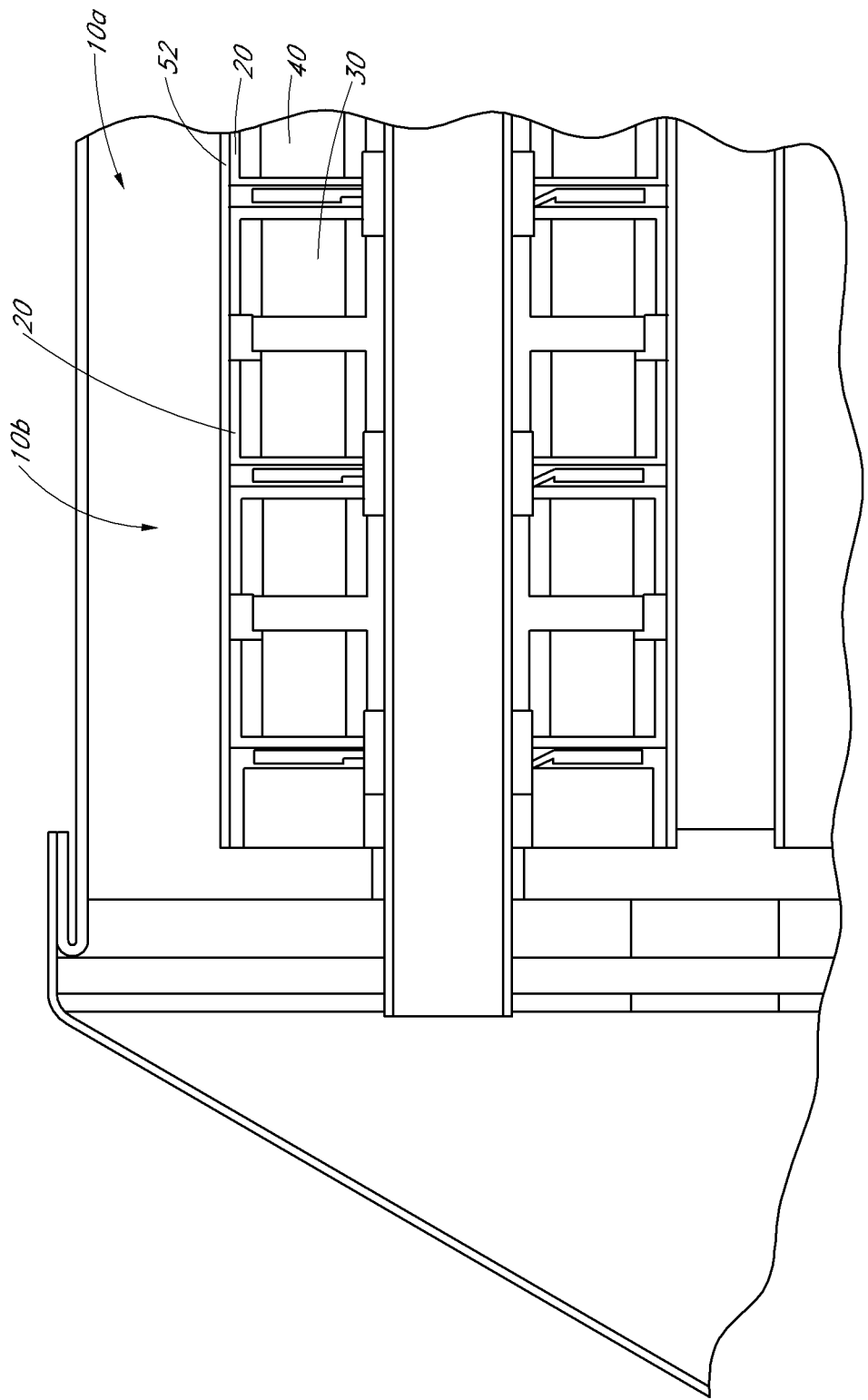
FIG. 4 schematically illustrates an example configuration cylindrical tube which provides the at least one heat exchanger for a plurality of thermoelectric assemblies.

As another example, FIG. 4 schematically illustrates an example configuration cylindrical tube 52 which provides the at least one heat exchanger 50 for a plurality of thermoelectric assemblies 10. The tube 52 is in thermal communication with the at least one shunt 20 of the plurality of thermoelectric assemblies 10 inside the tube 52 and with a second fluid outside the tube 52. The tube 52 can comprise protrusions (e.g., fins) to facilitate heat transfer between the tube 52 and the second fluid, or the tube 52 can be substantially free of protrusions, as shown in FIG. 4.

The at least one heat exchanger 50 can be configured to transfer heat to or from the at least one shunt 20 such that the at least one heat exchanger is configured to form at least one thermal path between the at least one heat exchanger 50 and the conduit passing through the at least one first thermoelectric element 30 and at least one thermal path between the at least one heat exchanger 50 and the conduit passing through the at least one second thermoelectric element 40. The first fluid can comprise a liquid (e.g., water or engine coolant) or a gas (e.g., air or engine exhaust), and the second fluid can comprise a liquid (e.g., water or engine coolant) or a gas (e.g., air or engine exhaust). The first fluid and the second fluid can be at different temperatures from one another such that there is a temperature difference across the at least one first thermoelectric element 30 and across the at least one second thermoelectric element 40. For example, the first fluid (e.g., coolant) can be at a first temperature and the second fluid (e.g., hot gas) can be at a second temperature that can be higher than the first temperature. For an alternative example, the second temperature can be lower than the first temperature.

The coefficient of thermal expansion of the at least one heat exchanger 50 can be lower than the coefficient of thermal expansion of the at least one shunt 20 (e.g., in configurations in which the at least one shunt 20 is the hot side shunt). In such a configuration, increasing the temperature of the thermoelectric assembly 10 will increase the mechanical pressure between the at least one heat exchanger 50 and the at least one shunt 20, thereby increasing the thermal conductivity between the at least one heat exchanger 50 and the at least one shunt 20.

Cartridge-Based Thermoelectric System

A thermoelectric system 100 can comprise a single thermoelectric assembly 10 which itself comprises a plurality of shunts 20, a plurality of thermoelectric elements 30, 40, and a plurality of heat exchangers 50 (e.g., built out of a single sleeve instead of multiple thermoelectric assemblies 10). A thermoelectric system 100 can comprise multiple thermoelectric assemblies 10 (e.g., 2, 3, 4, 5, 6, 7, 8, 9, 10, 11, 12, 13, 14, or 15 or more thermoelectric assemblies 10) which are combined together, adjacent to one another, on the same first fluid conduit to form the thermoelectric system 100. As disclosed in more detail below, for such configurations, the at least one heat exchanger 50 of the thermoelectric assembly 10 can be configured to be mechanically coupled to at least one heat exchanger 50 of an adjacent thermoelectric assembly 10. For example, as schematically illustrated by FIG. 4, a portion of the cylindrical tube 52 is in thermal communication with the at least one shunt 20 of the first thermoelectric assembly 10a and with a second fluid outside the tube 52, so the portion of the cylindrical tube 52 can serve as the at least one heat exchanger 50 of the first thermoelectric assembly 10a. In addition, another portion of the cylindrical tube 52 is in thermal communication with the at least one shunt 20 of the second thermoelectric assembly 10b and with the second fluid outside the tube 52, so this portion of the cylindrical tube 52 can serve as the at least one heat exchanger of the second thermoelectric assembly 10b. Since the portions of the cylindrical tube 52 are mechanically coupled to one another, the at least one heat exchanger 50 of the first thermoelectric assembly 10a and the at least one heat exchanger 50 of the second thermoelectric assembly 10b are mechanically coupled to one another.

The at least one heat exchangers 50 of adjacent thermoelectric assemblies 10 can be mechanically coupled to one another by at least one compliant element 54 configured to be compliant (e.g., a flexible element which is configured to deform elastically) in response to motion among portions of the thermoelectric system 100 (e.g., motion comprising thermal expansion or contraction within the thermoelectric system 100 or motion caused by mechanical shocks to the thermoelectric system 100). The at least one compliant element 54 can comprise a portion of the at least one heat exchanger 50 which is compliant (e.g., flexible and can deform elastically) in response to motion among portions of the thermoelectric assembly 10 or the overall thermoelectric system 100 (e.g., motion comprising thermal expansion or contraction or motion caused by mechanical shocks). For example, a portion of the cylindrical tube 52 between the two adjacent thermoelectric assemblies 10a, 10b of FIG. 4 can comprise a compliant coupler (e.g., a bellows). For configurations in which the at least one heat exchanger 50 comprises one or more fins 51, the at least one heat exchanger 50 of adjacent thermoelectric assemblies 10 can be configured to be mechanically coupled to one another by at least one compliant element 54, as described more fully below with regard to FIG. 11A. For example, as schematically illustrated by FIG. 1B, one or more fins 51 of the thermoelectric assembly 10 can be flexible and can deform elastically in response to motion among portions of the thermoelectric system 100 (e.g., motion comprising thermal expansion or contraction within the thermoelectric system 100 or motion caused by mechanical shocks to the thermoelectric system 100).

Figure 5A:
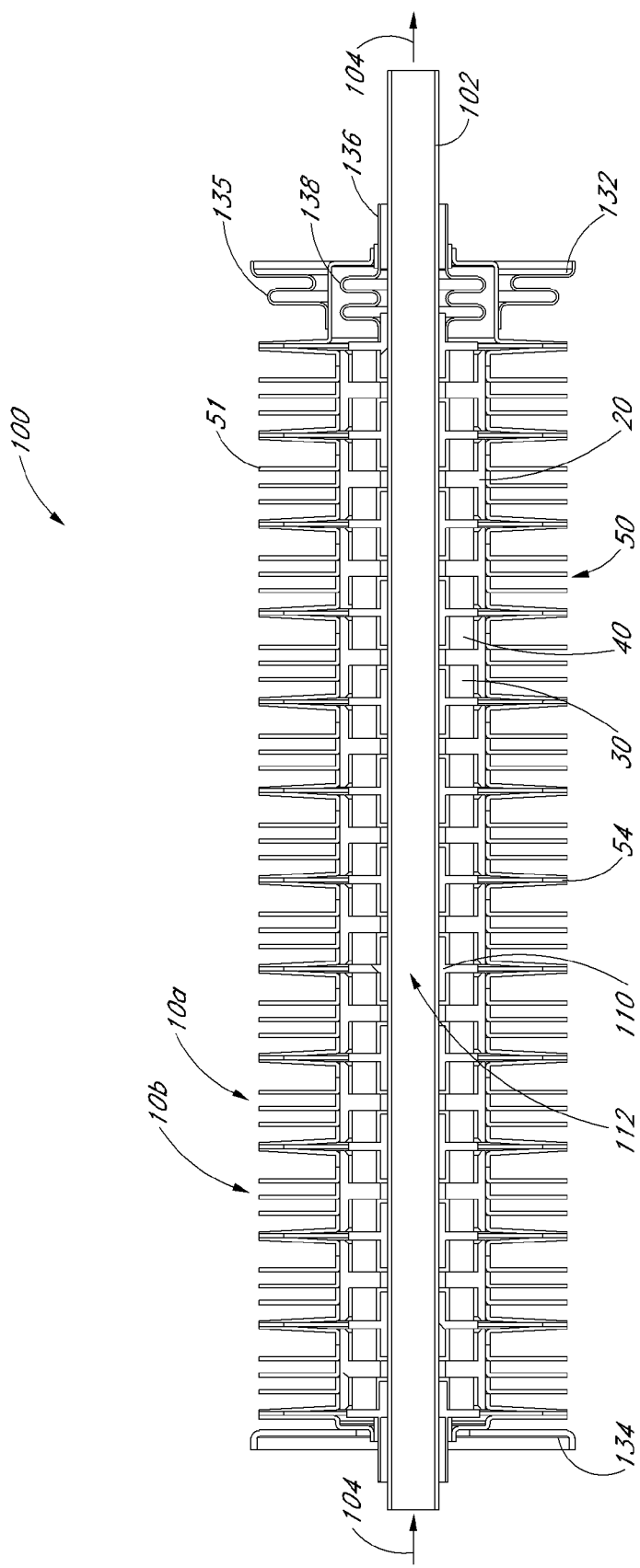
FIG. 5A schematically illustrates a cross-sectional view of an example thermoelectric system (e.g., cartridge).
Figure 5B:
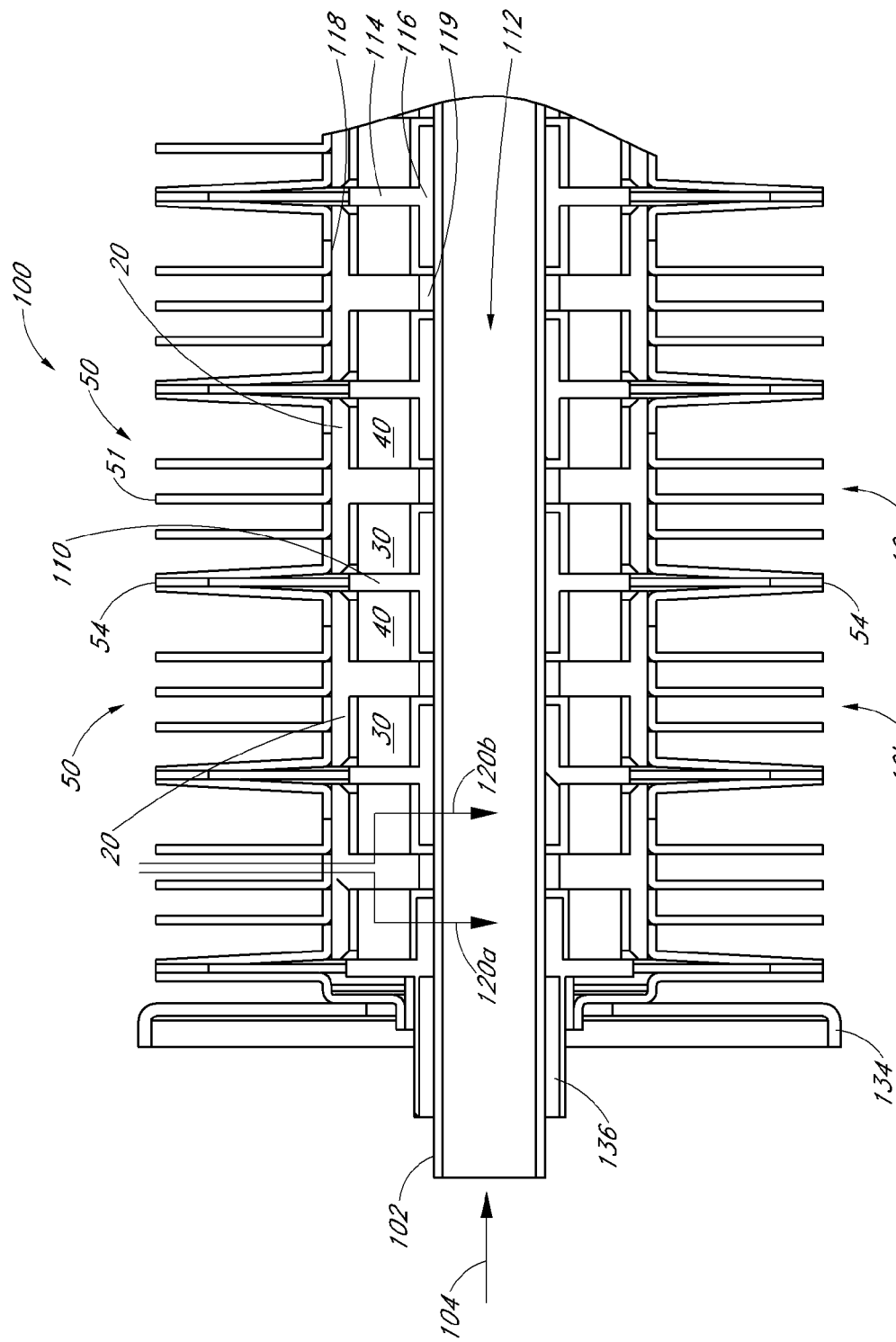
FIG. 5B schematically illustrates a cross-sectional view of a portion of the example thermoelectric system of FIG. 5A.
Figure 6B:
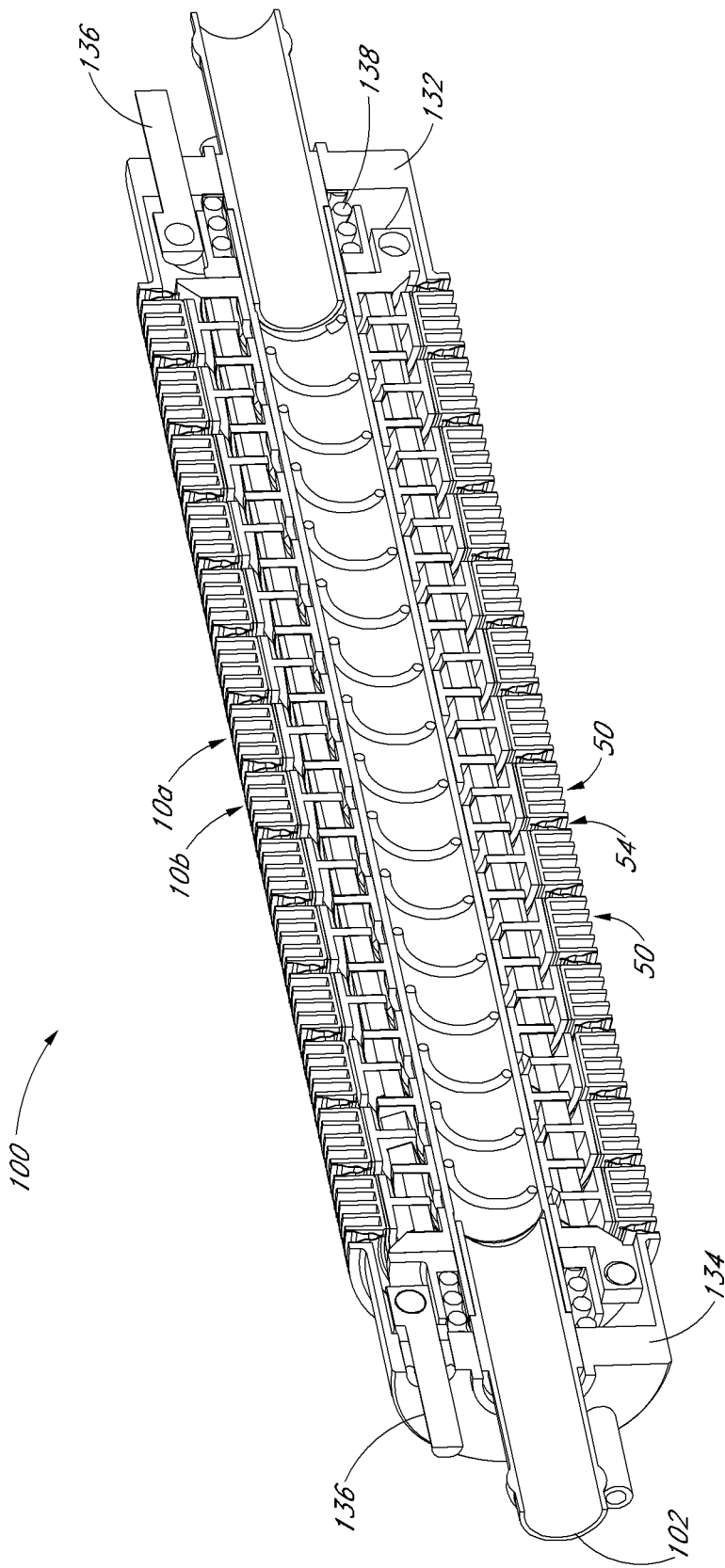
FIG. 6B schematically illustrates a perspective cross-sectional view of the example thermoelectric system of FIG. 6A.

FIG. 5A schematically illustrates a cross-sectional view of an example thermoelectric system 100, and FIG. 5B schematically illustrates a cross-sectional view of a portion of the example thermoelectric system 100 of FIG. 5A. FIG. 6A schematically illustrates another example thermoelectric system 100, and FIG. 6B schematically illustrates a perspective cross-sectional view of the example thermoelectric system of FIG. 6A. FIGS. 5A-5B and 6A-6B schematically illustrate example thermoelectric systems 100 (e.g., cartridge units) each comprising multiple thermoelectric assemblies 10 with alternating n-type and p-type thermoelectric elements 30, 40 in a stacked configuration and sealed in an inert gas. The thermoelectric systems 100 can be placed in an enclosure where low temperature (LT) fluid runs through the center conduits 102 (e.g., tubes) and high temperature (HT) gas flows through the round fins 51 concentric with the center conduits 102. A thermoelectric system 100 can comprise a single thermoelectric assembly 10 which itself comprises a plurality of shunts 20, a plurality of thermoelectric elements 30, 40, and a plurality of heat exchangers 50 (e.g., built out of a single sleeve instead of multiple thermoelectric assemblies 10). A thermoelectric system 100 can comprise multiple thermoelectric assemblies 10 (e.g., 2, 3, 4, 5, 6, 7, 8, 9, 10, 11, 12, 13, 14, or 15 or more thermoelectric assemblies 10) which are combined together, adjacent to one another, on the same first fluid conduit to form the thermoelectric system 100. The thermoelectric system 100 can have dimensions configured to fit within the particular application (e.g., a length of 148 mm and an outer diameter of 30 mm).

The thermoelectric system 100 comprises at least a portion of a tubular or generally tubular fluid conduit 102 configured to allow a first fluid to flow through the at least a portion of the tubular or generally tubular fluid conduit 102 along or generally along a direction 104. The thermoelectric system 100 further comprises a plurality of thermoelectric assemblies 10 (e.g., at least a first thermoelectric assembly 10a and a second thermoelectric assembly 10b). Each of the thermoelectric assemblies 10 is in thermal communication with the conduit 102 and comprises at least one first shunt 20 (e.g., at least one shunt 20 as disclosed above, which can be substantially thermally isolated from the conduit 102) extending around the conduit 102, at least one first thermoelectric element 30 in thermal communication and in electrical communication with the at least one shunt 20, and at least one second thermoelectric element 40 in thermal communication and in electrical communication with the at least one first shunt 20. At least a portion of the at least one first shunt 20 is sandwiched between the at least one first thermoelectric element 30 and the at least one second thermoelectric element 40. The at least one first thermoelectric element 30 and the at least one second thermoelectric element 40 are electrically isolated from the conduit 102. Each of the thermoelectric assemblies 10 further comprises at least one heat exchanger 50 (e.g., a plurality of heat exchangers 50) in thermal communication with the at least one first shunt 20 and in thermal communication with a second fluid.

The thermoelectric system 100 further comprises at least one second shunt 110 extending around the conduit 102 and in thermal communication with the conduit 102. At least a portion of the at least one second shunt 110 is electrically isolated from the conduit 102 and is in thermal communication with, in electrical communication with, and sandwiched between two thermoelectric assemblies 10 of the plurality of thermoelectric assemblies 10 (e.g., in thermal communication with, in electrical communication with, and sandwiched between the at least one second thermoelectric element 40 of the first thermoelectric assembly 10a and the at least one first thermoelectric element 30 of the second thermoelectric assembly 10b). At least some of the plurality of thermoelectric assemblies 10 and at least some of the plurality of second shunts 110 are in series electrical communication with one another. For example, the first thermoelectric assembly 10a, the at least one second shunt 110, and the second thermoelectric assembly 10b are in series electrical communication with one another such that the thermoelectric system 100 has an electrical current flow path 104 through the at least one first thermoelectric element 30 of the first thermoelectric assembly 10a, the at least one first shunt 20 of the first thermoelectric assembly 10a, the at least one second thermoelectric element of the first thermoelectric assembly 10a, the at least one second shunt 110, the at least one first thermoelectric element 30 of the second thermoelectric assembly 10b, the at least one first shunt 20 of the second thermoelectric assembly 10b, and the at least one second thermoelectric element 40 of the second thermoelectric assembly 10b.

Flow of at least one of the first fluid and the second fluid through the thermoelectric system 100 can be steady (e.g., continuous flow) or can be pulsed. Pulsed flow can provide certain transient effects that can be beneficial to system performance. Control schemes, including electrical, can be optimally designed around the pulsed flow.

The thermoelectric assemblies 10 of the thermoelectric system 100 can include one or more thermoelectric assemblies 10 having one or more of the various configurations, features, materials, orientations, or other attributes in the description above made with regard to the example thermoelectric assembly configurations of FIGS. 1-4. For example, the at least one first thermoelectric element can have a first doping type (e.g., n-type or p-type) and the at least one second thermoelectric element can have a second doping type (e.g., p-type or n-type) different from the first doping type. For other examples, the at least one heat exchanger 50 (e.g., the plurality of heat exchangers 50) of each thermoelectric assembly 10 can extend around the conduit 102 (e.g., perpendicularly or generally perpendicularly to the direction 104), the at least one first shunt 20 of each thermoelectric assembly 10 can be responsive to increases of temperature by increasing a compressive force in an inward (e.g., radial) direction applied to the conduit 102, and each of the thermoelectric assemblies 10 (e.g., the first thermoelectric assembly 10a and the second thermoelectric assembly 10b) can comprise at least one electrically insulating layer electrically isolating the thermoelectric assembly 10 from the conduit 102 (and thereby electrically isolating the at least one first thermoelectric element 30 from the conduit 102 and electrically isolating the at least one second thermoelectric element 40 from the conduit 102).

The conduit 102 can comprise a thermally conductive tube (e.g., copper, aluminum). The conduit 102 can further comprise one or more stainless steel tube inserts that can be mechanically coupled to other stainless steel tubing to provide fluid flow to the conduit 102. The conduit 102 can have an elongated shape extending in the direction. The conduit 102 can comprise one or more structures configured to facilitate heat transfer between the first fluid flowing through the conduit 102 and the conduit 102. For example, the conduit 102 can comprise protrusions or inserts extending from the inner wall of the conduit 102 towards the center of the conduit 102 to alter or redirect the flow of the first fluid or to increase the surface area of the conduit 102 exposed to the first fluid. Examples of such structures include, but are not limited to, wire coils, twisted tapes, "dog ears," Additional methods and structures of internal duct enhancement known in the art can also be used.

The at least one second shunt 110 can comprise one or more electrically and thermally conductive materials (e.g., copper, aluminum). The at least one second shunt 110 can further comprise one or more electrically insulating (e.g., dielectric) materials or layers configured to provide electrical isolation between components of the thermoelectric system 100 (e.g., to electrically isolate the at least one second shunt 110 from the conduit 102). The at least one second shunt 110 can comprise a single unitary shunt 110, or multiple second shunts 110 or second shunt sections that are coupled together. For example, the at least one second shunt 110 can comprise a plurality of sections each having a shape of a sector of an annulus, but other shapes (e.g., pie-shaped, wedge-shaped, trapezoidal, rectangular, polygonal, irregular) can also be used. In certain configurations in which the at least one second shunt 110 comprises a plurality of pie-wedge-shaped sections, the sections can comprise an electrically insulating layer along their edges to provide electrical isolation from one pie-wedge-shaped section to another, which can advantageously help to increase the voltage and to reduce the current for the thermoelectric system 100. The at least one second shunt 110 can be formed wholly or partially by machining, casting, forging, or other fabrication techniques. The materials of the at least one second shunt 110 can be selected to provide the desired thermal expansion or contraction in response to changes of temperature.

The at least one second shunt 110 can have a hole 112 (e.g., at the center of the second shunt 110) that is configured to have the conduit 102 extend through the hole 112. For example, the direction 104 of fluid flow through the conduit 102 can be along or generally along an axis of the conduit 102, and the second shunt 110 can be configured to encircle the conduit 110 perpendicularly or generally perpendicularly to the axis (e.g., in a plane perpendicular to the axis), as schematically illustrated by FIG. 5B. The second shunt 110 can be annular and unitary, and it can be configured to extend around a tubular or generally tubular fluid conduit 102 having a generally circular cross-section in a plane perpendicular to the fluid flow through the conduit 102. In such a configuration, the hole 112 can be generally circular. For other configurations, the hole 112, the outer perimeter of the cross-section of the conduit 102, and the outer perimeter of the second shunt 110 can have other shapes (e.g., oval, rectangular, square, polygonal, irregular). While the hole 112 and the outer perimeter of the second shunt 110 can have the same general shape, in other configurations the shapes of the hole 112 and the outer perimeter of the second shunt 110 can be different from one another.

The at least one second shunt 110 can comprise an outer section 114 (e.g., an outer annular plate) and an inner section 116 in thermal communication with the outer section 114 and with the conduit 102. The inner section 116 can extend along or generally along the conduit 102 (e.g., in an axial direction). The outer section 114 and the inner section 116 can be portions of a single unitary piece, or can be separate pieces which are coupled together to form the second shunt 110. For example, the outer section 114 can comprise a unitary circular plate and the inner section 116 can comprise a unitary ring surrounding the hole 112 which is configured to allow the conduit 102 to extend through the hole 112. The outer section 114 of the at least one second shunt 110 can comprise a plurality of plates spaced from one another (e.g., by gaps or slots or by an electrically insulating material), with each plate in thermal communication and in electrical communication with the thermoelectric elements 30, 40 of the adjacent thermoelectric assemblies.

As shown in FIG. 5B, the outer section 114 and the inner section 116 can give the second shunt 110 a "T"-shaped cross-section in a plane parallel to the direction 104 of fluid flow through the conduit, while in other configurations, the second shunt 110 can have other shapes (e.g., "I"-shaped). While the inner section 116 shown in FIG. 5B extends in two directions generally parallel to the fluid flow direction 104, in other configurations, the inner section 116 can extend in only one such direction along or generally along the conduit, can extend in one or more directions that are not parallel to the fluid flow direction (e.g., perpendicular or generally perpendicular to the fluid flow direction), or can not extend along or generally along the conduit beyond the outer section 114.

The at least one second shunt 110 can be configured to be in thermal communication with the conduit 102 such that there is an appreciable thermal path directly from the conduit 102 to the at least one second shunt 110 (e.g., the at least one second shunt 110 is in direct thermal communication with the conduit 102). For example, the thermoelectric system 100 can further comprise a thermally conductive interface material between the inner section 116 of the at least one second shunt 110 and the conduit 112. This interface material can be electrically insulating such that the at least one second shunt 110 is electrically isolated from the conduit 112. This interface material can be a soft or mechanically compliant material (e.g., thermally conductive grease) such that the at least one second shunt 110 (e.g., at least some of the plurality of second shunts 110) is configured to slide along the conduit 102 and to remain in thermal communication with the conduit 102 in response to thermal expansion or contraction within the thermoelectric system 100. Since the thermoelectric assemblies 10 can be spaced from the conduit 102 as described above, and can include compliant elements 54 between the thermoelectric assemblies 10, such configurations can reduce the amount of shearing stress experienced by the thermoelectric elements 30, 40 due to motion among portions of the thermoelectric system 100 (e.g., motion comprising thermal expansion or contraction within the thermoelectric system 100 or motion caused by mechanical shocks to the thermoelectric system 100). Alternatively, the at least one second shunt 110 can be directly coupled to the conduit 102 in configurations in which the thermal expansion of the thermoelectric system 100 is expected to be small. For example, a bond can be formed between the at least one second shunt 110 and the conduit 102 with the at least one second shunt 110 electrically isolated from the conduit 102 (e.g., by a dielectric layer).

The thermoelectric system 100 can comprise an interface material between the first thermoelectric assembly 10a and the at least one second shunt 110 and between the second thermoelectric assembly 10b and the at least one second shunt 110. This interface material can be a soft or mechanically compliant material (e.g., thermally and electrically conductive grease) such that the at least one second shunt 110 (e.g., at least some of the plurality of second shunts 110) are configured to slide between the thermoelectric elements 30, 40, while remaining in thermal and electrical communication with the thermoelectric elements 30, 40, in response to motion among portions of the thermoelectric system 100 (e.g., motion comprising thermal expansion or contraction within the thermoelectric system 100 or motion caused by mechanical shocks to the thermoelectric system 100). Such configurations can reduce the amount of shearing stress experienced by the thermoelectric elements 30, 40 due to thermal expansion or contraction within the thermoelectric system 100.

The outer section 114 can have a first coefficient of thermal expansion and the inner section 116 can have a second coefficient of thermal expansion that is greater than the first coefficient of thermal expansion (e.g., for configurations in which the at least one second shunt 110 is the cold side shunt). In response to temperature increases of the at least one second shunt 110, the outer section 114 (e.g., outer annular plate) will expand and increase in diameter and the inner section 116 (e.g., inner ring) will expand towards the conduit 102. By having the coefficient of thermal expansion of the inner section 116 greater than the coefficient of thermal expansion of the outer section 114, movement of the thermoelectric elements 30, 40 in a inwardly or outwardly direction from the conduit 102 can advantageously be minimized. In addition, the at least one second shunt 110 can be responsive to increases of temperature by increasing a compressive force in an inward (e.g., radial) direction applied to the conduit 102. In other configurations, the coefficient of thermal expansion of the outer section 114 can be greater than the coefficient of thermal expansion of the inner section 116 (e.g., for configurations in which the at least one second shunt 110 is the hot side shunt).

As schematically illustrated by FIG. 5B, each thermoelectric assembly 10 (e.g., each of the first thermoelectric assembly 10a and the second thermoelectric assembly 10b) can comprise at least one electrically insulating layer 118 electrically isolating the at least one first shunt 20 from the at least one heat exchanger 50, and the thermoelectric system 100 can comprise at least one electrically insulating layer 119 between the conduit 102 and the at least one first shunt 20 and the at least one second shunt 110. For example, the at least one electrically insulating layer 119 can be part of the at least one second shunt 50, part of the conduit 102, or a component sandwiched between the at least one second shunt 50 and the conduit 102. The at least one electrically insulating layers 118, 119 can each comprise one or more dielectric materials (e.g., aluminum oxide, nitrides, cuprites, aluminates) in the form of a separate component or as a coating formed on at least one of the surfaces of the at least one first shunt 20, the at least one second shunt 50, the conduit 102, and the at least one second shunt 110. The at least one electrically insulating layers 118, 119 are configured to prevent short circuits which would cancel the desired behavior of the thermoelectric elements 30, 40.

The plurality of thermoelectric assemblies 10 and the plurality of second shunts 110 can alternate with one another along the fluid flow direction 104, as schematically illustrated by FIG. 5B. In addition, the electrical current flow path through the plurality of thermoelectric assemblies 10 and the plurality of second shunts 110 can be in a direction along or generally along the conduit 102 (e.g., from a thermoelectric assembly 10 at one portion of the conduit 102 to a thermoelectric assembly 10 at another portion of the conduit 102). The electrical current flow path can be generally parallel to the fluid flow direction 104 of the first fluid through the conduit 102, as schematically illustrated by FIG. 5B (e.g., parallel or generally parallel to the axis of the conduit 102 either in the same direction as the fluid flow direction 104 or opposite or generally opposite to the fluid flow direction 104). The electrical current flow path through any individual component of the thermoelectric system 100 (e.g., through any one first shunt 20, any one second shunt 110, any one first thermoelectric element 30, or any one second thermoelectric element 40) can be in a direction non-parallel to the fluid flow direction 104 while the overall electrical current flow path is along or generally along the conduit 102. For example, the electrical current flow path through the second shunts 110 can be non-parallel to the fluid flow direction 104, but overall through the thermoelectric system 100, the electrical current flow path can be in a spiral or stepwise pattern along or generally along the conduit 102.

As schematically illustrated by FIG. 5B, a first thermal path 120a between the first fluid and the second fluid can extend through the at least one heat exchanger 50, the at least one first shunt 20, the at least one first thermoelectric element 30, the at least one second shunt 110, and the conduit 102, and a second thermal path 120b between the first fluid and the second fluid can extend through the at least one heat exchanger 50, the at least one first shunt 20, the at least one second thermoelectric element 30, the at least one second shunt 110, and the conduit 102. Depending on the relative temperatures of the first fluid and the second fluid, the heat flow along or generally along the first thermal path 120a and the second thermal path 120b can be either from the first fluid to the second fluid or from the second fluid to the first fluid.

As described above, the at least one heat exchanger 50 of the first thermoelectric assembly 10a and the at least one heat exchanger 50 of the second thermoelectric assembly 10b can be mechanically coupled to one another. For example, FIGS. 5A-5B schematically illustrate the plurality of heat exchangers 50 of adjacent thermoelectric assemblies 10 can be mechanically coupled to one another, with at least one heat exchangers 50 of the first thermoelectric assembly 10a and the second thermoelectric assembly 10b being compliant (e.g., flexible and deforming elastically) in response to motion among portions of the thermoelectric system 100 (e.g., motion comprising thermal expansion or contraction within the thermoelectric system 100 or motion caused by mechanical shocks to the thermoelectric system 100). As described more fully below with regard to FIGS. 11F-11I, the thermoelectric system 100 can also comprise one or more electrically insulating layers (e.g., between the at least one heat exchanger 50 of the first thermoelectric assembly 10a and the at least one heat exchanger 50 of the adjacent second thermoelectric assembly 10b) that electrically isolates the heat exchangers 50 of adjacent thermoelectric assemblies 10 from one another. For example, the at least one electrically insulating layer can electrically isolate the electrical current flow path from the at least one heat exchanger 50 of the first thermoelectric assembly 10a and from the second thermoelectric assembly 10b (e.g., the at least one electrically insulating layer 118 shown in FIG. 5B). For another example, the at least one electrically insulating layer can be on the end fins 51 of each thermoelectric assembly 10. Such a positioning places the at least one electrically insulating layer out of the heat flow path between the heat exchanger 50 and the conduit 102, thereby reducing the thermal resistance of the heat flow path. However, such a positioning can create an electric potential in the second fluid (e.g., gas) that might or might not be desirable.

FIGS. 6A and 6B schematically illustrate an example thermoelectric system 100 comprising at least one compliant element 54 (e.g., an annular bellows assembly extending around the conduit 102), with the at least one compliant element 54 between and mechanically coupled to the heat exchangers 50 of adjacent thermoelectric assemblies 10 (e.g., the at least one heat exchanger 50 of the first thermoelectric assembly 10a and the at least one heat exchanger 50 of the second thermoelectric assembly 10b). The at least one compliant element can be compatible with the structures shown and described below with regard to FIGS. 11B-11I.

Figure 7A:
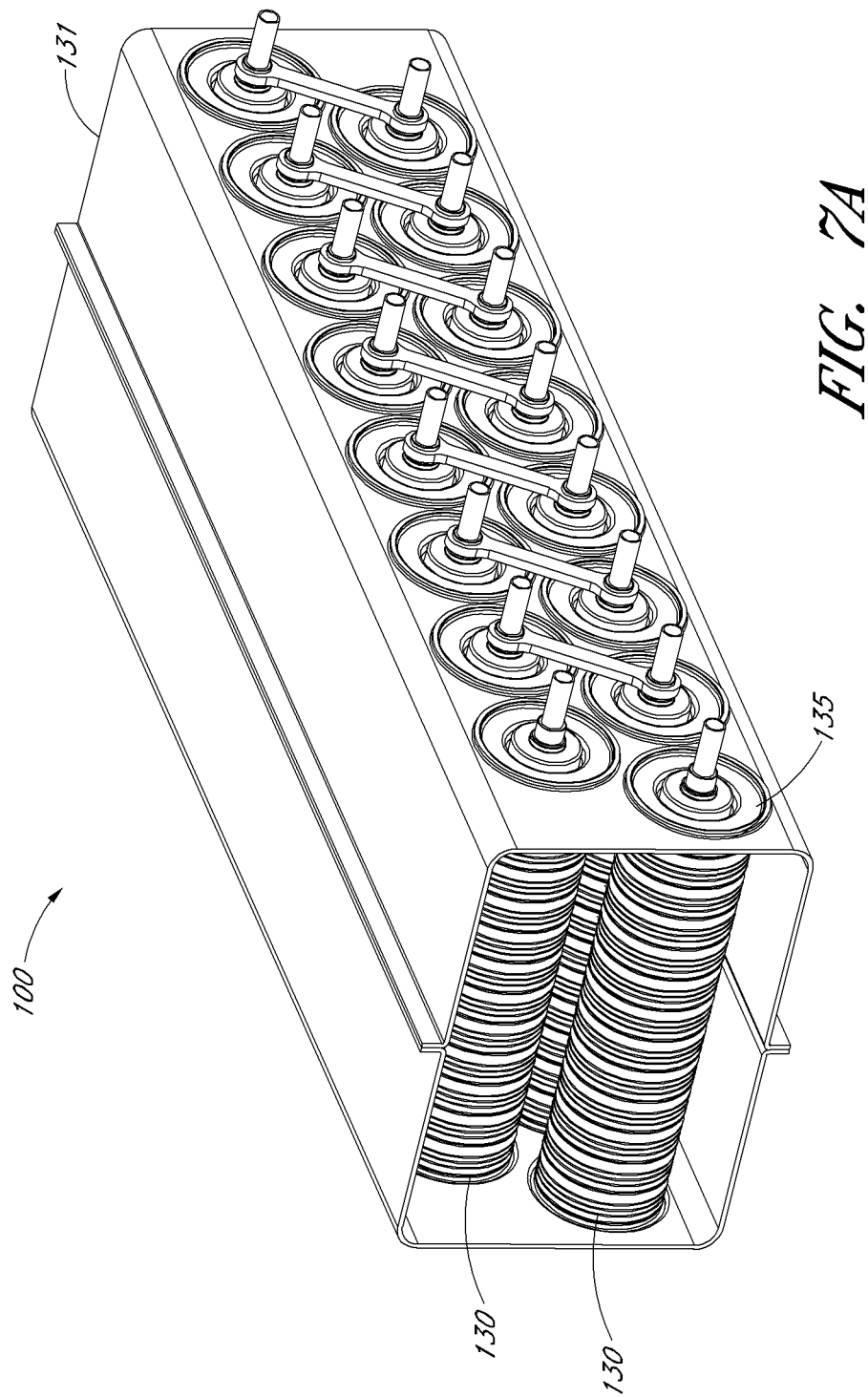
FIG. 7A schematically illustrates an example plurality of cartridges compatible with the example thermoelectric assemblies and the example thermoelectric system of FIGS. 1-3, 5, and 6 within a housing.
Figure 7B:
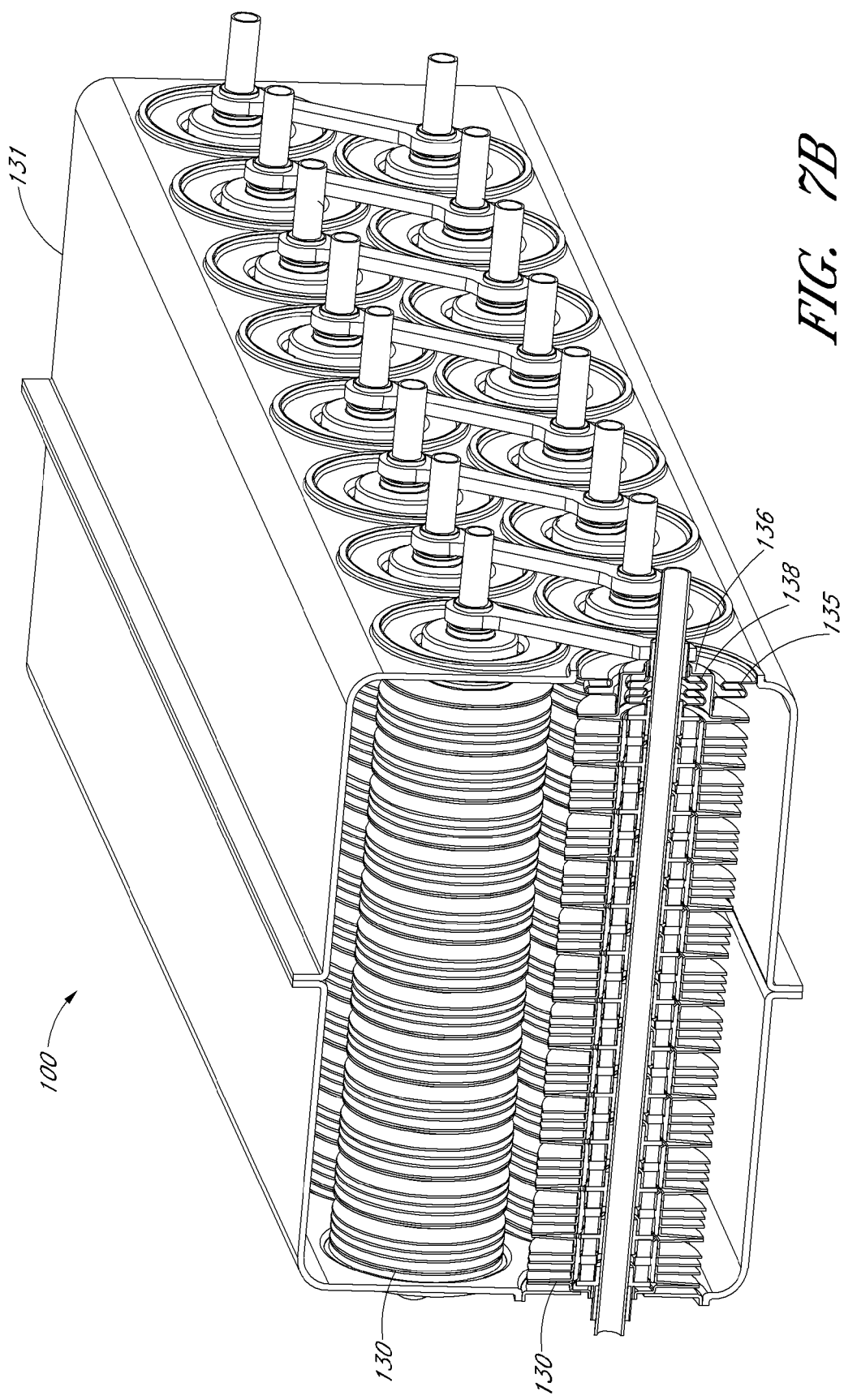
FIG. 7B schematically illustrates the example plurality of cartridges of FIG. 7A with one of the cartridges shown in a cross-sectional view.
Figure 7C:
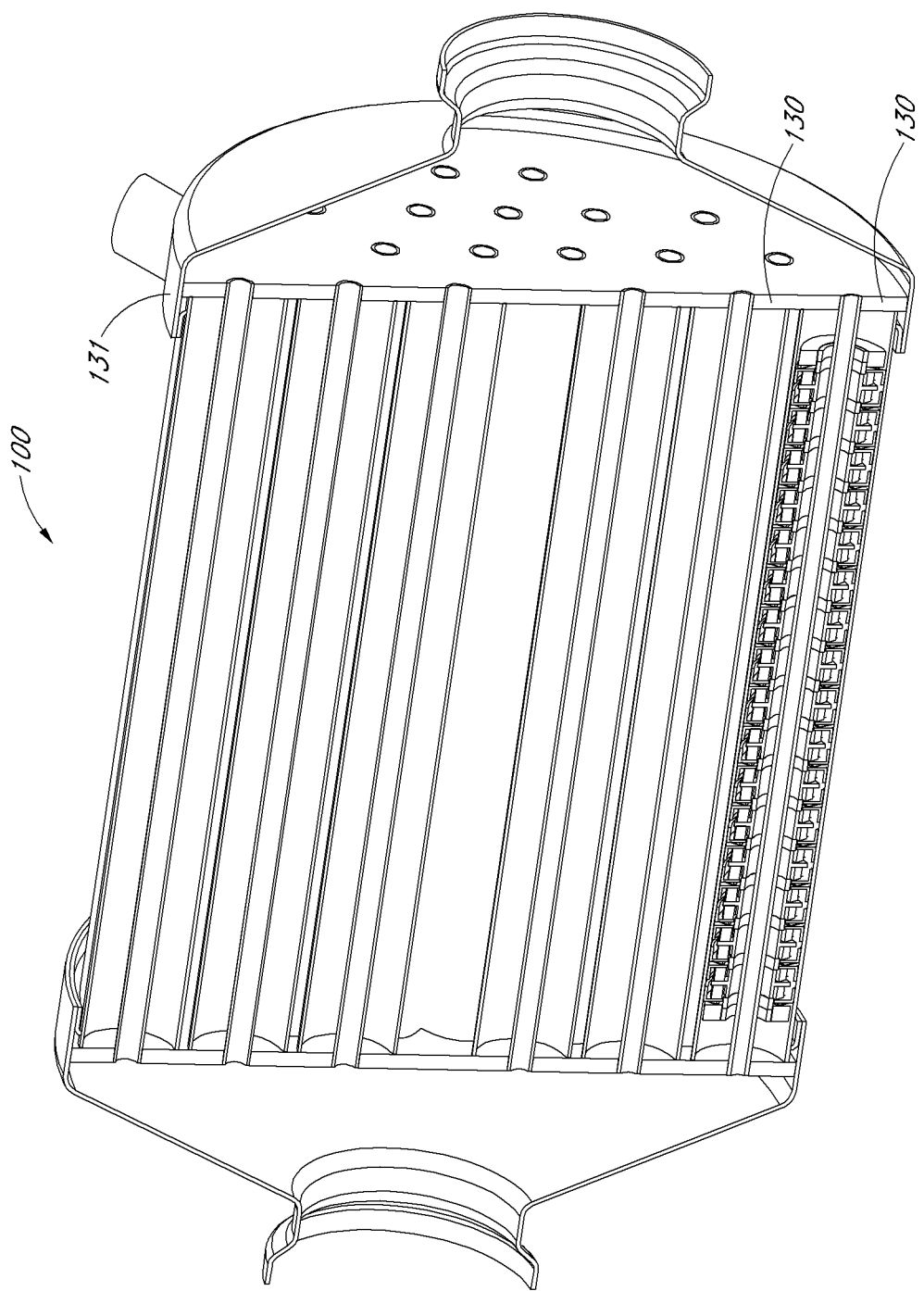
FIG. 7C schematically illustrates an example plurality of cartridges compatible with the example thermoelectric assemblies and the example thermoelectric system of FIG. 4 within a housing.
Figure 7D:
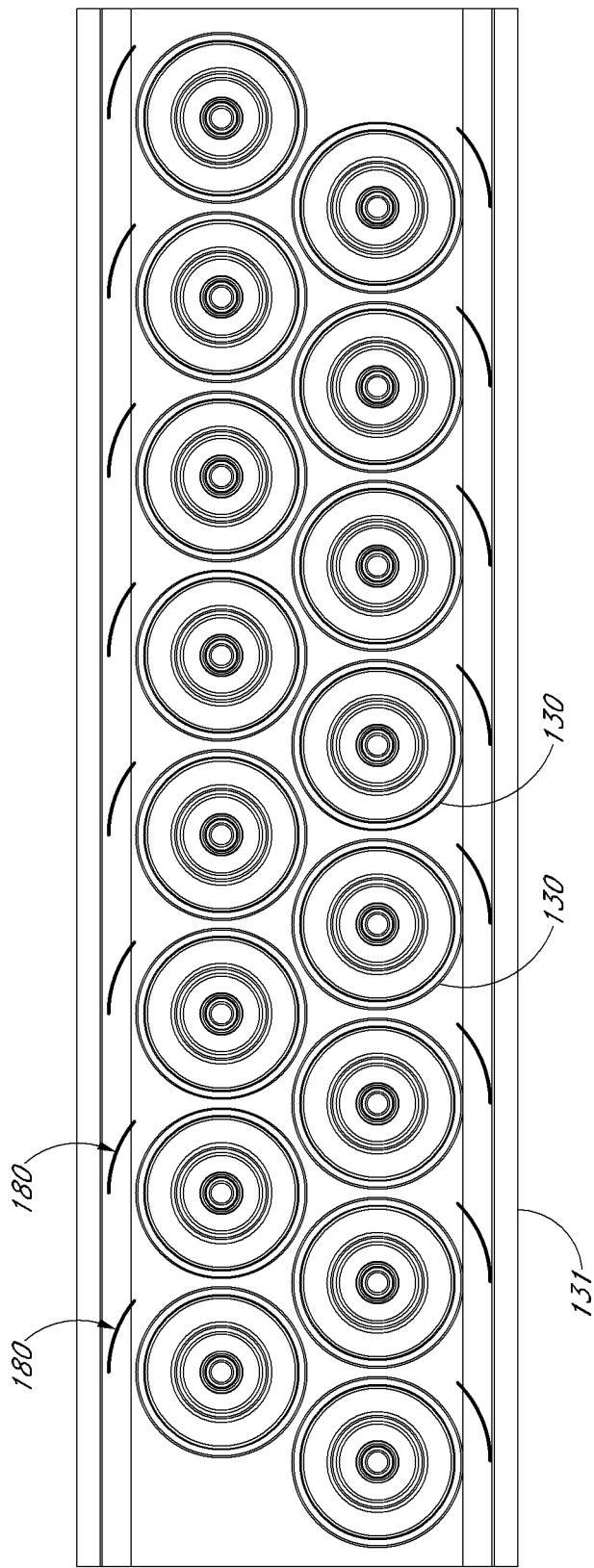
FIGS. 7D-7G schematically illustrate an end view of an example plurality of cartridges with a plurality of baffles in various configurations.
Figure 7E:
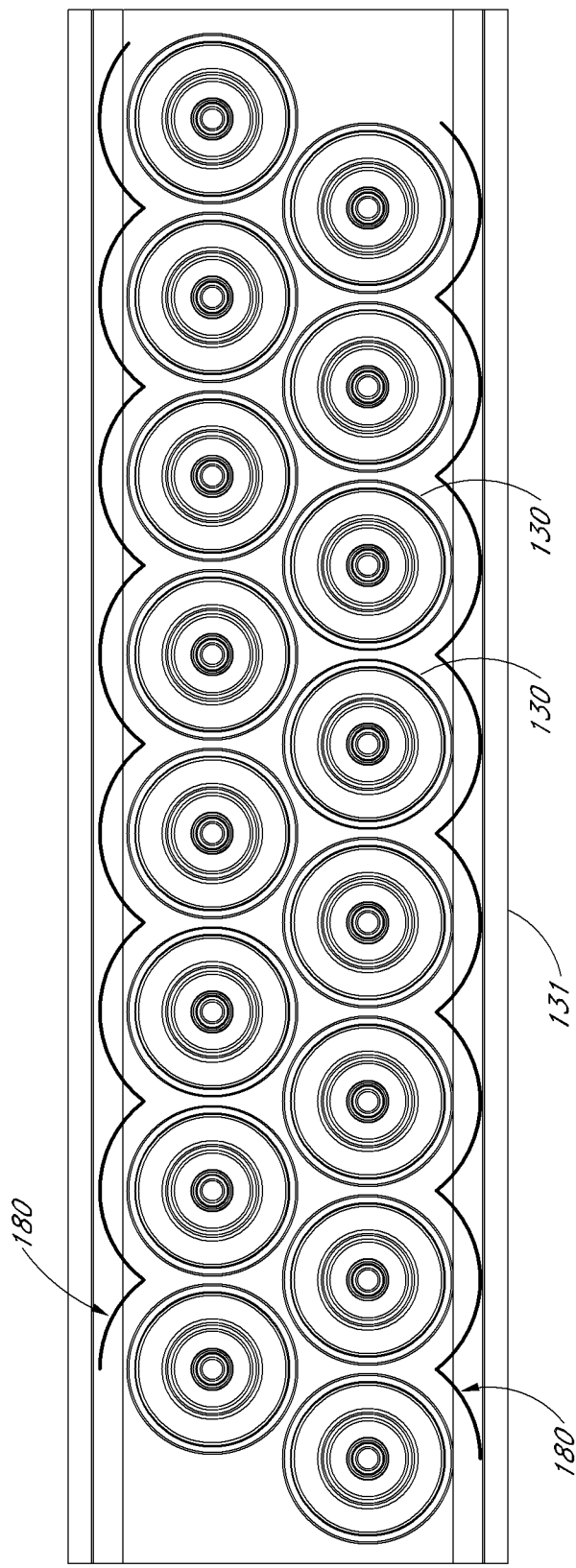
Figure 7F:
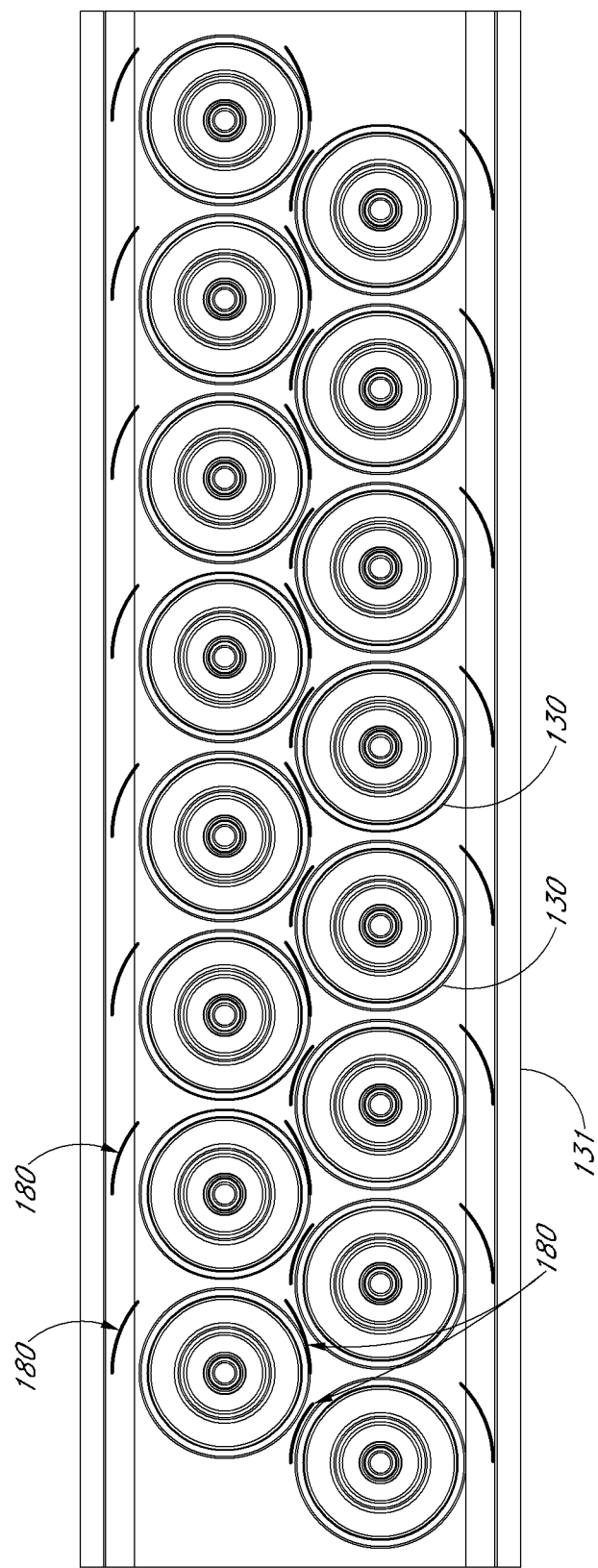
Figure 7G:
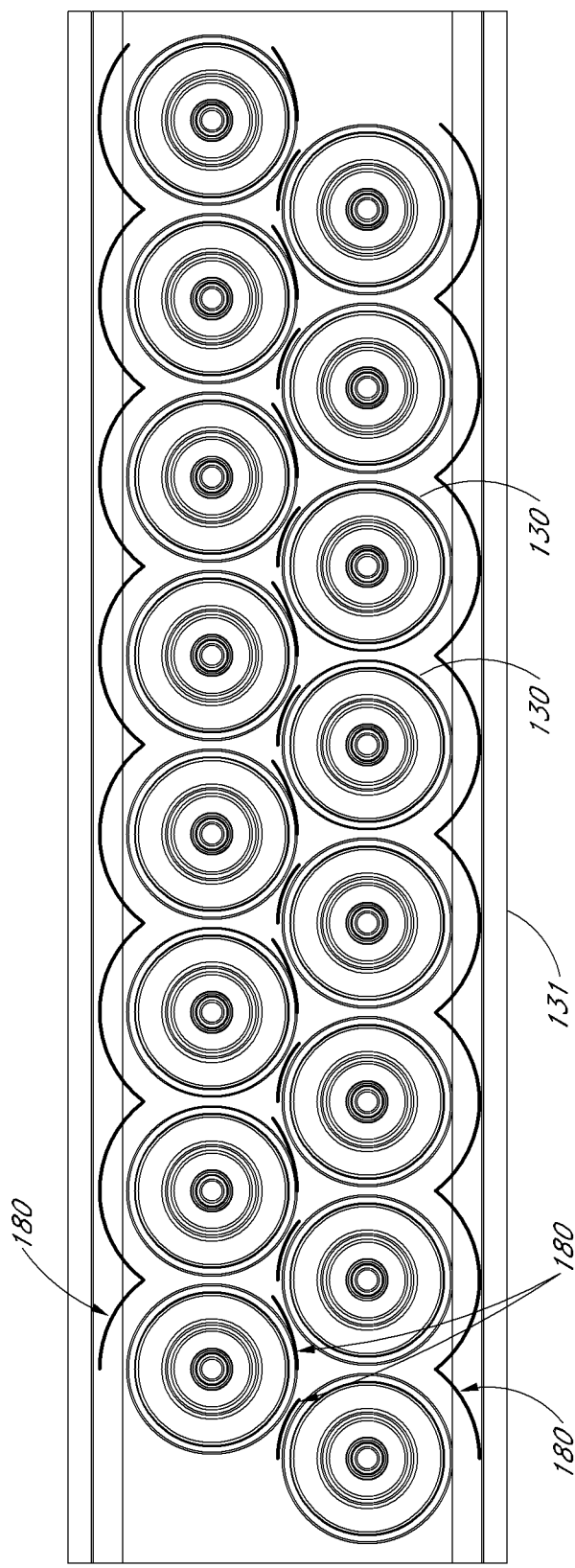

The thermoelectric system 100 can comprise a plurality of cartridges 130, each of which comprises a plurality of thermoelectric assemblies 10 as described herein. The cartridges 130 can be enclosed in a housing 131 that contains the second fluid flowing in thermal communication with the heat exchangers 50 of the cartridges 130. For example, FIGS. 7A and 7B schematically illustrate an example plurality of cartridges 130 compatible with the example thermoelectric assemblies 10 and the example thermoelectric system 100 of FIGS. 1-3, 5, and 6 within a housing 131, and FIG. 7C schematically illustrated an example plurality of cartridges 130 compatible with the example thermoelectric assemblies 10 and the example thermoelectric system 100 of FIG. 4 within a housing 131. The housing 131 can be configured to direct the second fluid to flow across the cartridges 130 in a direction perpendicular or generally perpendicular to the cartridges 130, parallel or generally parallel to the cartridges 130, or at a non-zero angle relative to the cartridges 130. For configurations having fins 51, the housing can be configured to direct the second fluid to flow along or generally along the fins 51 of the cartridges 130 (e.g., as shown in FIGS. 7A and 7B).

The cartridges 130 can be assembled together such that the flows of the first fluid through some of the fluid conduits 102 are parallel or generally parallel to one another (e.g., parallel flow), anti-parallel or in opposite or generally opposite but parallel or generally parallel directions from one another (e.g., counterflow), in perpendicular or generally perpendicular directions from one another (e.g., cross flow), or in other angles and directions relative to one another. Furthermore, the cartridges 130 can have various orientations relative to one another and relative to the flow of the second fluid (e.g., rotated in at least one of the x, y, or z directions) to more advantageously take advantage of packaging space in regards to pressure drop and heat transfer. Cartridges 130 can be laid out in in-line configurations, as well as staggered configurations of different spacing.

The thermoelectric system 100 can comprise a plurality of baffles 180 that are configured to improve flow uniformity and to improve heat transfer between the second fluid and the cartridges 130. For example, as schematically illustrated by FIGS. 7D-7G, various configurations of the baffles 180 can redirect flow of the second fluid around the cartridges 130. The baffles 180 can also break up the boundary layer to increase the heat transfer. Additional baffle methods and configurations known in the art of "shell and tube" heat exchangers may also be used with the cartridges 130.

As schematically illustrated by FIGS. 5A and 6A, the thermoelectric system 100 can comprise a first cap 132 extending around the conduit 102 at a first end of the thermoelectric system 100 and a second cap 134 extending around the conduit 102 at a second end of the thermoelectric system 100. The first cap 132 and the second cap 134 can be configured to enclose the thermoelectric elements 30, 40 in an inert gas atmosphere. For example, in configurations in which the thermoelectric assemblies 10 comprise at least one compliant element 54 between and mechanically coupled to the heat exchangers 50 of adjacent thermoelectric assemblies 10, the first cap 132, the second cap 134, the plurality of heat exchangers 50, and the plurality of compliant elements 54 can form at least a portion of an enclosure containing the first thermoelectric elements and the second thermoelectric elements. For example, the enclosure can hermetically seal the first thermoelectric elements and the second thermoelectric elements within the enclosure. The first cap 132 and the second cap 134 can comprise at least one mechanically compliant support 135 (e.g., a bellows) configured to be mechanically coupled to the housing 131 (e.g., as shown in FIG. 7A) and to deform in response to thermal expansion or contraction within the thermoelectric system 100.

Figure 8A:
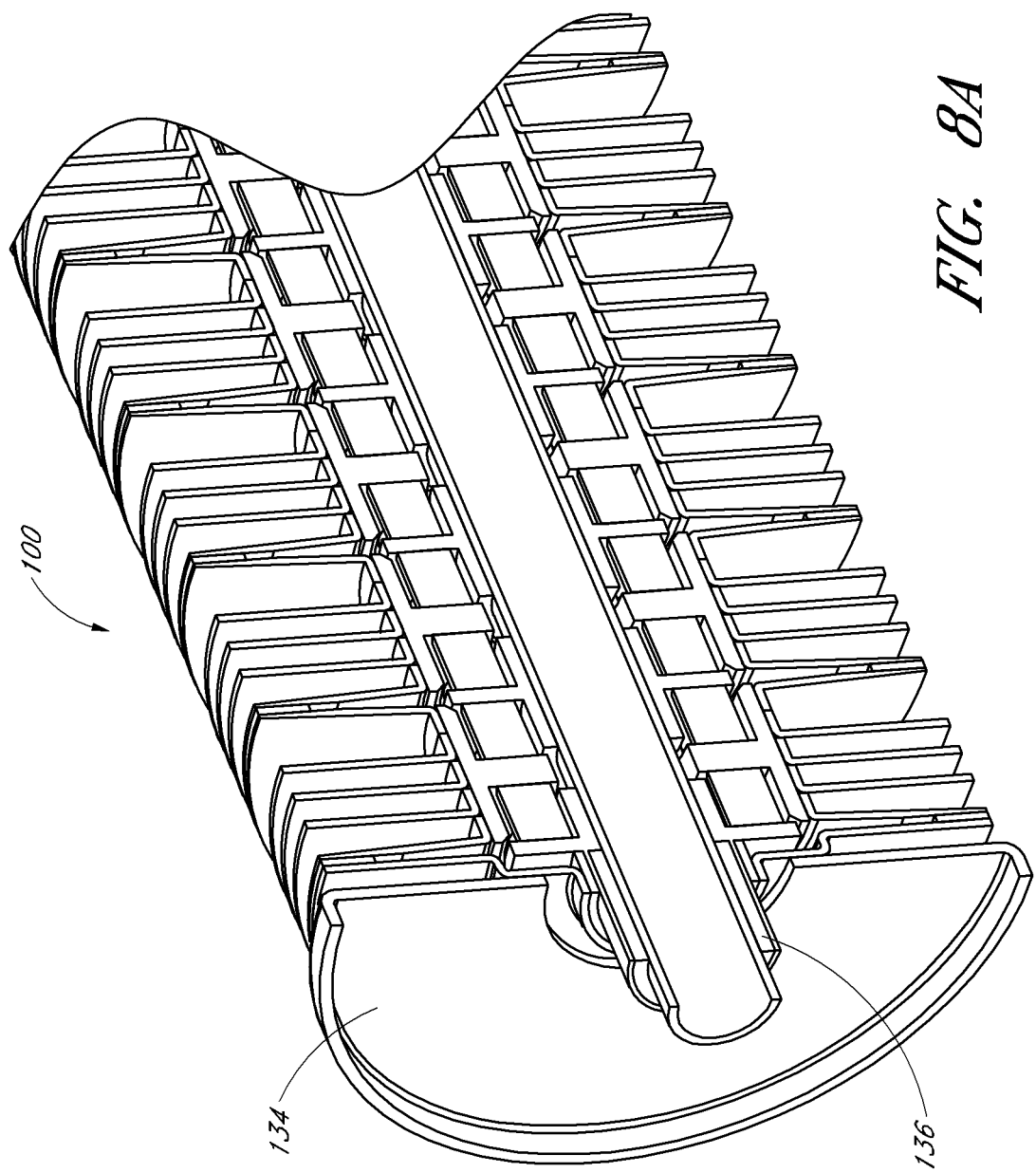
FIG. 8A schematically illustrates at least one example electrical conduit comprising a tubular portion coaxial with the conduit.

As schematically illustrated by FIGS. 7A and 8A, the thermoelectric system 100 can comprise at least one electrical conduit 136 configured to provide electrical communication with the thermoelectric system 100 (e.g., the plurality of thermoelectric assemblies 10). For example, as shown in FIGS. 5A, 6A, 6B, 7A, and 8A, the at least one electrical conduit can extend through at least one of the first cap 132 and the second cap 134 in a direction generally parallel to the fluid flow direction 104. The at least one electrical conduit 136 can comprise a tubular or generally tubular portion coaxial with the conduit 102, as schematically illustrated by FIG. 8A. The at least one electrical conduit 136 can comprise a feedthrough portion offset from the conduit 102, as schematically illustrated by FIGS. 6A-6B and the insert of FIG. 8A. As schematically illustrated by the inset of FIG. 7A, at least some of the electrical conduits 136 of the cartridges 130 can be in series electrical communication with one another such that the current flow path through the thermoelectric system 100 flows serially through two or more cartridges 130.

The at least one electrical conduit 136 can be electrically coupled to the at least one second shunt 110 (e.g., the cold shunt in configurations in which the fluid flowing through the conduit 102 is colder than the fluid flowing across the heat exchangers 50), or to the at least one first shunt 20 (e.g., the cold shunt in configurations in which the fluid flowing across the heat exchangers 50 is colder than the fluid flowing through the conduit 102). Such configurations can advantageously reduce or prevent heat from transferring along the electrical power line, which could reduce efficiency. For example, two electrical conduits 136 can be directly connected to the first and last cold shunts of the thermoelectric system 100.

The thermoelectric elements 30, 40 can be physically attached (e.g., brazed or soldered) to both the at least one first shunt 20 and to the at least one second shunt 110. In configurations in which one of these junctions is not brazed or soldered, the thermoelectric system 100 can comprise at least one compliant member 138 (e.g., at least one spring) between the plurality of thermoelectric assemblies 10 (e.g., the first thermoelectric assembly 10a and the second thermoelectric assembly 10b) and at least one of the first cap 132 and the second cap 134, as schematically illustrated by FIGS. 5A, 6B, 7A, and 8B. The at least one compliant member 138 can generate a compressive force which presses the plurality of thermoelectric assemblies 10 and the plurality of second shunts 110 (e.g., the first thermoelectric assembly 10a, the at least one second shunt 110, and the second thermoelectric assembly 10b) together in a direction generally parallel to the fluid flow direction 104. An interface material (e.g., thermally conductive and electrically conductive foil) can be inserted to improve the thermal and electrical communication between the thermoelectric elements 30, 40 and the shunts 20, 110. The at least one compliant member 138 can allow the thermoelectric elements 30, 40 to stay in constant compression, which is a preferred state for thermoelectric materials. As schematically illustrated by FIG. 8B, a bellows (e.g., copper) can serve as both the at least one electrical conduit 136 and the at least one compliant member 138 by compensating for thermal expansion and maintaining a constant force on the thermoelectric elements 30, 40 while serving as one of two electrical conduits 136 to the thermoelectric system 100.

Figure 8C:
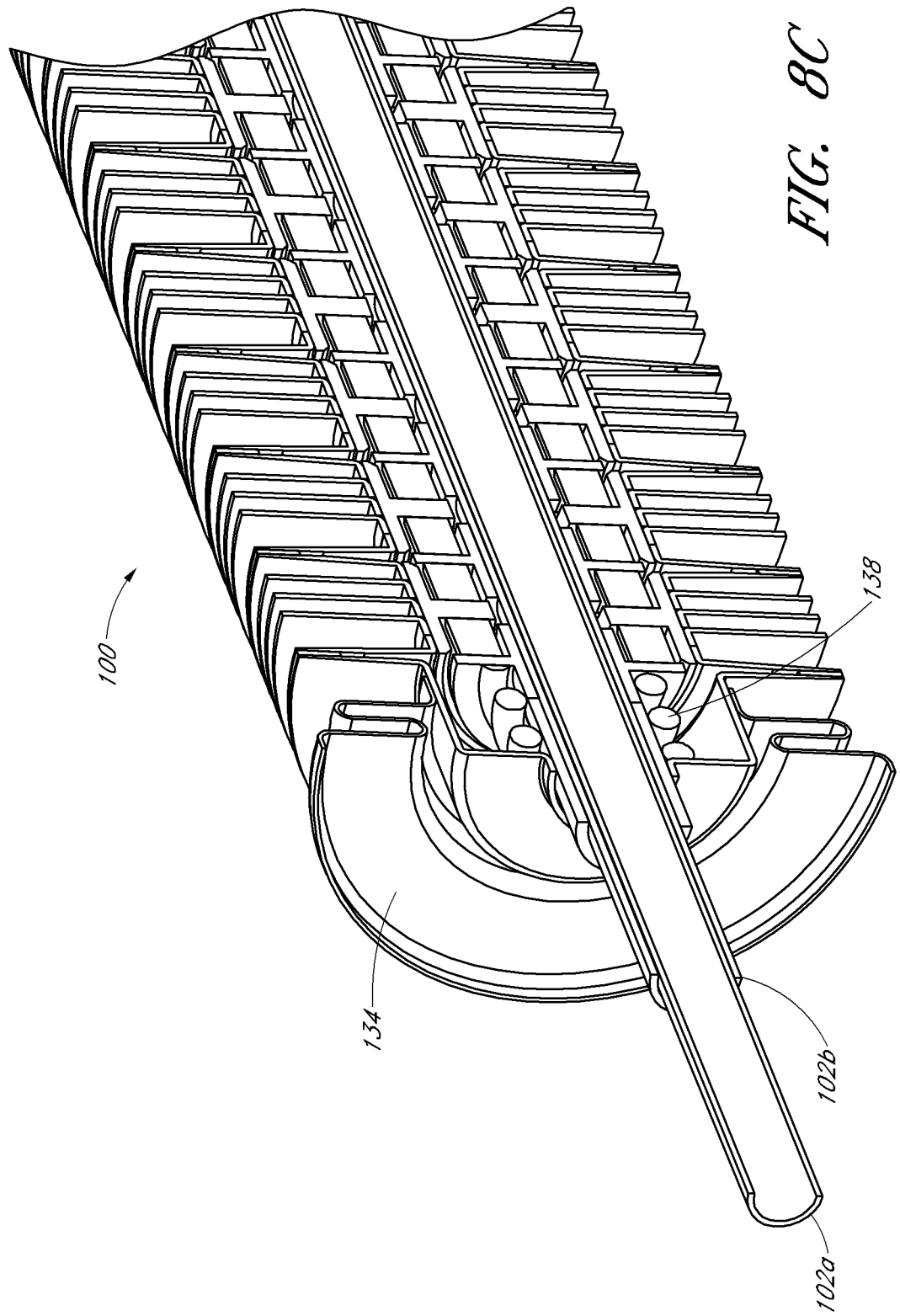
FIGS. 8C and 8D schematically illustrate an example thermoelectric system comprising a fluid conduit having an inner tube and an outer tube in fluidic communication with one another.
Figure 8D:
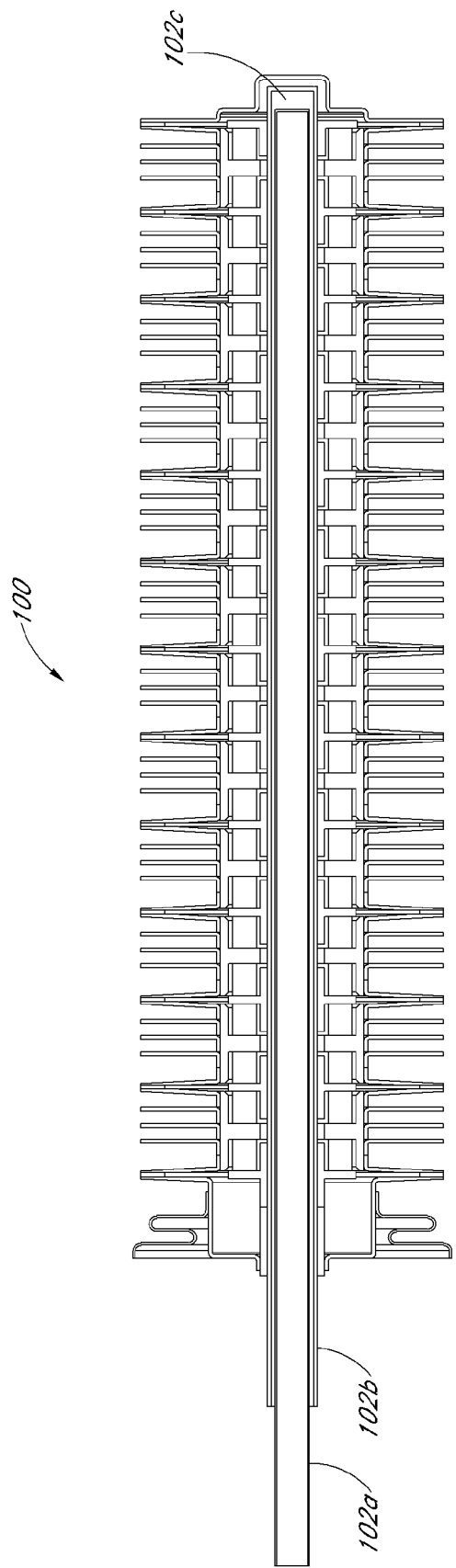

The fluid conduit 102 can be configured to have the flow inlet and the flow outlet at the same end of the thermoelectric system 100, with the flow inlet and the flow outlet in different (e.g., opposite or generally opposite) directions from one another, which can provide packaging advantages in certain configurations. For example, FIGS. 8C and 8D schematically illustrate an example thermoelectric system 100 comprising a fluid conduit 102 having an inner tube 102a and an outer tube 102b in fluidic communication with one another (e.g., at one end portion 102c). The inner tube 102a can be coaxial with the outer tube 102b. In other such configurations, the fluid conduit 102 can comprise a U-shaped tube portions at an end of the fluid conduit 102.

Figure 8E:
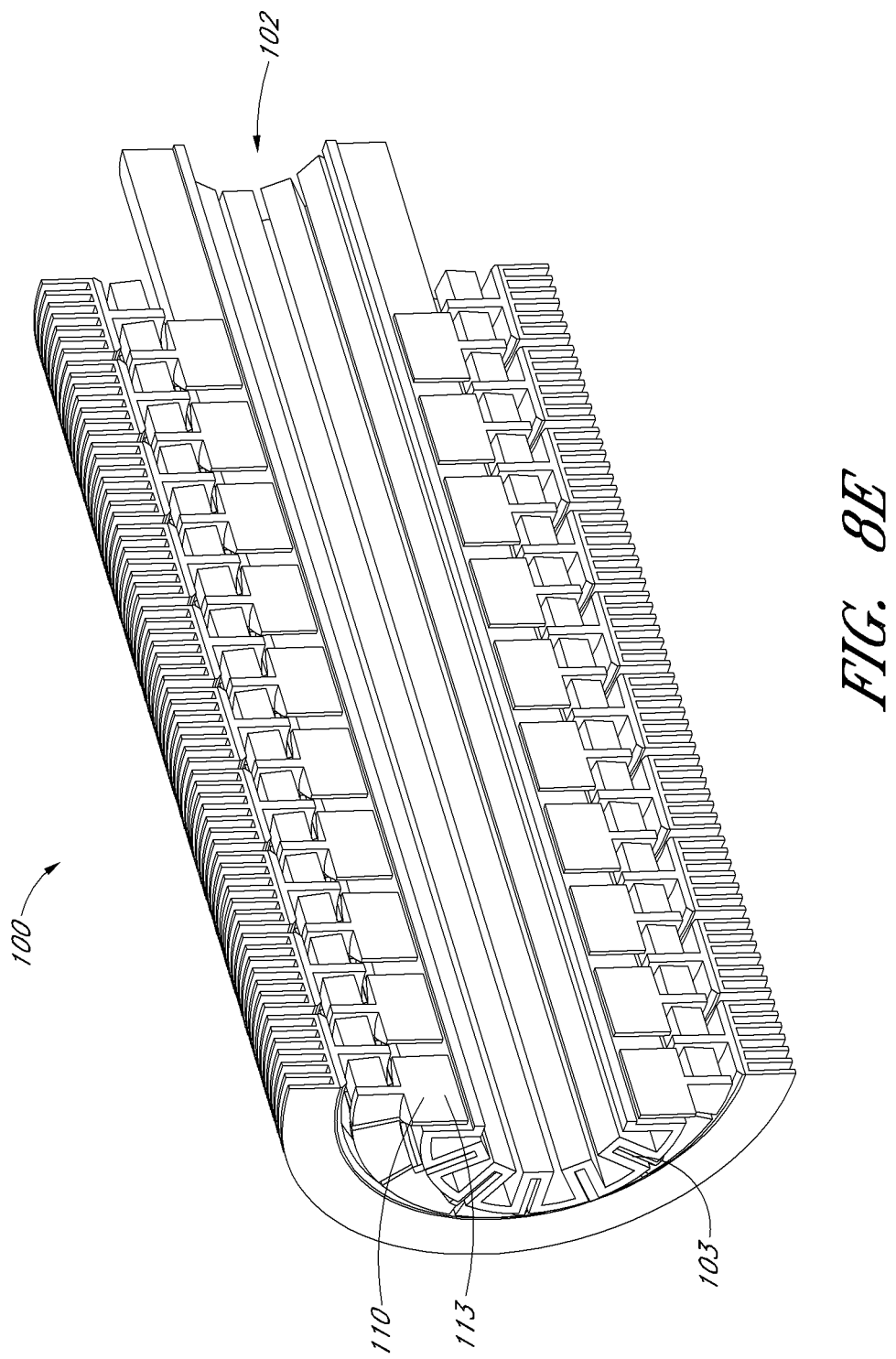
FIGS. 8E-8G schematically illustrate an example thermoelectric system comprising a fluid conduit having one or more recesses and at least one shunt having at least one protrusion extending into a corresponding recess of the fluid conduit.
Figure 8F:
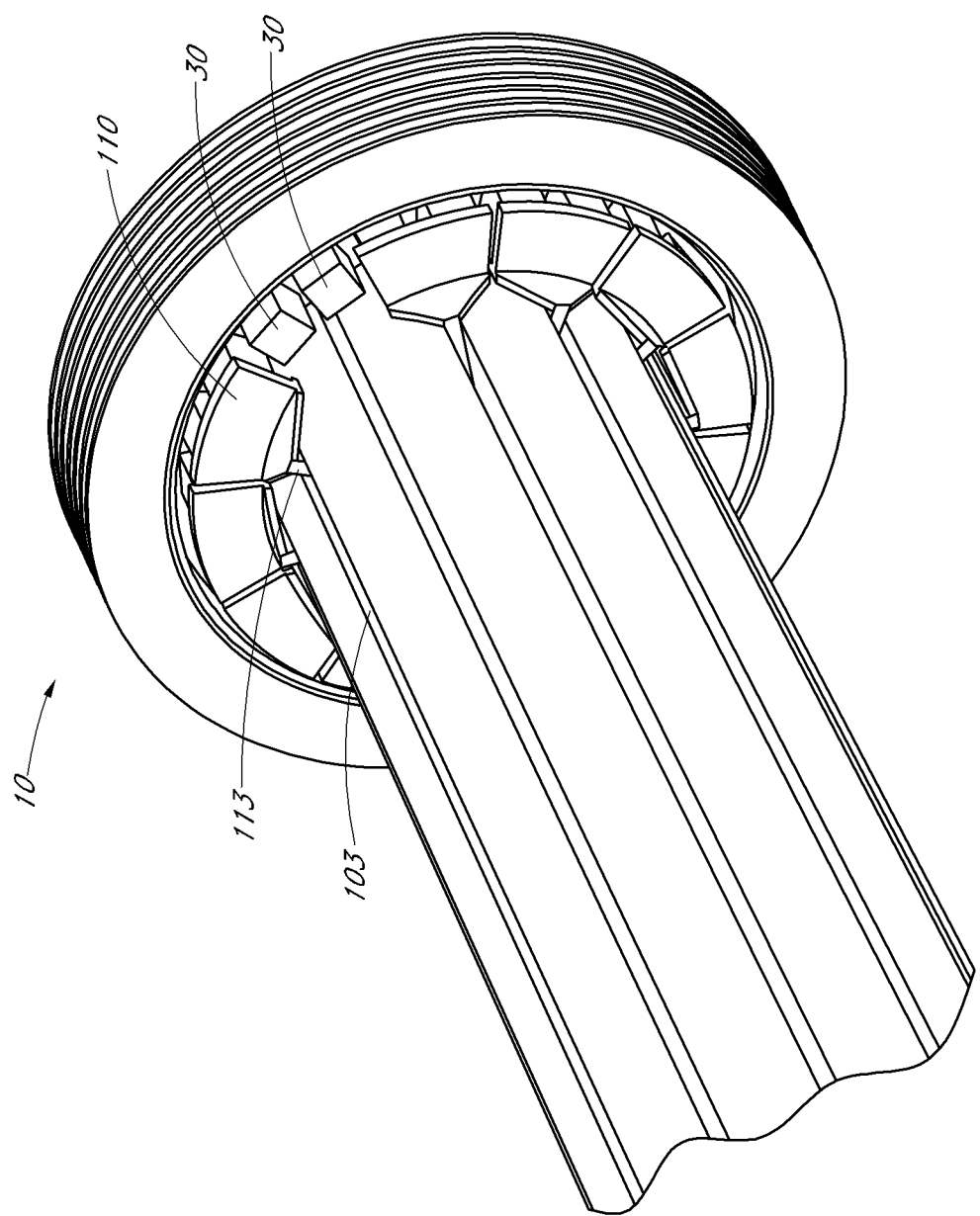
Figure 8G:
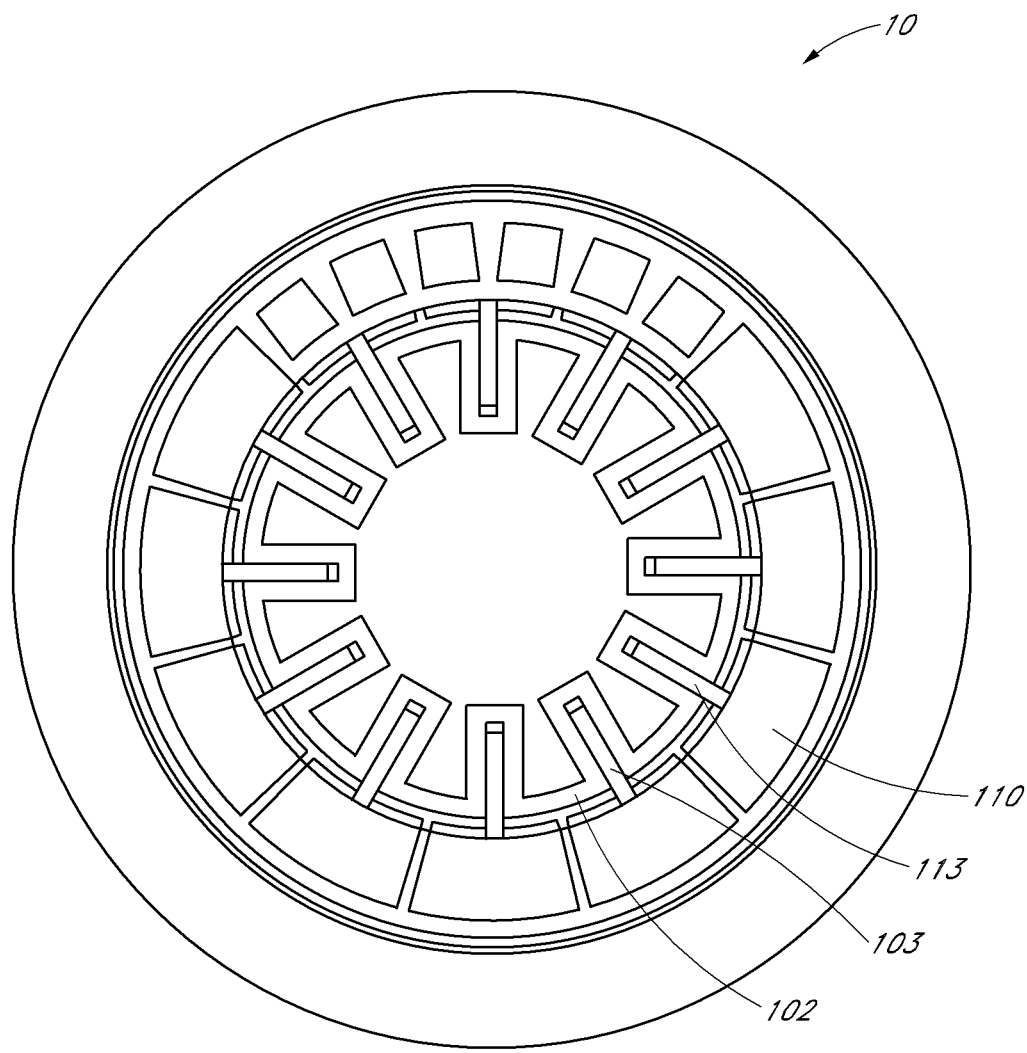

FIGS. 8E-8G schematically illustrate an example thermoelectric system 100 comprising a fluid conduit 102 having one or more recesses 103 and at least one second shunt 110 having at least one protrusion 113 extending into a corresponding recess 103 of the fluid conduit 102. The second shunts 110 shown in FIGS. 8E-8G each have the shape of a sector of an annulus (e.g., pie-wedge-shaped) and are electrically isolated from one another along or generally along the perimeter of the fluid conduit 102 in a direction generally perpendicular to the fluid flow direction 104, which can aid in the increase of voltage for the thermoelectric system 100. The recesses 103 of the example thermoelectric system 100 of FIGS. 8E-8G comprise grooves and the protrusions 113 are configured to fit within the grooves and to move radially within the grooves in response to thermal expansion or contraction of the thermoelectric system 100. For example, the protrusions 113 can comprise generally flat portions that extend into the grooves and can move radially inward upon the fluid conduit 102 expanding at a faster rate than the at least one second shunt 110. Thermal grease can be placed within the recesses between the fluid conduit 102 and the at least one second shunt 110 to provide better thermal contact and to provide lubrication for the movement caused by radial thermal expansion or contraction.

Single Electrical Pass Cartridge Configuration

Figure 9B:
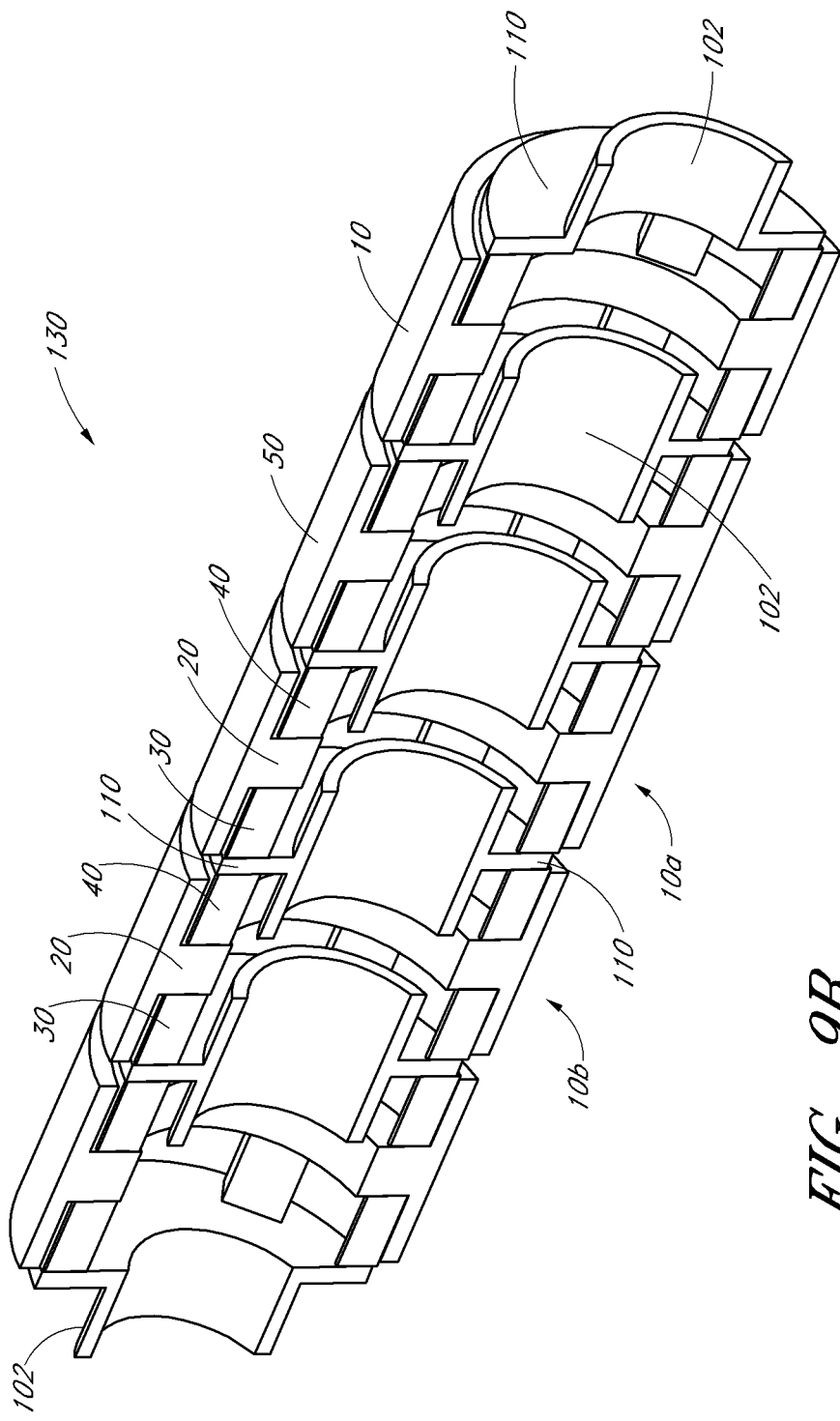
Figure 9C:
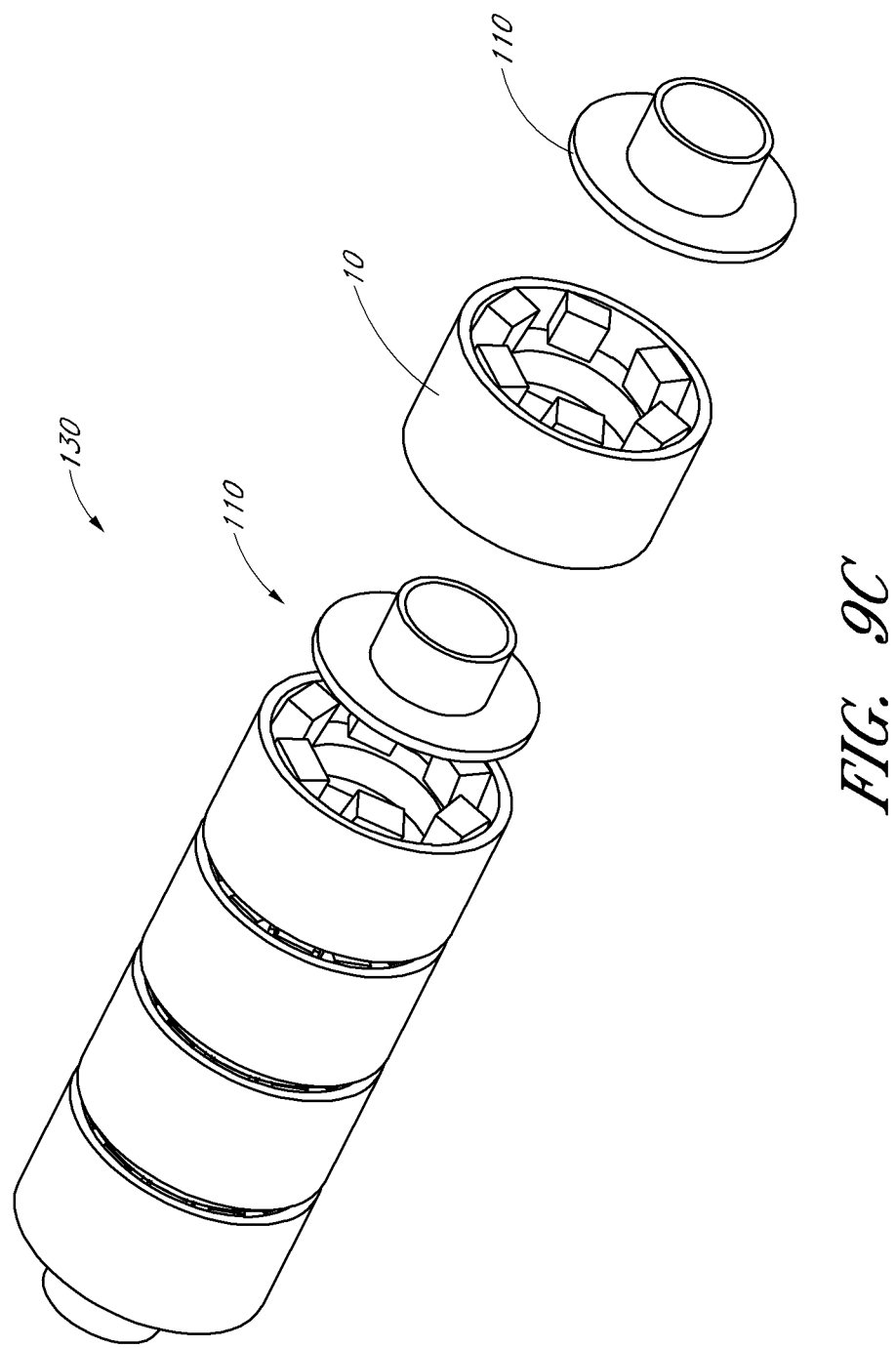
Figure 9D:
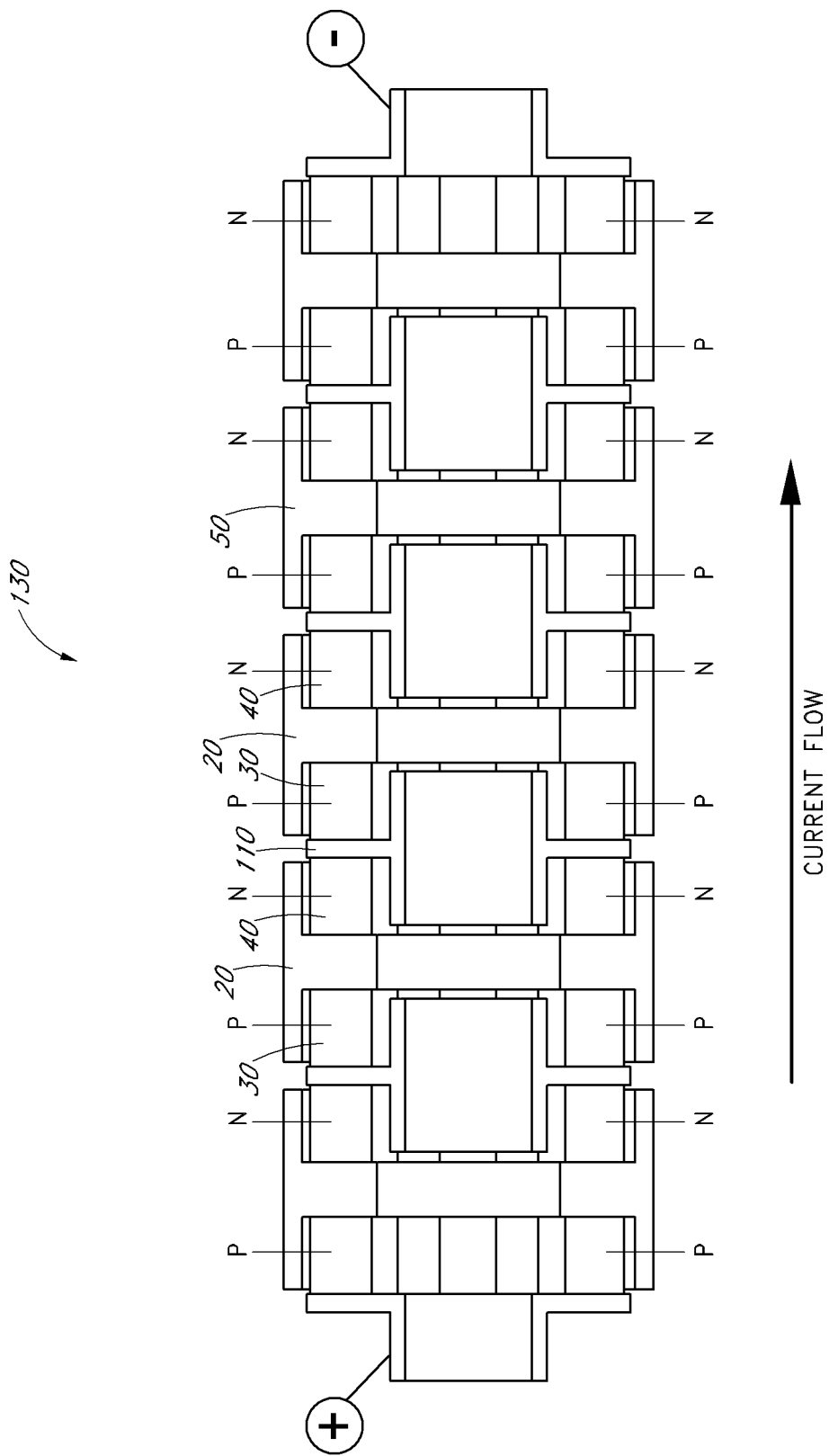

FIGS. 9A-9D schematically illustrate various views of an example thermoelectric system 100 (FIG. 9A: perspective view; FIG. 9B: perspective partially exploded view; FIG. 9C: perspective cross-sectional view; FIG. 9D: cross-sectional side view) in which the electrical current flow path passes once through the first thermoelectric assembly 10a, the at least one second shunt 110, and the second thermoelectric assembly 10b (e.g., through each thermoelectric assembly 10 of the plurality of thermoelectric assemblies 10 and each second shunt 110 of the plurality of second shunts 110). The example thermoelectric system 100 of FIGS. 9A-9D can have a cold first fluid flowing through the conduit 102 and a hot second fluid flowing along or generally along an outer surface of the thermoelectric system 100, as shown in FIG. 9A, but same structure can be used for a hot first fluid and a cold second fluid configuration as well.

The at least one first shunt 20 of each thermoelectric assembly 10 is unitary and annular, and each at least one second shunt 110 is unitary and annular. While the heat exchangers 50 of FIGS. 9A-9D are the outer surfaces of the first shunts 20, other configurations can include fins or other protrusions or structures as the heat exchangers 50. P-type and n-type thermoelectric elements can be placed on opposing sides of each of the thermoelectric assemblies 10 to form p-n-p-n junctions, and heat can pass in the radial direction of the cartridge 130 from the second shunts 110 to the thermoelectric elements 30, 40, to the first shunts 20, to the conduit 102. Electrical current can flow in an axial direction of the cartridge 130 from a positive electrode at one end of the cartridge 130 to a negative electrode at the other end of the cartridge 130. The power generated by the cartridge 130 can be a function of hot and cold side temperatures, heat flux and efficiency of the thermoelectric system 100 and its components. Voltage of the cartridge 130 (e.g., potential difference between the positive and negative electrode) can be proportional to the product of the number of first shunts 20 and the temperature differential between the hot and cold sides.

For example, as shown in FIG. 9D, the at least one first thermoelectric element 30 on a first side of the first shunt 20 can all be p-type and can be in parallel electrical communication with one another (e.g., by being in electrical communication with the first shunt 20, with the second shunt 110, or both). The at least one second thermoelectric element 40 on a second side of the first shunt 20 (e.g., opposite or generally opposite to the first side) can all be n-type and can be in parallel electrical communication with one another (e.g., by being in electrical communication with the first shunt 20, with the second shunt 110, or both). The at least one first thermoelectric element 30 and the at least one second thermoelectric element 40 can be in series electrical communication with one another (e.g., by being in electrical communication with the first shunt 20, with the second shunt 100, or both). In such a configuration, electrical current flows from one end of the thermoelectric system 100 to the other by flowing once through the thermoelectric assemblies 10 and the second shunts 110.

Double Electrical Pass Cartridge Configuration

Figure 10A:
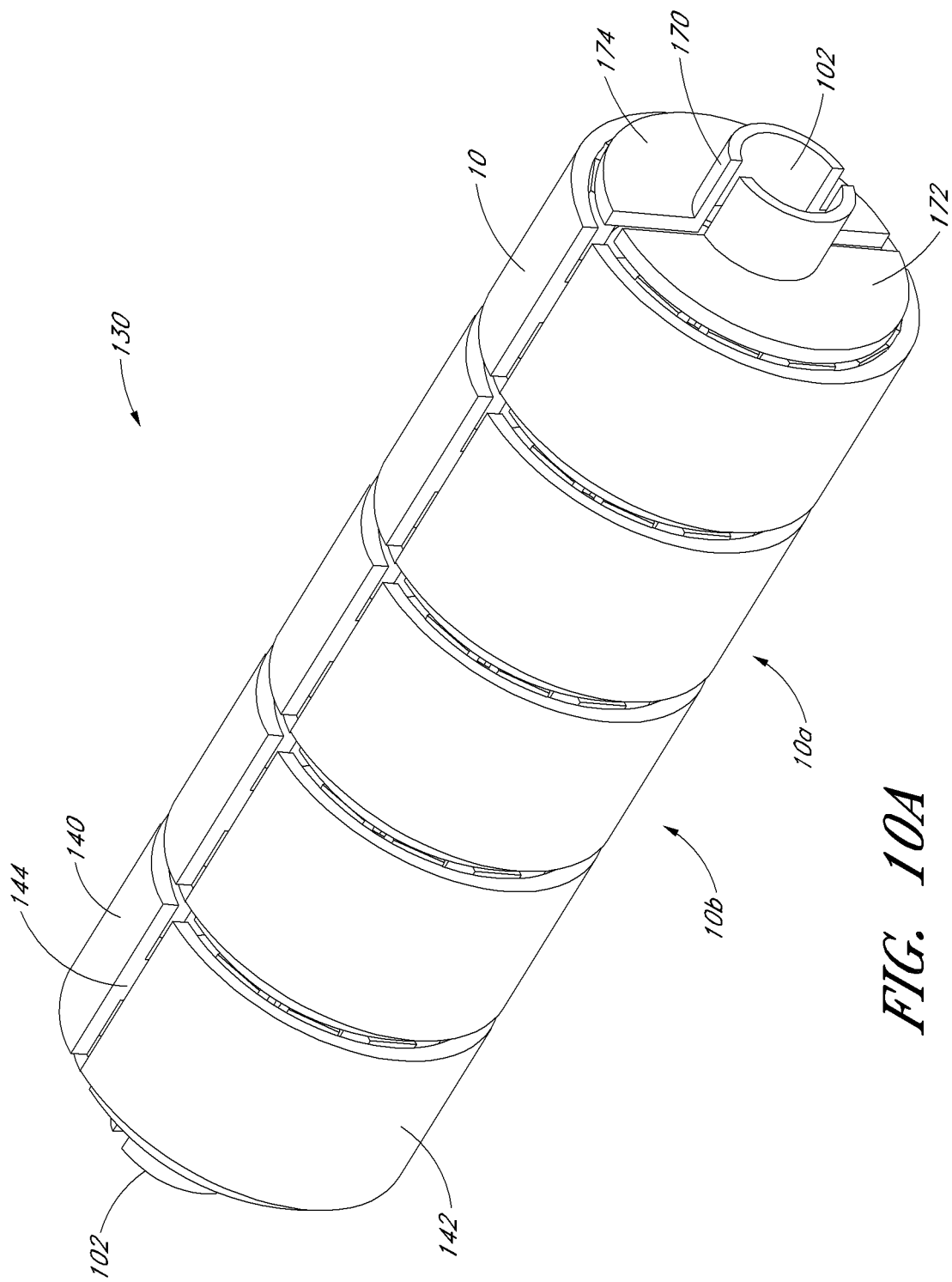
FIGS. 10A-10D schematically illustrate various views of another example thermoelectric system in which the electrical current flow path passes twice through each thermoelectric assembly and each second shunt.
Figure 10B:
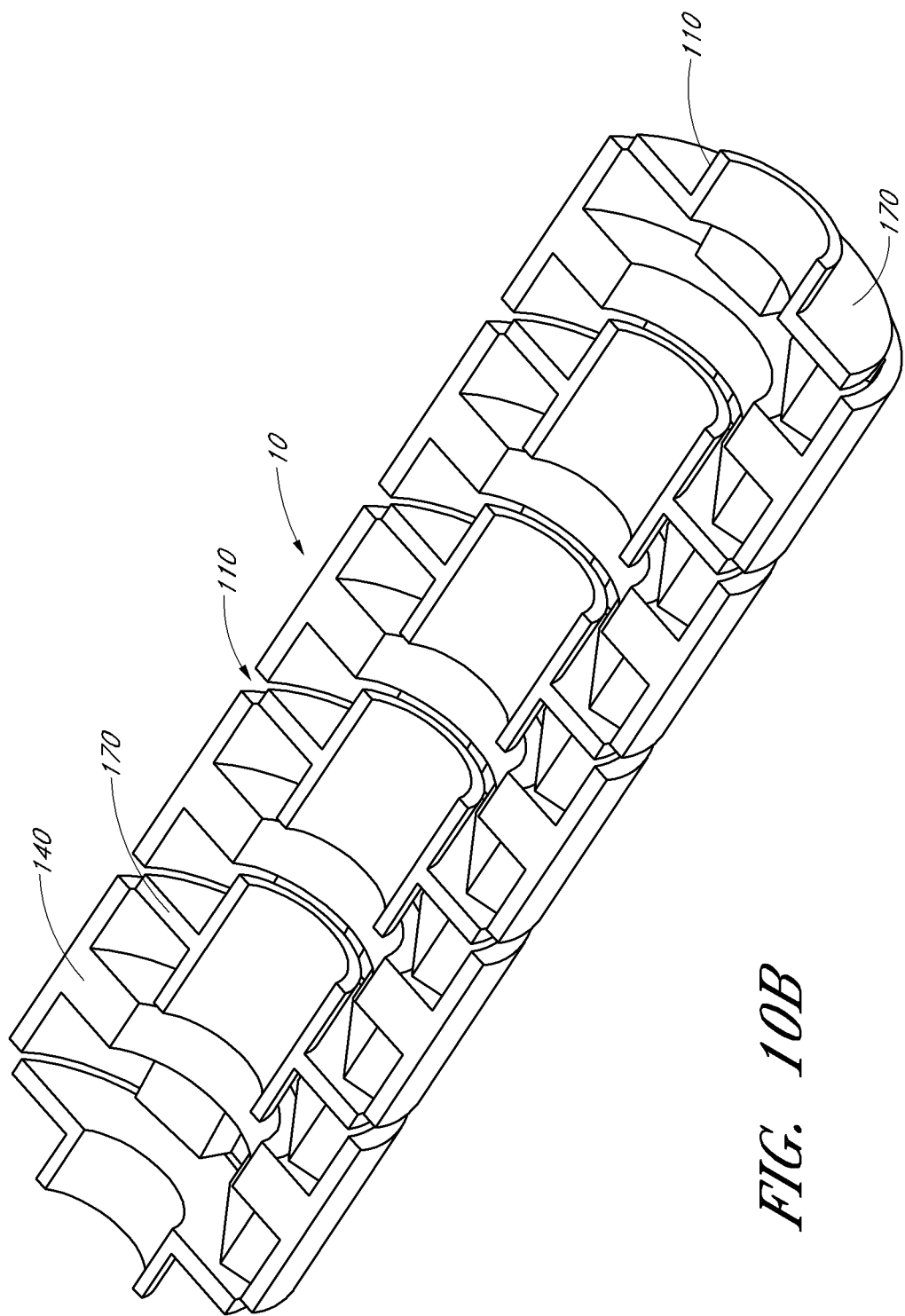
Figure 10C:
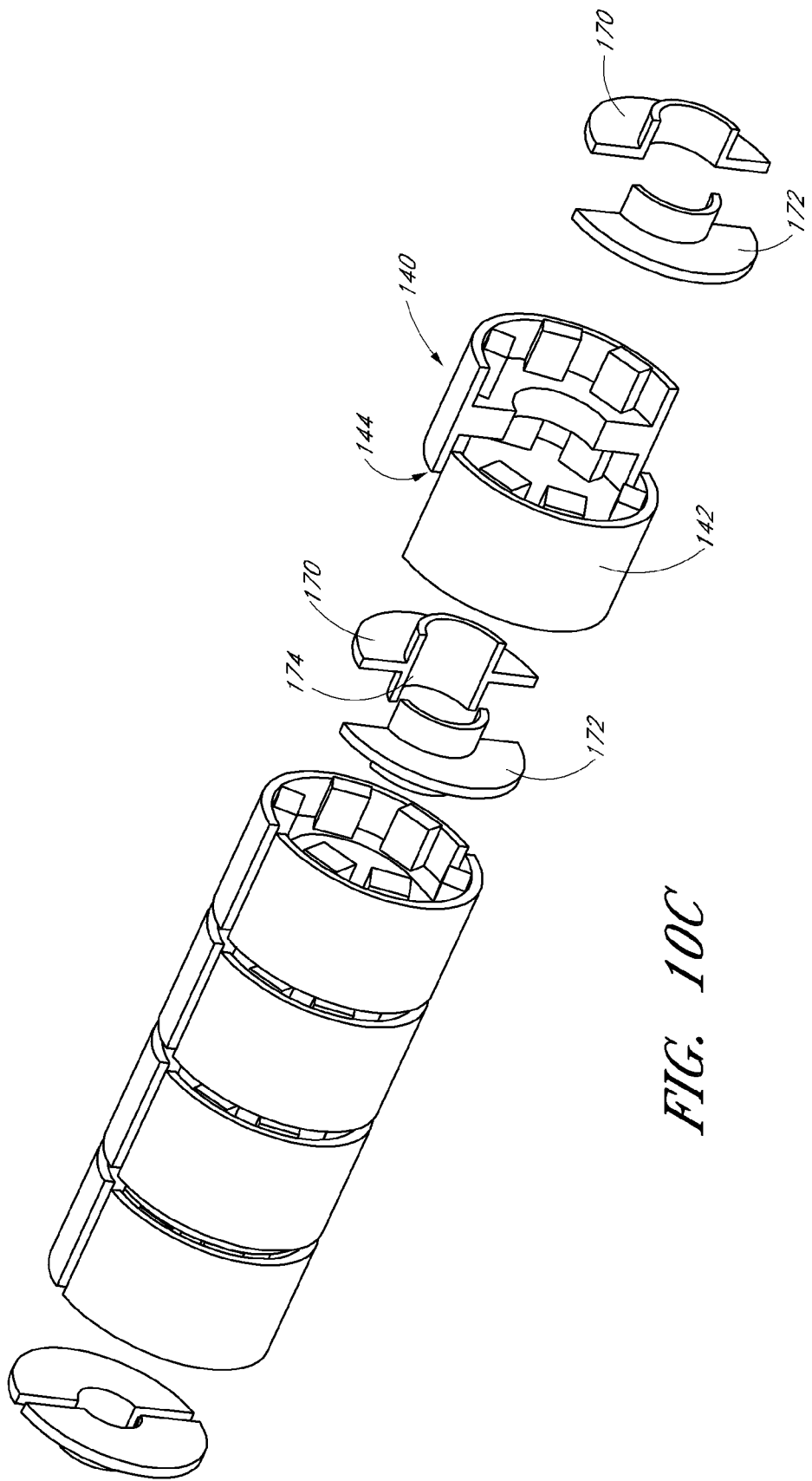
Figure 10D:
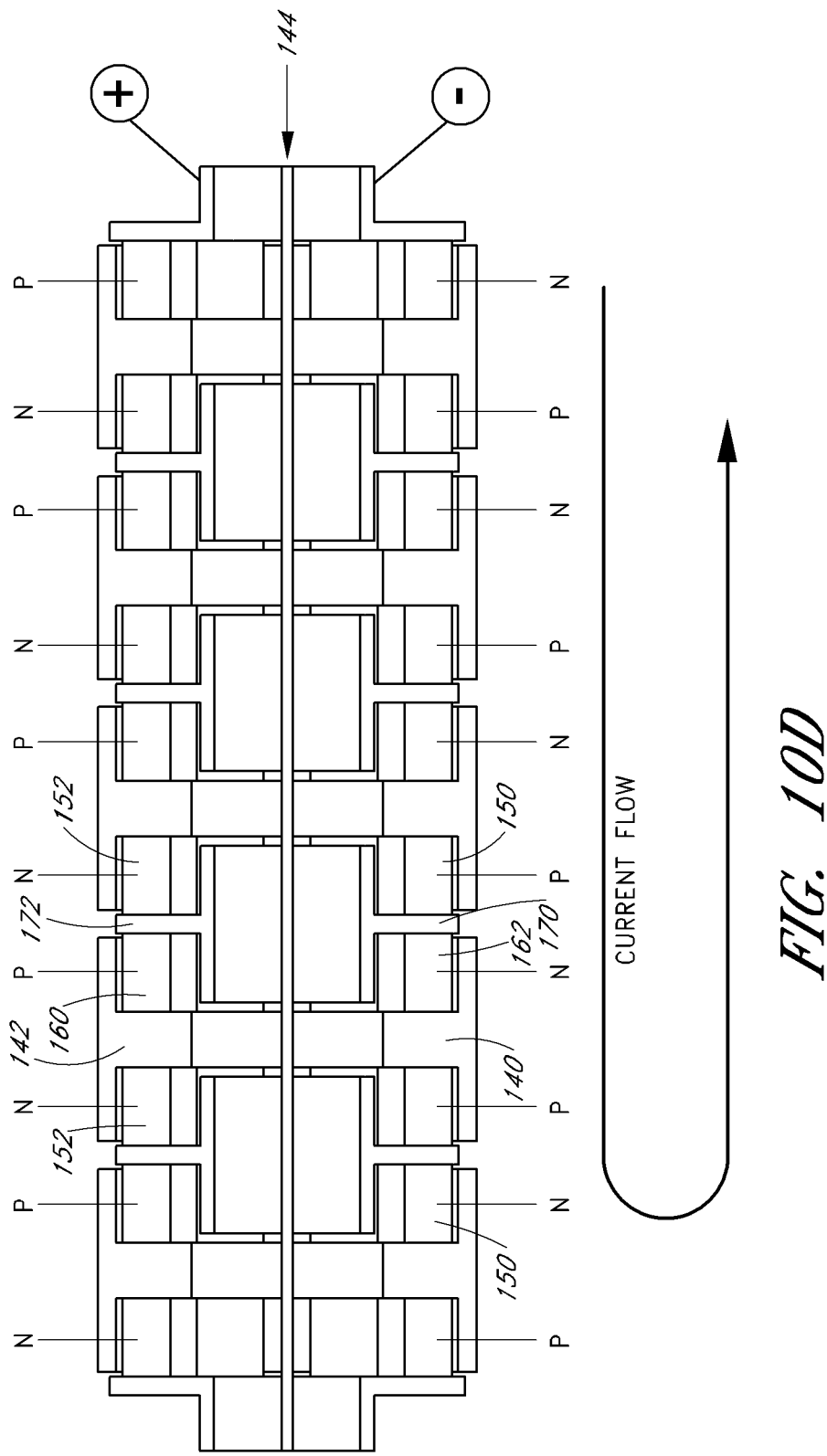

FIGS. 10A-10D schematically illustrate various views of another example thermoelectric system 100 (FIG. 10A: perspective view; FIG. 10B: perspective partially exploded view; FIG. 10C: perspective cross-sectional view; FIG. 10D: cross-sectional side view) in which the electrical current flow path passes at least twice through the first thermoelectric assembly 10a, the at least one second shunt 110, and the second thermoelectric assembly 10b (e.g., through each thermoelectric assembly 10 of the plurality of thermoelectric assemblies 10 and each second shunt 110 of the plurality of second shunts 110).

The double pass configuration can allow use of a similar cartridge geometry as that of FIGS. 9A-9D, capable of producing similar power outputs, but with an output voltage twice as large. Such a result can be achieved by using two one-half rings for the first shunt 20 and two one-half rings for the second shunt 110. The halves of the first and second shunts 20, 110 can be separated using electrically insulating layers (e.g., gas, vacuum, oxide coatings such as plasma sprayed aluminum oxide, boron nitride, plastics, rubbers, or any other dielectric materials). As described below, the current flow can be from a positive electrode to the first half-ring with p-type thermoelectric elements to n-type thermoelectric elements to a next half-ring with p-type elements, etc. At the end of the cartridge 130, p-type thermoelectric elements of the last half-ring can be connected to n-type thermoelectric elements of the half-ring at the same axial location (e.g., by a jumper at the end of the cartridge 130, either within the cartridge 130 or externally to the cartridge 130) and current flow can be directed back to the front of the cartridge 130 and to a negative electrode. Power generation of the example thermoelectric system 100 of FIGS. 10A-10D is similar to that of the single-pass example thermoelectric system 100 of FIGS. 9A-9D, and voltage is twice that of the single-pass configuration. Reduction in power generation can be equal to Joule heat generated in the additional jumper within the cartridge 130.

The example thermoelectric system 100 of FIGS. 10A-10D can have a cold first fluid flowing through the conduit 102 and a hot second fluid flowing along or generally along an outer surface of the thermoelectric system 100, as shown in FIG. 10A, but same structure can be used for a hot first fluid and a cold second fluid configuration as well. While the heat exchangers 50 of FIGS. 10A-10D are the outer surfaces of the first shunts 20, other configurations can include fins or other protrusions or structures as the heat exchangers 50.

In the example thermoelectric system 100 of FIGS. 10A-10D, the at least one first shunt 20 comprises a first segment 140, a second segment 142, and an electrically insulating material 144 (e.g., gas in a gap) between the first segment 140 and the second segment 142. The at least one second shunt 110 comprises a first segment 170, a second segment 172, and an electrically insulating material 174 (e.g., gas in a gap) between the first segment 170 and the second segment 172. For example, the first segment 140 and the second segment 142 of the at least one first shunt 20 can each comprise a half-ring and the first segment 170 and the second segment 172 of the at least one second shunt 110 can each comprise a half-ring. The at least one first thermoelectric element 30 can comprise at least one first p-type thermoelectric element 150 and at least one first n-type thermoelectric element 152. The at least one second thermoelectric element 40 can comprise at least one second p-type thermoelectric element 160 and at least one second n-type thermoelectric element 162.

The first segment 140 of the at least one first shunt 20 can be sandwiched between at least one first p-type thermoelectric element 150 and at least one second n-type thermoelectric element 162. The second segment 142 of the at least one first shunt 20 can be sandwiched between at least one first n-type thermoelectric element 152 and at least one second p-type thermoelectric element 160. The first segment 170 of the at least one second shunt 110 can be sandwiched between at least one second n-type thermoelectric element 162 of the first thermoelectric assembly 10a and at least one first p-type thermoelectric element 150 of the second thermoelectric assembly 10b. The second segment 172 of the at least one second shunt 110 can be sandwiched between at least one second p-type thermoelectric element 160 of the first thermoelectric assembly 10a and at least one first n-type thermoelectric element 152 of the second thermoelectric assembly 10b.

As shown in FIG. 10D, at least one first p-type thermoelectric element 150 on a first side of the first segment 140 of the first shunt 20 can be in series electrical communication with at least one second n-type thermoelectric element 162 on a second side (e.g., opposite or generally opposite to the first side) of the first segment 140 of the first shunt 20 (e.g., by being in electrical communication with the first segment 140 of the first shunt 20). At least one first n-type thermoelectric element 152 on a first side of the second segment 142 of the first shunt 20 can be in series electrical communication with at least one second p-type thermoelectric element 160 on a second side (e.g., opposite or generally opposite to the first side) of the second segment 142 of the first shunt 20 (e.g., by being in electrical communication with the second segment 142 of the first shunt 20). At least one second n-type thermoelectric element 162 on a first side of the first segment 170 of the second shunt 110 can be in series electrical communication with at least one first p-type thermoelectric element 150 on a second side (e.g., opposite or generally opposite to the first side) of the first segment 170 of the second shunt 110 (e.g., by being in electrical communication with the first segment 170 of the second shunt 110). At least one second p-type thermoelectric element 160 on a first side of the second segment 172 of the second shunt 110 can be in series electrical communication with at least one first n-type thermoelectric element 152 on a second side (e.g., opposite or generally opposite to the first side) of the second segment 172 of the second shunt 110 (e.g., by being in electrical communication with the second segment 172 of the second shunt 110).

In such a configuration, electrical current can flow from one end of the thermoelectric system 100, passing at least twice through the first thermoelectric assembly 10a, the at least one second shunt 110 and the second thermoelectric assembly 10b, returning to the one end of the thermoelectric system 100 (e.g., through an appropriate electrical connector or jumper at the other end of the thermoelectric system 100). For example, the electrical current flow path can pass once through the first segment 140 of the at least one first shunt 20 of the first thermoelectric assembly 10a, the first segment 170 of the at least one second shunt 110, and the first segment 140 of the at least one first shunt 20 of the second thermoelectric assembly 10b, and the electrical current flow path can pass once through the second segment 142 of the at least one first shunt 20 of the second thermoelectric assembly 10b, the second segment 172 of the at least one second shunt 110, and the second segment 142 of the at least one first shunt 20 of the first thermoelectric assembly 10a.

Multiple Electrical Pass Cartridge Configuration

By generalizing the configuration of FIGS. 10A-10D, the electrical current flow path through an example thermoelectric system 100 can pass multiple times through the first thermoelectric assembly 10a, the at least one second shunt 110, and the second thermoelectric assembly 10b (e.g., through each thermoelectric assembly 10 of the plurality of thermoelectric assemblies 10 and each second shunt 110 of the plurality of second shunts 110). The first shunts 20 and the second shunts 110 can be divided into 2, 3, 4, 5, ..., k fraction of a ring segments, where k can be any positive integer. Voltage of the cartridge 130 can then be calculated as k times voltage of an equivalent single-pass cartridge 130. If k is an odd integer, the positive and negative electrodes can be on opposite ends of the cartridge 130. If k is an even integer, the positive and negative electrodes can be on the same side of the cartridge 130.

The at least one first shunt 20 can comprise a plurality of first segments with electrically insulating material between at least some of the first segments. The at least one first thermoelectric element 30 can comprise a plurality of p-type thermoelectric elements and a plurality of n-type thermoelectric elements. The at least one second thermoelectric element 40 can comprise a plurality of p-type thermoelectric elements and a plurality of n-type thermoelectric elements. Each first segment of the plurality of first segments can be sandwiched between a thermoelectric element of the at least one first thermoelectric element 30 and a thermoelectric element of the at least one second thermoelectric element 40 having different doping types. The at least one second shunt 110 can comprise a plurality of second segments with electrically insulating material between at least some of the second segments. Each second segment of the plurality of second segments can be sandwiched between a thermoelectric element of the at least one second thermoelectric element 40 of the first thermoelectric assembly 10a and a thermoelectric element of the at least one first thermoelectric element 30 of the second thermoelectric assembly 10b having different doping types. In such a configuration, electrical current can flow from one end of the thermoelectric system 100, passing multiple times through the first thermoelectric assembly 10a, the at least one second shunt 110, and the second thermoelectric assembly 10b (e.g., through an appropriate electrical connector at the other end of the thermoelectric system 100).

Compliant Element Mechanically Coupling Thermoelectric Assemblies

FIGS. 5A-5B and 6A-6B schematically illustrate example thermoelectric systems 100 having thermoelectric assemblies 10 mechanically coupled together by at least one compliant element 54. The thermoelectric system 100 can comprise at least a portion of a tubular or generally tubular fluid conduit 102 configured to allow a fluid to flow through the at least a portion of the tubular or generally tubular fluid conduit 102 along or generally along a direction 104. The thermoelectric system 100 can further comprise at least two thermoelectric assemblies 10 extending around the conduit 102 and in thermal communication with the conduit 102. The at least two thermoelectric assemblies 10 can comprise a first thermoelectric assembly 10a and a second thermoelectric assembly 10b. Each of the first and second thermoelectric assemblies 10a, 10b can comprise at least one first shunt 20, a plurality of thermoelectric elements 30, 40, and at least one heat exchanger 50. The plurality of thermoelectric elements 30, 40 can be in thermal communication and in electrical communication with the at least one first shunt 20 and electrically isolated from the conduit 102. At least a portion of the at least one first shunt 20 can be sandwiched between at least two thermoelectric elements 30, 40 of the plurality of thermoelectric elements 30, 40. The at least one heat exchanger 50 can be in thermal communication with the at least one first shunt 20.

The thermoelectric system 100 can further comprise at least one compliant element 54 mechanically coupling the first thermoelectric assembly 10a and the second thermoelectric assembly 10b together. The at least one compliant element 54 can be configured to comply (e.g., deform elastically, partially elastically, or inelastically) in response to motion among portions of the thermoelectric system 100 (e.g., motion comprising thermal expansion or contraction within the thermoelectric system 100 or motion caused by mechanical shocks to the thermoelectric system 100). The at least one compliant element 54 can be at one or both ends of the at least one heat exchanger 50 and can be in thermal communication with the at least one shunt 20. The at least one compliant element 54 can be configured to be mechanically coupled to the at least one heat exchanger 50 of an adjacent thermoelectric assembly 10.

As schematically illustrated by FIG. 1B, the at least one compliant element 54 comprises at least a portion of the at least one heat exchanger 50 of at least one of the first and second thermoelectric assemblies 10a, 10b. For example, the at least one heat exchanger 50 comprises a plurality of fins 51, and the at least one compliant element 54 comprises at least one fin 51 of the plurality of fins 51 of the first thermoelectric assembly 10a. The at least one fin 51 can be welded to at least one fin 51 of the plurality of fins 51 of the second thermoelectric assembly 10b.

As the thermoelectric assembly 10 heats up (e.g., by having a hot gas flow across the at least one heat exchanger 50), the thermoelectric assembly 10 (e.g., the at least one shunt 20 and the at least one heat exchanger 50) can expand (shown by arrows) along or generally along an axis with respect to its midplane (shown as a dashed line in FIG. 1B). To compensate for this expansion, the at least one compliant element 54 at each end of the at least one heat exchanger 50 allows the axial thermal expansion of the thermoelectric assemblies 10 to occur without the at least one shunt 20 of one thermoelectric assembly 10 to short out to the at least one shunt 20 of the adjacent thermoelectric assembly 10 (e.g., creating an electrical pathway from the one shunt 20 to the other shunt 20 that bypasses the thermoelectric elements 30, 40 between the two shunts 20).

FIGS. 11A-11I schematically illustrate various example configurations of the compliant element 54 comprising at least one bellows 55 mechanically coupled to the first thermoelectric assembly 10a and the second thermoelectric assembly 10b. The bellows 55 can be between each pair of adjacent thermoelectric assemblies 10, and can comply with the thermal expansion or contraction in the axial direction of the thermoelectric assemblies 10.

The bellows 55 of FIG. 11A is integrated with the fins 51 of the at least one heat exchanger 50. For example, the fins 51 at each end of the heat exchanger 50 can be shaped and welded to the adjacent fin 51 of the adjacent heat exchanger 50. The fins 51 can be stamped, formed, machined, or manufactured in any fashion, and are configured such that the fins 51 at both ends of the at least one heat exchanger 50 flex in response to the thermal expansion of the thermoelectric assemblies 10. The at least one compliant element 54 can comprise at least one expansion joint mechanically coupled to the first thermoelectric assembly 10a and the second thermoelectric assembly 10b.

FIGS. 11B and 11C schematically illustrate example compliant elements 54 comprising at least one bellows 55 that is a separate component from the fins 51 of the at least one heat exchanger 50 and is mechanically coupled to the first and second thermoelectric assemblies 10a, 10b (e.g., to the at least one heat exchanger 50 of the first thermoelectric assembly 10a and to the at least one heat exchanger 50 of the second thermoelectric assembly 10b). The at least one bellows 55 can be annular and can encircle the conduit 102. The junction between the two heat exchangers 50 comprises a "welded bellows convolution" which includes two stamped disks that can be joined together by a laser or tungsten inert gas (TIG) weld on an inner diameter perimeter or an outer diameter perimeter. These manufactured compliant elements 54 can be assembled as a group to form expansion joints between two heat exchangers 50 and the edges can be welded to the fins 51 at the ends of adjacent thermoelectric assemblies 10. The compliant element 54 can be mounted in a regular configuration (FIG. 11B) or in an inverted configuration (FIG. 11C). FIGS. 11D and 11E schematically illustrate example bellows 55 that instead of having a convolution comprising two welded parts, the bellows 55 is a single unitary piece formed to have one or more convolutions.

Figure 11F:
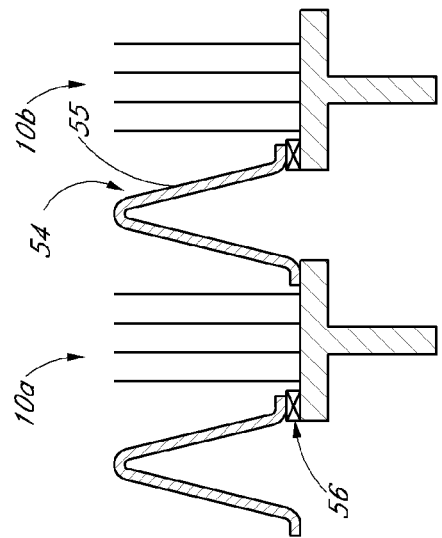
FIGS. 11F-11I schematically illustrate example compliant elements which comprise at least one electrically insulating portion mechanically coupled to the adjacent thermoelectric assemblies.
Figure 11I:
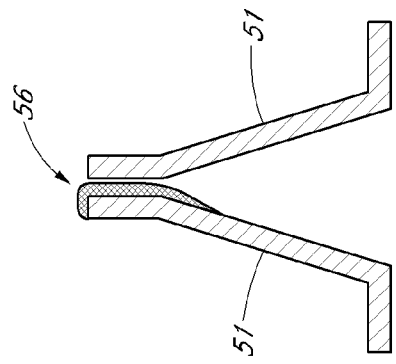
Figure 11G:
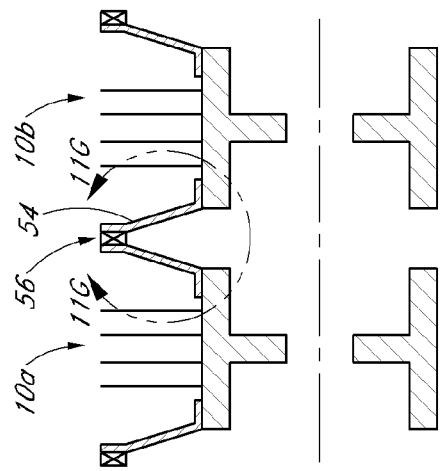
Figure 11H:
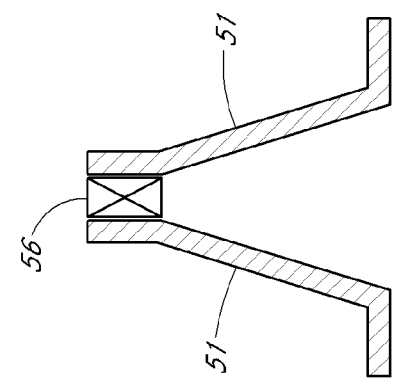

FIGS. 11F-11I schematically illustrate example compliant elements 54 which comprise at least one electrically insulating portion 56 mechanically coupled to at least one of the first thermoelectric assembly 10a and the second thermoelectric assembly 10b. In FIGS. 11F and 11G, the at least one electrically insulating portion 56 comprises a solid (e.g., ceramic) material mechanically coupled to the at least one heat exchanger 50 of the first thermoelectric assembly 10a and to the at least one heat exchanger 50 of the second thermoelectric assembly 10b (e.g., a ceramic ring brazed at the junction of two stamped metallic fins 51). The electrically insulating portion 56 can be incorporated as part of a convolution bellows assembly (e.g., as part of the bellows 55 of FIGS. 11B and 11C) or can be mounted between the two heat exchangers 50 with integrated compliant fins 51 (e.g., as in FIG. 11A) during stacking as part of the fabrication of the thermoelectric system 100. FIG. 11H schematically illustrates an example compliant element 54 in which the at least one electrically insulating portion 56 comprises a dielectric layer coating (e.g., at least one ceramic layer or plasma spray alumina layer) on at least one of the at least one heat exchanger 50 of the first and second thermoelectric assemblies 10a, 10b (e.g., on one or both metallic fins 51 or bellows sections) which can be subsequently joined together (e.g., by brazing). FIG. 11I schematically illustrates an example compliant element 54 in which the electrically insulating portion 56 is on one side of the base of the bellows 55, rather than at the junction of two stamped disks. Such a configuration is compatible, for example, with the example compliant elements 54 of FIGS. 11D and 11E.

As described above, the thermoelectric system 100 can comprise at least one second shunt 110 in thermal communication with the conduit 110, electrically isolated from the conduit 102, and extending around the conduit 102. At least a portion of the at least one second shunt 110 is in thermal communication with, in electrical communication with, and sandwiched between the first thermoelectric assembly 10a and the second thermoelectric assembly 10b, such that the first thermoelectric assembly 10a, the at least one second shunt 110 and the second thermoelectric assembly 10b are in series electrical communication with one another. In such configurations, the at least one second shunt 110 can be between the at least one bellows 55 and the conduit 102 (e.g., as shown in FIGS. 5A-5B and 6A-6B).

FIG. 12A schematically illustrates an exploded perspective view of an example thermoelectric system 100 which shows an example fabrication process for forming the thermoelectric system 100, and FIGS. 12B-12D show an example bellows 55, an example second shunt 110, and an example thermoelectric assembly 10, respectively. The example thermoelectric system 100 comprises a plurality of thermoelectric assemblies 10, each having a first shunt 20, a plurality of thermoelectric elements 30, 40, and a heat exchanger 50 comprising a plurality of fins 51. The example thermoelectric system 100 further comprises a conduit 102, a plurality of second shunts 110, and a plurality of compliant elements 54 (e.g., bellows 55 configured to deform elastically upon axial thermal expansion or contraction of the thermoelectric assemblies 10). The thermoelectric assemblies 10, the second shunts 110, and the bellows 55 can be slid over the conduit 102 to form a stack with the second shunts 110 alternating with the thermoelectric assemblies 10 which are mechanically coupled together by the bellows 55. The heat exchangers 50 can be laser welded to the adjacent bellows 55, one or more compliant members 138 (e.g., one or more springs) can be placed on one or both ends of the stack, and the first cap 132 and the second cap 134 can be laser welded onto the ends of the stack. In another example thermoelectric system 100, the bellows 55 are absent, and the outermost fins 51 of the heat exchangers 50 can be bent outwardly towards the adjacent fins 51 of the adjacent heat exchanger 50 (e.g., to improve contact between the outermost fins).

Linear Thermoelectric Assembly and Resulting Thermoelectric Systems

The thermoelectric generator (TEG) described in U.S. Pat. Publ. No. 2011/0067742 A1, which is incorporated in its entirety by reference herein, has many excellent qualities. Certain example thermoelectric assemblies and systems described herein take advantage of many of these attributes while improving upon several important deficiencies.

An example cylindrical TEG has been developed that takes advantage of the hoop stress of a thermally expanding cylinder inside of a ring shunt in order to improve thermal contact. To best take advantage of the hoop stress, the ring can be a solid or split ring. In order to accommodate large mass flows while keeping pressure drop at a minimum, the diameter of the cylindrical TEG can be relatively large, resulting in many parallel connections of the thermoelectric couples.

These multiple parallel connections can lead to very high current and very low voltage for the TEG. A power converter can be added to the system to increase the voltage and to reduce the current, but this can add additional cost, can take up valuable package space, and can reduce the efficiency. Certain example thermoelectric assemblies and systems described herein advantageously improve the voltage/current split for the TEG.

In addition, the large diameters referenced above to accommodate high flows while maintaining low pressure drop can cause packaging problems, particularly in applications like vehicle or automotive applications. Certain example thermoelectric assemblies and systems described herein can provide a significant improvement in design flexibility in accommodating varying package space requirements.

It can be beneficial to be able to test parts of a design in advance of assembling the design in its entirety. In the previous TEG, it was not possible to test sections of the TEG completely prior to final assembly. Each ring shunt could be tested for electrical resistance prior to final assembly, but complete thermoelectric performance could not be confirmed. Certain example thermoelectric assemblies and systems described herein can provide a significant improvement in modularity.

Some applications may utilize waste heat that is rather diffuse, as opposed to be concentrated in one place. For example, the only place that waste heat can be accessed successfully may be on smaller capillary tubes, as opposed to the main fluid tube. Certain example thermoelectric assemblies and systems described herein can provide an opportunity for a TEG to be designed into a distributed exhaust and/or coolant system.

Figure 13:
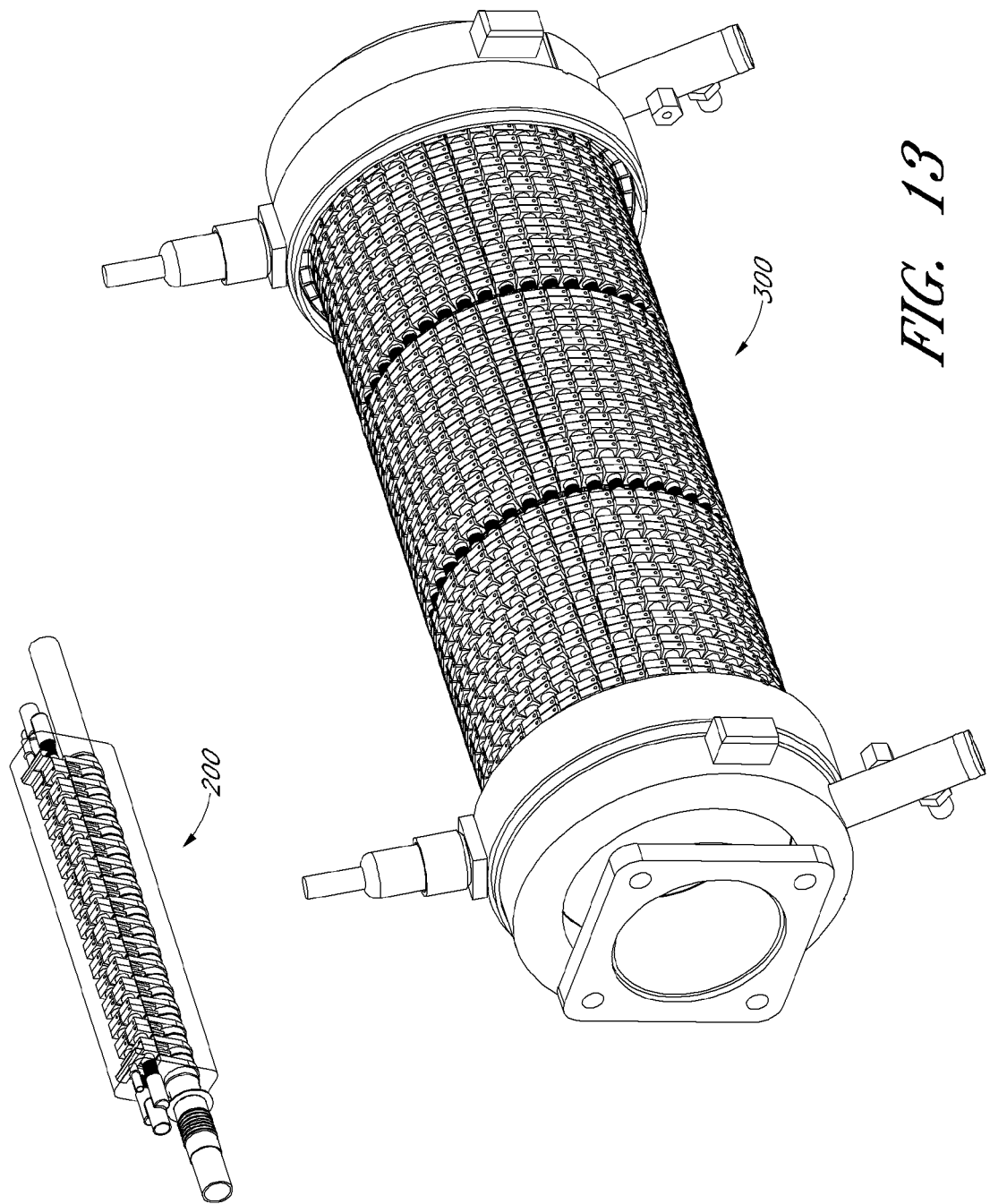
FIG. 13 schematically illustrates a cylindrical thermoelectric generator (TEG) and the inset of FIG. 13 schematically illustrates an example linear thermoelectric assembly that can be used to fabricate such a cylindrical TEG.

Certain example thermoelectric assemblies and systems described herein leverage the previous cylindrical TEG design as much as possible while making improvements in modularity, voltage/current split, and design flexibility. FIG. 13 shows a cylindrical TEG (further described in U.S. Patent Publication No. 2011/0067742, which is incorporated in its entirety by reference herein) and the inset of FIG. 13 and FIGS. 14A-14C schematically illustrate an example linear thermoelectric assembly 200 that can be used to fabricate such a cylindrical TEG.

The example linear thermoelectric assembly 200 can use the same cold tube and cold shunt subassemblies as did the previous cylindrical TEG. However, the thermoelectric assembly 200 described herein can have a much smaller diameter hot tube, and thus a much smaller hot ring shunt. The thermoelectric assembly 200 described herein can also be hermetically enclosed at the linear thermoelectric assembly level. The thermoelectric assembly 200 can comprise at least one cold tube and at least one hot tube hermetically enclosed together. The thermoelectric assembly 200 can comprise at least three shunts (e.g., two hot shunts and one cold shunt or two cold shunts and one hot shunt).

FIGS. 14A-14C schematically illustrate various views of an example thermoelectric assembly 200 (FIG. 14A: side view; FIG. 14B: end view; FIG. 14C: perspective view). The thermoelectric assembly 200 can comprise at least one first fluid conduit 210 configured to allow a first fluid to flow through the at least one first fluid conduit 210 along or generally along a first direction 212. The thermoelectric assembly 200 can further comprise at least one second fluid conduit 220 configured to allow a second fluid to flow through the at least one second fluid conduit 220 parallel or generally parallel to the first direction 212. The thermoelectric assembly 200 can further comprise a plurality of first shunts 230 configured to extend around at least a portion of the at least one first fluid conduit 210 and to be in thermal communication with the at least a portion of at least one first fluid conduit 210. The thermoelectric assembly 200 can further comprise a plurality of second shunts 240 configured to extend around at least a portion of the at least one second fluid conduit 220 and to be in thermal communication with the at least a portion of the at least one second fluid conduit 220. The thermoelectric assembly 200 can further comprise a plurality of first thermoelectric elements 250 in thermal communication and in electrical communication with the plurality of first shunts 230 and electrically isolated from the at least one first fluid conduit 210 and from the at least one second fluid conduit 220. The thermoelectric assembly 200 can further comprise a plurality of second thermoelectric elements 260 in thermal communication and in electrical communication with the plurality of first shunts 230 and the plurality of second shunts 240. Each first shunt 230 of the plurality of first shunts 230 is sandwiched between at least one first thermoelectric element 250 of the plurality of first thermoelectric elements 250 and at least one second thermoelectric element 260 of the plurality of second thermoelectric elements 260. Each second shunt 240 of the plurality of second shunts 240 is sandwiched between at least one first thermoelectric element 250 of the plurality of first thermoelectric elements 250 and at least one second thermoelectric element 260 of the plurality of second thermoelectric elements 260.

Each first fluid conduit 210 of the at least one first fluid conduit 210 can be tubular or generally tubular and can have a perimeter in a range between 3 mm and 300 mm or in a range between 1 mm and 30 mm or in a range between 2 mm and 25 mm. Each second fluid conduit 220 of the at least one second fluid conduit 220 can be tubular or generally tubular and can have a perimeter in a range between 3 mm and 300 mm or in a range between 1 mm and 30 mm or in a range between 2 mm and 25 mm. The at least one first fluid conduit 210 can have a non-round cross-section in a plane perpendicular to the first direction and the at least one second fluid conduit 220 can have a non-round cross-section in the plane perpendicular to the first direction.

The thermoelectric assembly 200 can further comprise a housing 270 configured to enclose (e.g., hermetically enclose) the at least a portion of the at least one first fluid conduit 210, the at least a portion of the at least one second fluid conduit 220, the plurality of first shunts 230, the plurality of second shunts 240, the plurality of first thermoelectric elements 250, and the plurality of second thermoelectric elements 260. The housing 270 can have a width in a range between 1 mm and 50 mm or in a range between 1 mm and 100 mm, and can have a height in a range between 1 mm and 50 mm or in a range between 1 mm and 100 mm. For example, as shown in FIG. 14, the housing 270 has a width of 25 mm and a height of 42 mm.

The thermoelectric assembly 200 can further comprise at least one electrical connector 280 (e.g., feedthrough pins) extending through at least a portion of the housing 270. The at least one electrical connector 280 can be in electrical communication with at least one of the plurality of first shunts 230 and the plurality of second shunts 240. The at least one electrical connector 280 is electrically conductive (e.g., has negligible electrical resistivity) and can be electrically insulated from the caps 132, 134 (either by an electrically insulating material or by a gap). For configurations in which the thermoelectric elements 250, 260 are hermetically enclosed within the housing 270, the at least one electrical connector 280 comprises a hermetic seal.

The at least one first thermoelectric element 250, the at least one first shunt 230, the at least one second thermoelectric element 260, and the at least one second shunt 240 can be in series electrical communication with one another. In such a configuration, an electrical current flow path can pass serially through the plurality of first thermoelectric elements 250, the plurality of first shunts 230, the plurality of second thermoelectric elements 260, and the plurality of second shunts 240.

In certain such configurations, the plurality of first thermoelectric elements 250, the plurality of first shunts 230, the plurality of second thermoelectric elements 260, and the plurality of second shunts 240 form at least one stack 290 extending parallel or generally parallel to the first direction. Each first shunt 230 of the plurality of first shunts 230 can extend from the at least one stack 290 to the at least one first fluid conduit 210 in a second direction perpendicular or generally perpendicular to the first direction, and each second shunt 240 of the plurality of second shunts 240 can extend from the at least one stack 290 to the at least one second fluid conduit 220 in a third direction perpendicular or generally perpendicular to the first direction, with the second direction opposite or generally opposite to the third direction. Each first shunt 230 of the plurality of first shunts 230 can be unitary, and each second shunt 240 of the plurality of second shunts 240 can be unitary.

FIGS. 15 and 16A-16E schematically illustrate example thermoelectric systems 300 comprising a plurality of thermoelectric assemblies 200. The plurality of thermoelectric assemblies 200 comprised by the thermoelectric system 300 can comprise one or more thermoelectric assemblies 200 as described above with regard to FIG. 14A-14C, including a housing 270. The thermoelectric assemblies 200 of the plurality of thermoelectric assemblies 200 are parallel or generally parallel to one another in the configurations of FIGS. 15 and 16A-16E. For example, each of the thermoelectric assemblies 200 comprises at least one stack 290 extending along or generally along a direction, and the stacks 290 of the plurality of thermoelectric assemblies 200 are parallel or generally parallel to one another.

At least some of the thermoelectric assemblies 200 can be in parallel electrical communication with one another. At least some of the first fluid conduits 210 of at least some of the thermoelectric assemblies 200 can be in parallel fluidic communication with one another. In addition, the at least one second fluid conduits 220 of at least some of the thermoelectric assemblies 200 can be in parallel fluidic communication with one another. Certain such example thermoelectric systems 300 are configured to handle a larger gas flow (e.g., to maintain a beneficial internal bypass for the hot exhaust gas). In some configurations, at least some of the first fluid conduits 210 can be in series fluidic communication with one another. In some configurations, the at least one second fluid conduits 220 of at least some of the thermoelectric assemblies 200 can be in series fluidic communication with one another.

In the example thermoelectric system 300 of FIG. 15, the thermoelectric assemblies 200 each comprise a stack 290 along or generally along a first direction and at least some of the thermoelectric assemblies 200 are arranged in a generally circular configuration (e.g., with the at least one first fluid conduits 210 in a first circle perpendicular or generally perpendicular to the first direction and the at least one second fluid conduits 220 in a second circle perpendicular or generally perpendicular to the first direction). As shown in FIG. 15, the first circle can be smaller than the second circle.

Figure 16A:
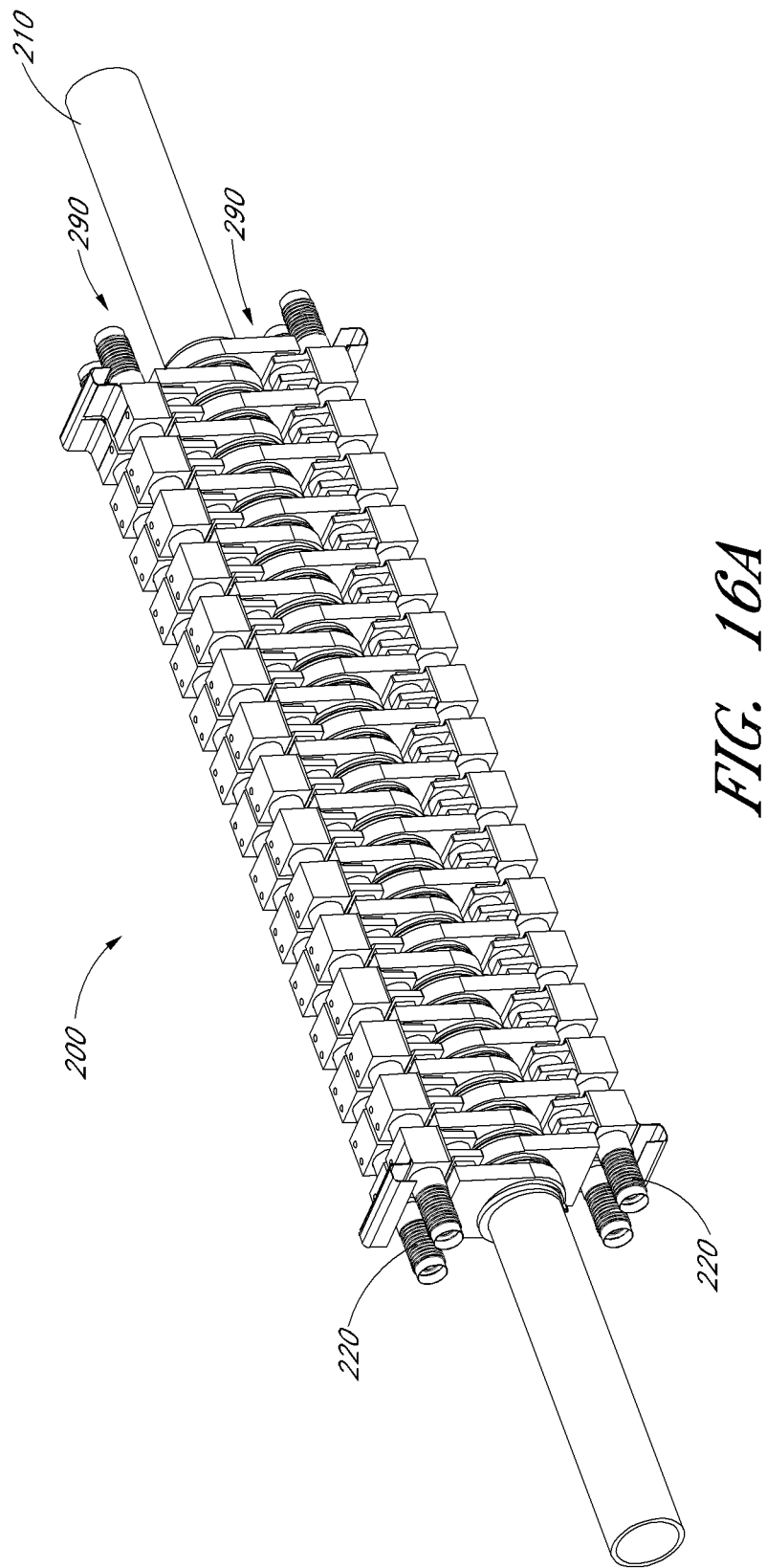
FIG. 16A schematically illustrates an example thermoelectric assembly with two stacks on opposite sides of the central first fluid conduit.
Figure 16C:
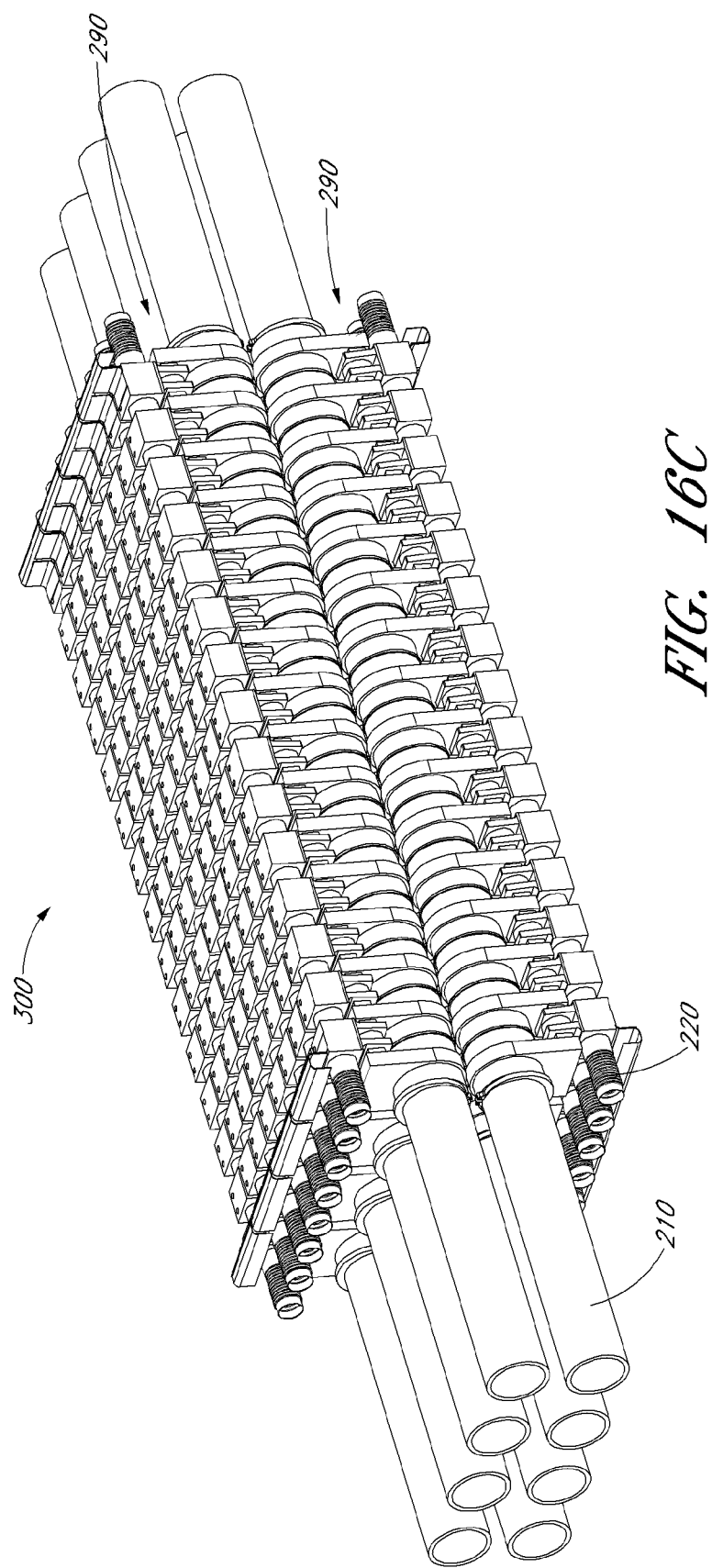
FIG. 16C schematically illustrates an example thermoelectric system comprising a plurality of thermoelectric assemblies compatible with FIG. 16A.

FIG. 16A schematically illustrates an example thermoelectric assembly 200 with two stacks 290 on opposite or generally opposite sides of the central first fluid conduit 210. FIG. 16B schematically illustrates an example thermoelectric system 300 comprising a plurality of thermoelectric assemblies 200 compatible with FIGS. 14A-14C, with at least some of the thermoelectric assemblies 200 arranged with the at least one first fluid conduits 210 in a first plane and the at least one second fluid conduits 220 in a second plane parallel or generally parallel to the first plane. FIG. 16C schematically illustrates an example thermoelectric system 300 comprising a plurality of thermoelectric assemblies 200 compatible with FIG. 16A, with at least some of the thermoelectric assemblies 200 arranged with the at least one first fluid conduits 210 in a first plane and the at least one second fluid conduits 220 in a second plane parallel or generally parallel to the first plane. FIGS. 15 and 16A-16C highlight the design flexibility and the ability to best fit different packaging spaces that can be provided by certain thermoelectric assemblies 200 and systems 300 as described herein.

FIGS. 17-19 schematically illustrate various example thermoelectric systems 300 configured to be installed in a vehicle or automotive exhaust system with the first fluid comprising vehicle exhaust flowing through the at least one first fluid conduits 210. FIG. 17 schematically illustrates an example packaging configuration of a thermoelectric system 300 comprising one set of multiple thermoelectric assemblies 200 for a vehicle exhaust application. FIG. 18 schematically illustrates an example packaging configuration of a thermoelectric system 300 comprising two sets of multiple thermoelectric assemblies 200, with the two sets in series with one another, for a vehicle exhaust application. The example thermoelectric systems 300 of FIGS. 17 and 18 can have the thermoelectric assemblies 200 of a set in parallel fluidic communication with one another, and can comprise a bypass conduit 310 in parallel fluidic communication with the at least one first fluid conduits 210 of at least some of the thermoelectric assemblies 200. The thermoelectric system 300 can further comprise a valve system configured to direct fluid flow through at least one of the bypass conduit 310 and the at least one first fluid conduits 210. The valve system can comprise at least one proportional valve configured to allow variable flow apportionment between the bypass conduit 310 and the at least one first fluid conduits 210. For example, the valve system can comprise a one or more valves configured to direct a portion of the fluid flow through the bypass conduit 310 and portions of the fluid flow through the at least one first fluid conduits 210 (see, e.g., U.S. Pat. Publ. No. 2010/0024859, which is incorporated in its entirety by reference herein).

FIG. 19 schematically illustrates an example packaging configuration of a thermoelectric system 300 for a vehicle exhaust application in which the exhaust flows transversely to the thermoelectric assemblies 200. The thermoelectric system 300 can comprise at least one manifold that produces a ninety degree change of flow direction to have the exhaust flow through the second fluid conduits.

The thermoelectric system 300 can be configured to be installed in a combustion system (e.g., a vehicle exhaust system) with the first fluid comprising vehicle exhaust flowing through the at least one first fluid conduits. In certain configurations, the first fluid can be heated by waste heat generated by a combustion system (see, e.g., U.S. Pat. No. 7,608,777, which is incorporated in its entirety by reference herein).

Certain example thermoelectric assemblies 200 and systems 300 described herein can provide a significant improvement in design flexibility and the ability to accommodate a wide variety of packaging spaces and applications, including a distributed exhaust system. Multiple thermoelectric assemblies 200 can be electrically connected in a series/parallel arrangement to better match the desired voltage/current split. This electrical split can be made dynamic to better accommodate variations in operating conditions in the thermoelectric system 300.

Smaller diameter fluid conduits or tubes can still take advantage of hoop stress to improve thermal contact between the hot heat exchanger and the hot ring shunt, but can have fewer thermoelectric elements in parallel. Enough smaller diameter fluid conduits or tubes can be used to maintain appropriate pressure drop. The smaller diameter fluid conduit or tube can also allow for better management of radial thermal expansion as less mismatch is created.

With each thermoelectric assembly 200 having its own enclosure or housing 270 (e.g., with a hermetic seal), each thermoelectric assembly 200 can be tested independently before it is placed in a final thermoelectric system 300. This modularity is very advantageous in determining if a bad thermoelectric assembly 200 or section of a TEG exists prior to final fabrication of the thermoelectric system 300. It can also allow for a damaged thermoelectric assembly 200 or section of a TEG to be removed and replaced without having to replace the entire TEG.

Assembly with Enclosed Thermoelectric Elements

The example thermoelectric generator described below can use the combination of two fluids with a temperature difference to produce electrical power via the thermoelectric elements. The fluids can be liquid or gas, or a combination of the two. The example thermoelectric generator can include a single thermoelectric assembly or a group of thermoelectric assemblies, depending on usage, power output, or voltage.

Figure 20:
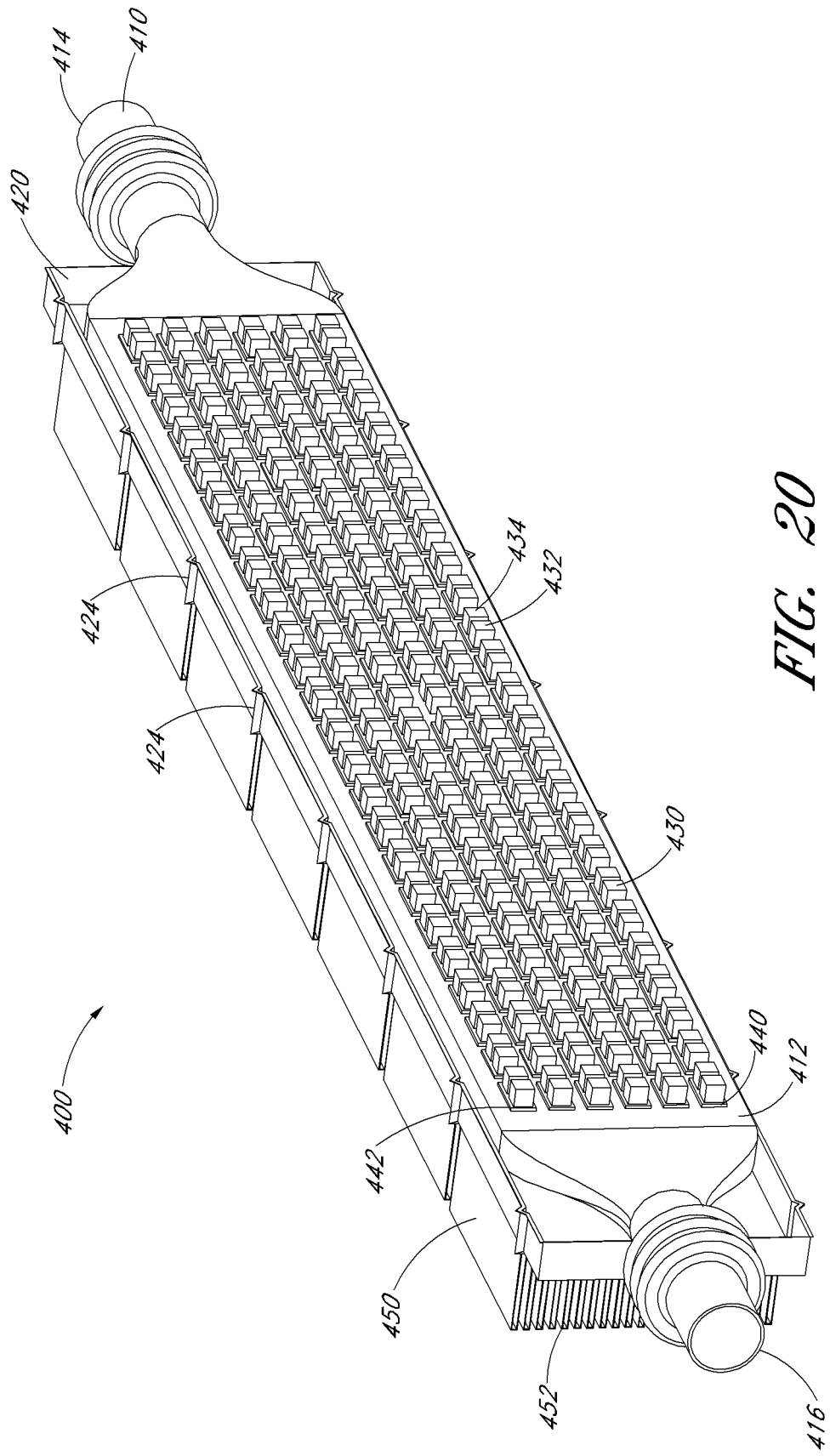
FIG. 20 schematically illustrates an example thermoelectric assembly comprising a fluid conduit having a flat surface and a housing hermetically enclosing the thermoelectric elements.
Figure 21:
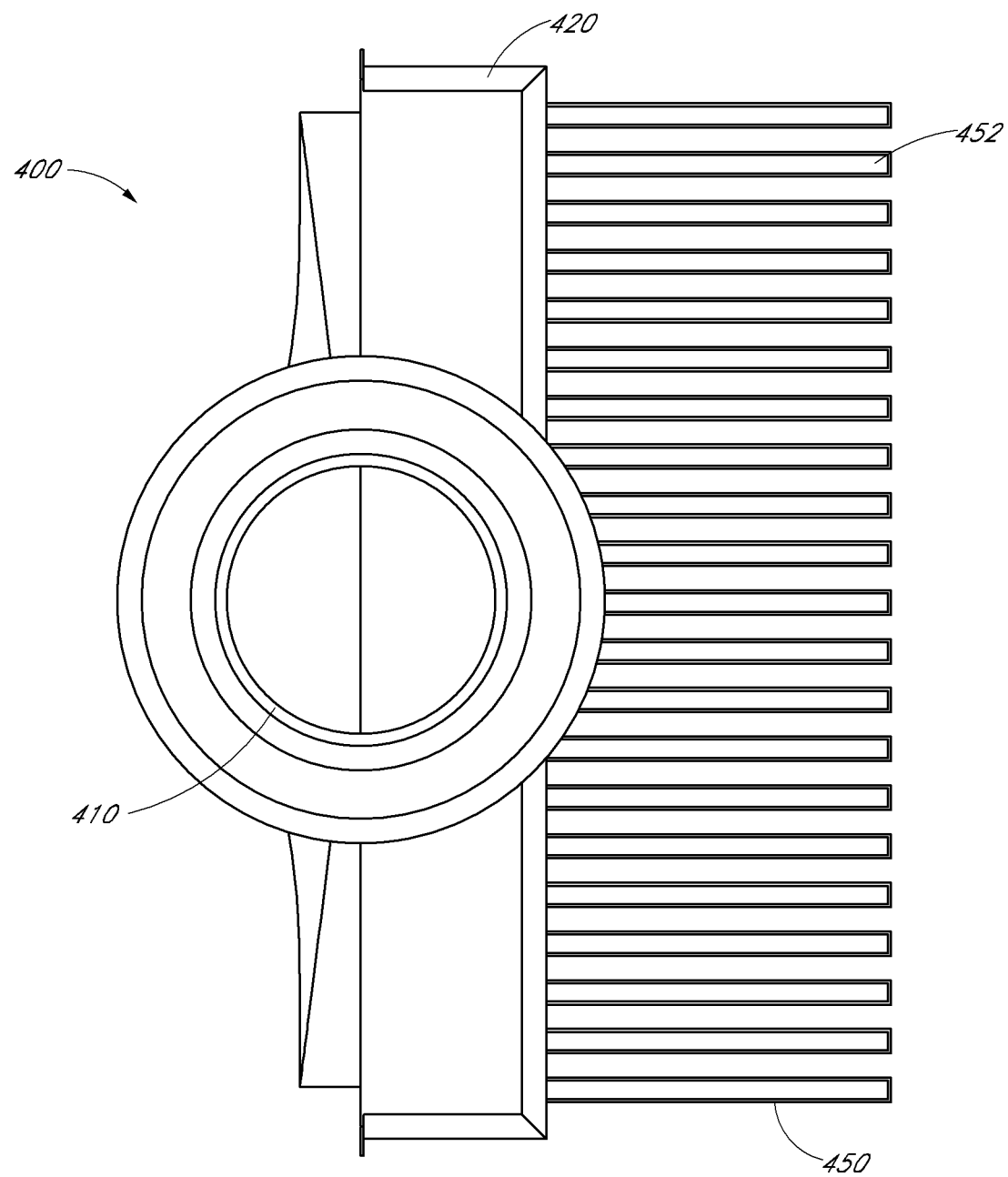
FIG. 21 schematically illustrates an end view of the example thermoelectric assembly of FIG. 20.

FIG. 20 schematically illustrates an example thermoelectric assembly 400 comprising a fluid conduit 410 having a first surface 412, a housing 420 having a second surface, a plurality of thermoelectric elements 430, a plurality of electrically conductive and thermally conductive shunts 440, and a plurality of heat exchangers 450 in thermal communication with the housing 420 and extending away from the housing 420. The plurality of thermoelectric elements 430 can be sandwiched between, in thermal communication with, and electrically isolated from the first surface 412 and the second surface 422. The plurality of shunts 440 can be in thermal communication and electrical communication with the plurality of thermoelectric elements 430. The plurality of shunts 440 can comprise a first set of shunts 442 in thermal communication with the fluid conduit 410 and a second set of shunts in thermal communication with the housing 420. FIG. 21 schematically illustrates an end view of the example thermoelectric assembly 400 of FIG. 20.

The fluid conduit 410 can comprise a metal flat-shaped tube (e.g., for low temperature fluid to flow through) and at least a portion of the first surface 412 can be substantially flat. The fluid conduit 410 can comprise an inlet 414 and an outlet 416. The housing 420 can comprise one or more metal layers, and the second surface can be substantially flat. As shown in FIGS. 20 and 21, the plurality of heat exchangers 450 can comprise a plurality of fins 452 extending away from the housing 420. These fins 452 can be configured to be in thermal communication with a second fluid (e.g., hot gas) flowing across the fins 452. In certain configurations, a heat path passes from the second fluid, through the fins 452, through the housing 420, the plurality of shunts 440, the plurality of thermoelectric elements 430, and the fluid conduit 410, to the first fluid flowing through the fluid conduit 410.

The thermoelectric assembly 400 can further comprise at least one electrically insulating layer (not shown) between the fluid conduit 410 and the plurality of shunts 440, which can prevent shorts between the plurality of shunts 440. For example, the fluid conduit 410 can be coated with a dielectric layer. The thermoelectric assembly 400 can further comprise at least one electrically insulating layer (not shown) between the housing 420 and the plurality of shunts 440, which can prevent shorts between the plurality of shunts 440. For example, the housing 420 can be coated with a dielectric layer. These electrically insulating layers can electrically isolate the plurality of shunts 440 from the fluid conduit 410 and from the housing 440, while the first set of shunts 442 are in thermal communication with the fluid conduit 410 and the second set of shunts 444 are in thermal communication with the housing 420. The thermoelectric assembly 400 can further comprise at least one compliant conductive interface between the plurality of thermoelectric elements 430 and the plurality of shunts 440 (e.g., thermally conductive grease) to ensure a good thermal contact and a good electrical contact.

The plurality of shunts 440 (e.g., copper pads) can be positioned between the fluid conduit 410 and the plurality of thermoelectric elements 430 and between the housing 420 and the plurality of thermoelectric elements 430. The plurality of thermoelectric elements can comprise n-type thermoelectric elements 432 and p-type thermoelectric elements 434. The plurality of shunts 440 and the plurality of thermoelectric elements 430 can be configured such that the n-type thermoelectric elements 432 are in series electrical communication with the p-type thermoelectric elements 434, an example of which is shown in FIG. 20. For example, each shunt 440 can be populated with at least one n-type thermoelectric element 432 and at least one p-type thermoelectric element 434 at opposite ends of the shunt 440. This "stonehenge" configuration allows the thermoelectric assembly 400 to build up a higher voltage since the thermoelectric elements 430 are connected in series with one another. With the thermoelectric elements 430 mounted on the cold side of the thermoelectric assembly 400, the impact of thermal expansion can be minimized.

In certain such configurations, an electrical current path can pass through a first shunt of the first set of shunts 442, at least one n-type thermoelectric element 432, a first shunt of the second set of shunts, at least one p-type thermoelectric element 434, and a second shunt of the first set of shunts 442. In some configurations (e.g., in the "stonehenge" configuration shown in FIG. 20), the plurality of shunts 440 and the plurality of thermoelectric elements 430 can be configured such that an electrical current passes through the plurality of shunts 440 and the plurality of thermoelectric elements 430 in a serpentine path. In some configurations, the plurality of shunts 440 and the plurality of thermoelectric elements 430 can form one or more stacks between the first surface 412 and the second surface in which the electrical current is generally axial to the one or more stacks.

Figure 22:
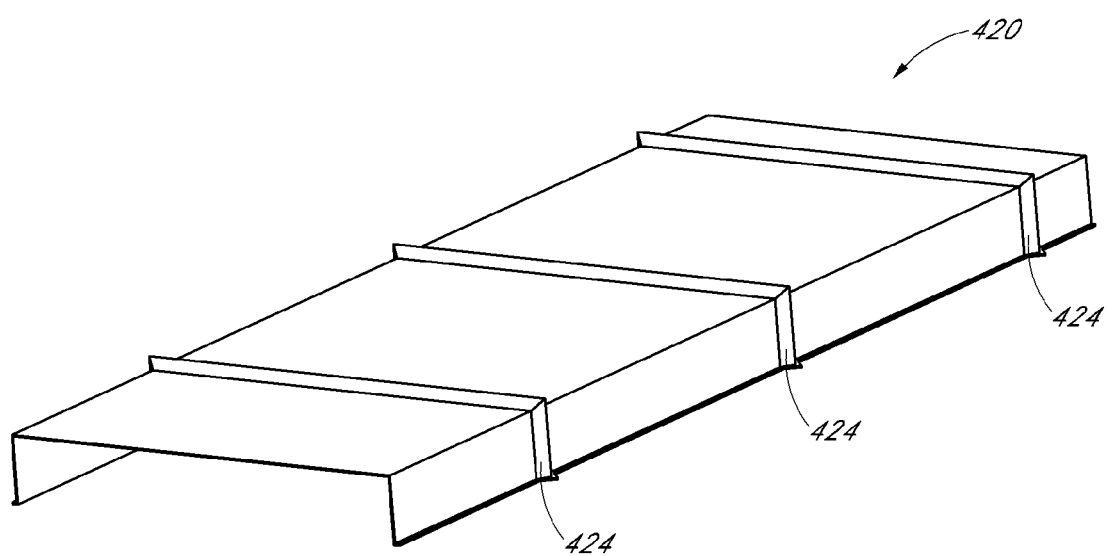
FIG. 22 schematically illustrates an example housing comprising a plurality of folds extending along the width of the housing.

The housing 420 can comprise one or more folds 424 configured to be compliant (e.g., flexible and configured to deform elastically) in response to motion among portions of the thermoelectric assembly 400 (e.g., motion comprising thermal expansion or contraction within the thermoelectric assembly 400 or motion caused by mechanical shocks to the thermoelectric assembly 400). For example, as shown in FIGS. 20 and 22, these folds 424 can extend along or generally along the width of the housing 420. In configurations in which the second set of shunts are arranged in a plurality of rows, the one or more folds 424 can be positioned between adjacent rows of the plurality of rows. In configurations in which the plurality of heat exchangers 450 are arranged in a plurality of rows, the one or more folds 424 can be positioned between adjacent rows of the plurality of rows. The folds 424 can be positioned to allow movement of portions of the housing 420, thereby minimizing stress on the thermoelectric elements 430 due to mismatches of thermal expansion between the housing 420 and the fluid conduit 410 (e.g., more elongation of the housing 420 than the fluid conduit 410).

The plurality of thermoelectric elements 430 can be enclosed (e.g., hermetically) within the housing 420. For example, the housing 420 can comprise a first portion and a second portion that are joined or sealed together and a gas can be enclosed (e.g., hermetically) within the housing 420. In configurations in which the housing 420 covers the entire thermoelectric assembly 400, the housing 420 can be designed to minimize the thermal losses between the hot and cold sides of the thermoelectric assembly 400 (e.g., by being only in contact with the fluid conduit 410 at the inlet 414 of the fluid conduit 410 and at the outlet 416 of the fluid conduit 410.

Figure 23A:
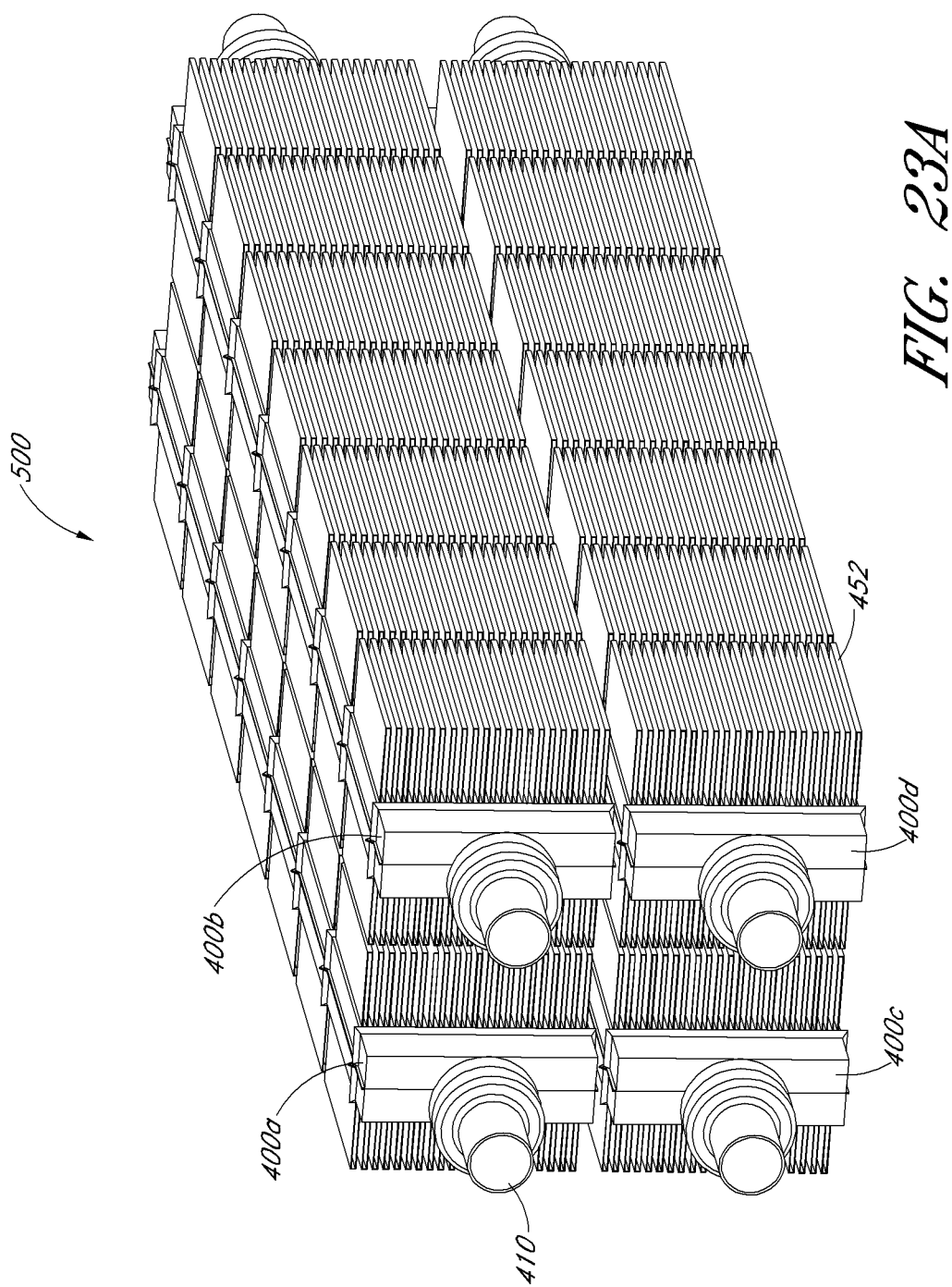
Figure 24:
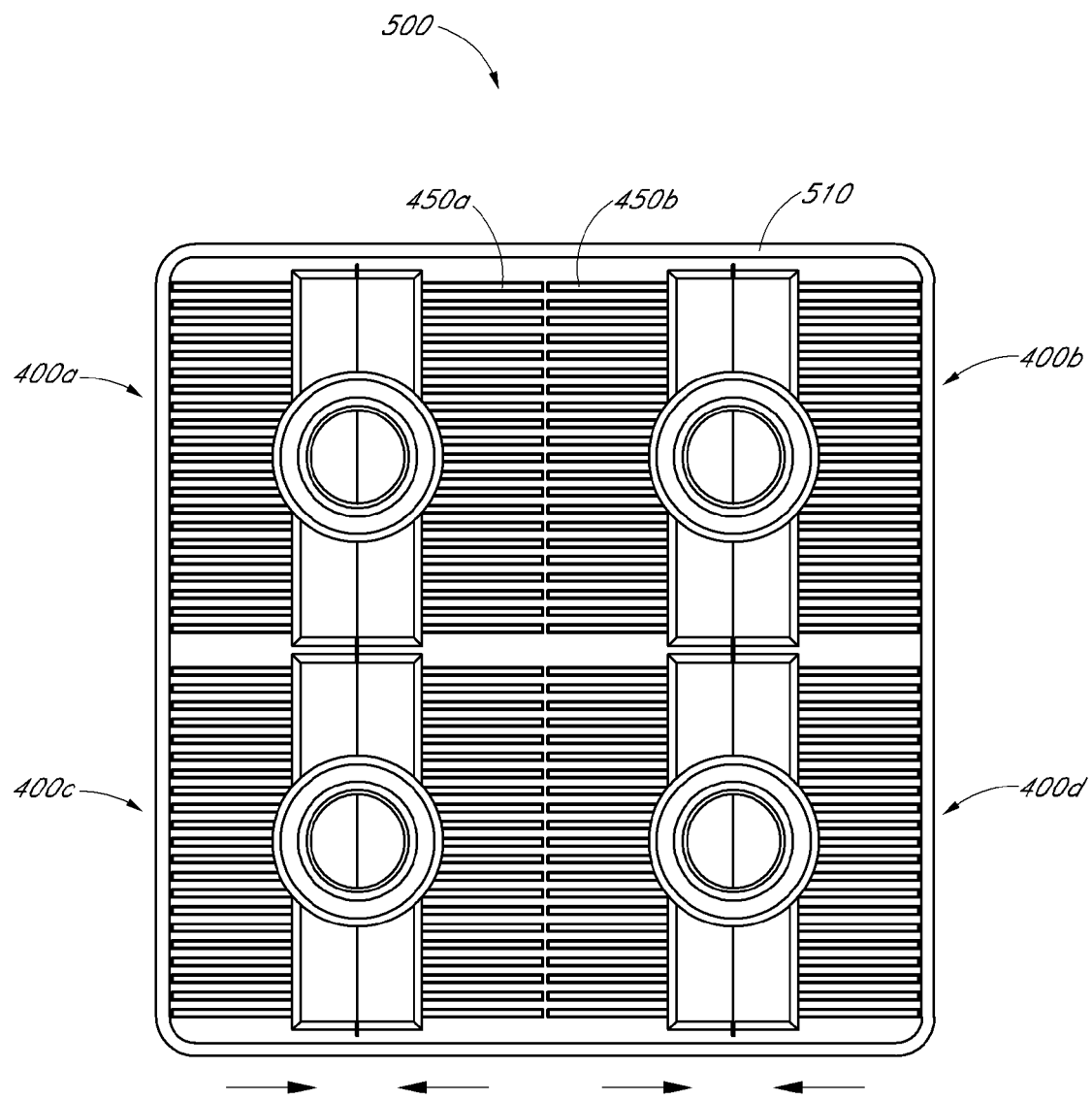
FIG. 24 schematically illustrates example compressive forces in a thermoelectric system comprising a plurality of thermoelectric assemblies in accordance with the example thermoelectric assembly of FIGS. 20-22.

FIGS. 23A, 23B, and 24 schematically illustrate example thermoelectric systems 500 each comprising a plurality of thermoelectric assemblies 400. The thermoelectric system 500 can comprise a first thermoelectric assembly 400a and a second thermoelectric assembly 400b. For example FIGS. 23A and 23B show two configurations of four thermoelectric assemblies 400a, 400b, 400c, 400d where high temperature gas flows through or across the fins 452 (e.g., rectangular) of the plurality of heat exchangers 450 and low temperature fluid flows through the fluid conduits 410 (e.g., center tubes). The fins 452 and the fluid conduits 410 can be of various shapes or materials depending on usage. The thermoelectric assemblies 400 can be configured to be stacked on top of one another or alongside one another The thermoelectric system 500 can further comprise a frame 510 holding the first thermoelectric assembly 400a and the second thermoelectric assembly 400b. The fluid conduit 410a of the first thermoelectric assembly 400a can be parallel or generally parallel to the fluid conduit 410b of the second thermoelectric assembly 400b. The plurality of heat exchangers 450a of the first thermoelectric assembly 400a and the plurality of heat exchangers 450b of the second thermoelectric assembly 400b can be configured to apply a compressive force (shown by arrows) to one another upon thermal expansion of at least one of the first thermoelectric assembly 400a and the second thermoelectric assembly 400b.

As shown in FIG. 24, this compressive force can be in a direction generally perpendicular to the fluid conduits 410a, 410b. The compressive force can increase the heat transfer between the fluid conduit 410 and the plurality of heat exchangers 450 of at least one of the first thermoelectric assembly 400a and the second thermoelectric assembly 400b. With the thermoelectric assemblies 410 positioned side-by-side, the fins 452 of the first thermoelectric assembly 400a can expand when the first thermoelectric assembly 410a heat up, and can contact the fins 452 of the adjacent second thermoelectric assembly 410b, resulting in a compression force on the thermoelectric elements 430 within the thermoelectric assemblies 400, thereby improving the heat transfer between the hot and cold sides of the thermoelectric assemblies 400.

TEG Architecture and Temperature Compensation

The thermoelectric elements can be arranged in various cartridge configurations to achieve appropriate properties. In such designs, the following considerations can be important for effective function: (a) a relatively uniform force (pressure) can be maintained on the thermoelectric elements throughout cycling over all operating temperatures, (b) shear and tensile stresses can be minimized, and advantageously eliminated, over the operating temperature range, (c) parasitic losses from electrical and thermal connections at both the hot and cold ends of the thermoelectric elements can be sufficiently low as to not adversely impact system power output, (d) the thermoelectric assembly or system can be cost effective for the intended application, and (e) either the thermoelectric elements or the thermoelectric system can be capable of being sealed against atmospheric constituents, internal fluids which are harmful to the system (such fluids may be utilized to control temperature or achieve other purposes). In operation, the hot and cold sides are exposed to large temperature differentials. As a result, the thermoelectric elements can have a large temperature gradient in the direction of current flow. In traditional configurations, this results in large thermally induced shear stresses and uneven compressive forces on TE elements. Typically, the forces change with the temperature differential between the hot and cold sides. Three basic configurations and several variants are described below which reduce or eliminate the unwanted stresses and maintain relatively uniform pressure on the thermoelectric elements.

Figure 25B:
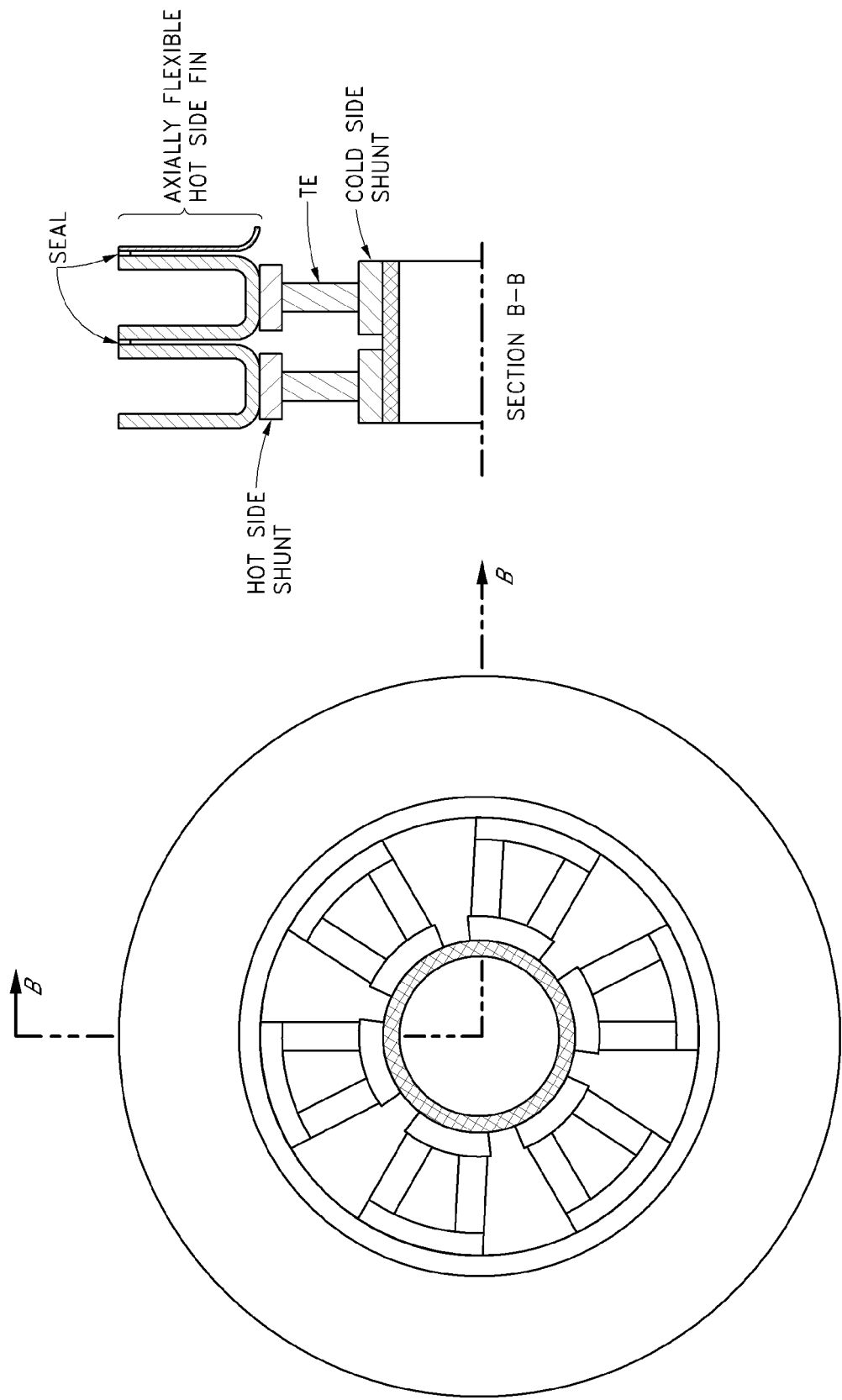
FIG. 25B schematically illustrates axially connected example thermoelectric elements in a stonehenge configuration.

FIGS. 25A and 25B schematically illustrate example adaptations of the stonehenge configuration which reduce thermal stresses resulting from temperature gradients which arise during operation. FIG. 25A shows radially connected thermoelectric elements in a stonehenge configuration with two thermoelectric elements in parallel and eight sets in series. In this example configuration, the thermoelectric elements are connected in n- and p-couples radially around the central core (e.g., cold side) in a series connection and each couple is connected axially to an adjacent couple in parallel. FIG. 25B shows axially connected thermoelectric elements in a stonehenge configuration with two pairs of thermoelectric elements connected axially in series. The hot side compliant fins accommodate axial thermal expansion to reduce shear stresses on the thermoelectric elements. As depicted in FIG. 25B, the couples can be connected in parallel pairs radially and in series axially. Also, several (e.g., 2 to 50) of the thermoelectric elements can be in series in the axial direction and in pairs or other groupings radially.

Advantageously, the cartridge system can be constructed of sections of structures, such as the structure shown in FIG. 25A. Relative motion growth of the hot side with respect to the cold side can be such that the locations of the thermoelectric cold and hot ends match the length change of the thermoelectric elements due to thermal expansion as hot and cold side temperatures change during operation. Advantageously, this can be achieved by matching the hot side outer ring size change to that from the thermoelectric element and the hot and cold shunts. Thus, if the thermoelectric has a coefficient of thermal expansion (CTE) of about $20 \times 10^{-6}$ mm/mm, the hot side ring can have a CTE of about ¼ that value, or about $5 \times 10^{-6}$ for the relative sizes depicted in FIGS. 25A and 25B. For example, the hot side tube can be made from a low CTE material such as molybdenum, copper/graphite composite, a suitable ceramic or the like. Also, the hot and/or cold sides can have expansion features, such as folds as shown in FIG. 27B, to allow motion to accommodate relative size change between the hot side and the thermoelectric elements. Further, the hot side shunt can be thickened and be constructed of a suitable material that has a very high CTE (such as material systems used to make the high expansion side of bimetals) to provide an added degree of temperature compensation. The axial dimensional change can be accommodated by choosing the axial shunt CTE so as to reduce or eliminate shear stresses induced by the relative dimensional changes between the thermoelectric element/shunt subassembly and that of the hot side ring. Between rings, accommodation can be made through flexure of the connection between adjacent rings, as illustrated in FIG. 27B. The radial density, form factor, and dimensions of the thermoelectric elements and housing components can be chosen to achieve desired properties (such as those described below).

FIG. 25A depicts modular designs in which the thermoelectric elements are connected electrically in series in the radial direction. Various numbers of thermoelectric elements can be arrayed around the cold central core, and range from close packing to thermoelectric elements spaced out like spokes on a wheel. The radial density, form factor, and dimensions of the thermoelectric elements and housing components can be chosen to achieve desired properties.

FIGS. 26A and 26B depict example modular designs in which the thermoelectric elements are arranged so that heat transfer and current flow through the elements is generally in a circumferential direction. Also, not shown are configurations in which the current flow is at an angle to the circumferential or axial directions. Described herein are configurations shown in which the current flow is generally perpendicular to both the radial and axial directions. The radial density, form factor, and dimensions of the thermoelectric elements and housing components can be chosen to achieve desired properties. For example, the components labeled "hot side" and "cold side" can be reversed so that hot fluid is in the center and cold fluid cools the outside. In another example, the hot side shunt may have compressibility to partially or fully compensate for differences in thermal expansion between hot and cold sides. A further hot side shunt can be electrically isolated from the compliant fins or the fins may include an electrically insulating material. In a further example, the cold side shunt may be electrically insulated from the thermoelectric elements by use of a via or insert or other structure, or a cold side heat exchanger may be electrically insulting or have an insulation between it and the cold side shunts. The cold side shunt may be constructed of an electrically insulating material.

Advantageously, for the design systems depicted in FIGS. 25A, 25B, 26A, and 26B, (a) the CTE of the thermoelectric elements, shunts, and rings can be chosen to reduce relative dimensional changes between the hot and cold sides of the thermoelectric elements and their respective attachment interfaces, (b) the materials, compliance provisions, and shapes can be chosen to minimize shear stresses over the operating temperature range, (c) the thermal impedance which is a function of the number of thermoelectric elements, their form factor (e.g., power density) per unit length, material properties, and heat transfer characteristics of the hot side heat source and cold side heat sink can be matched so as to provide effective performance from the resulting system, and (d) undesirable shear and tensile stresses can be minimized by thermal expansion provisions (such as those mechanisms described below) on the hot side heat source and the cold side heat sink.

Hot Side Heat Exchanger and Shunt Configurations.

Figure 27A:
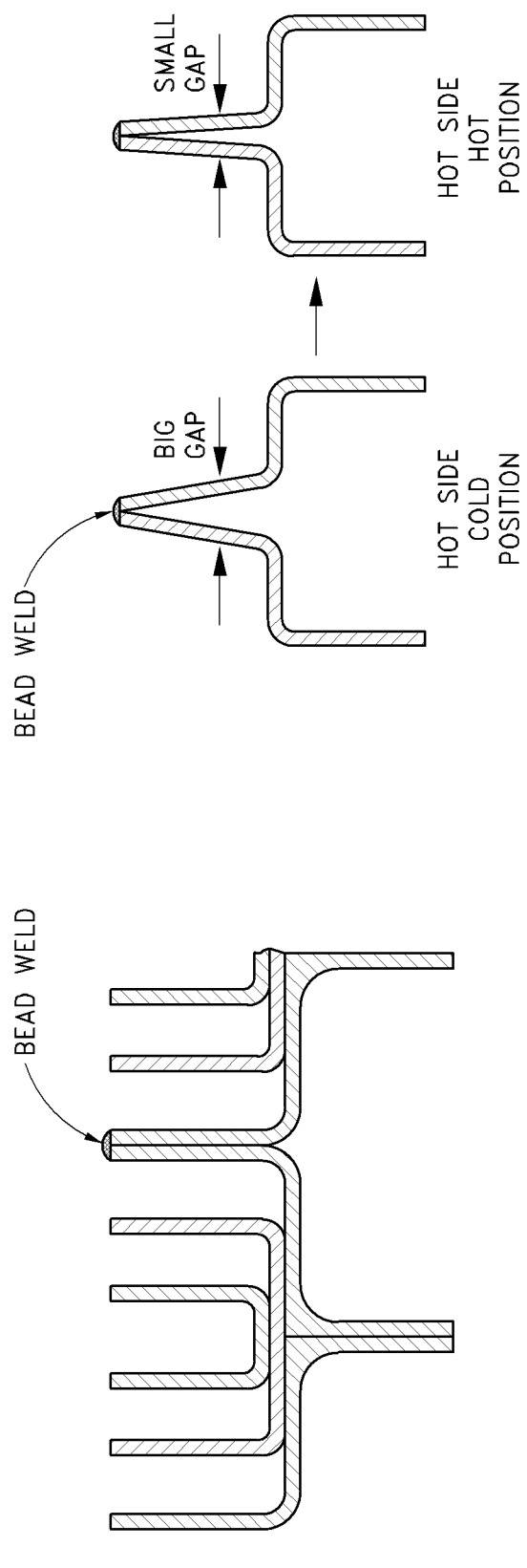
FIG. 27A schematically illustrates a portion of example hot side heat exchanger fins (one section shown shaded dark) that have a bead weld near the largest diameter of the fin structure.
Figure 27B:
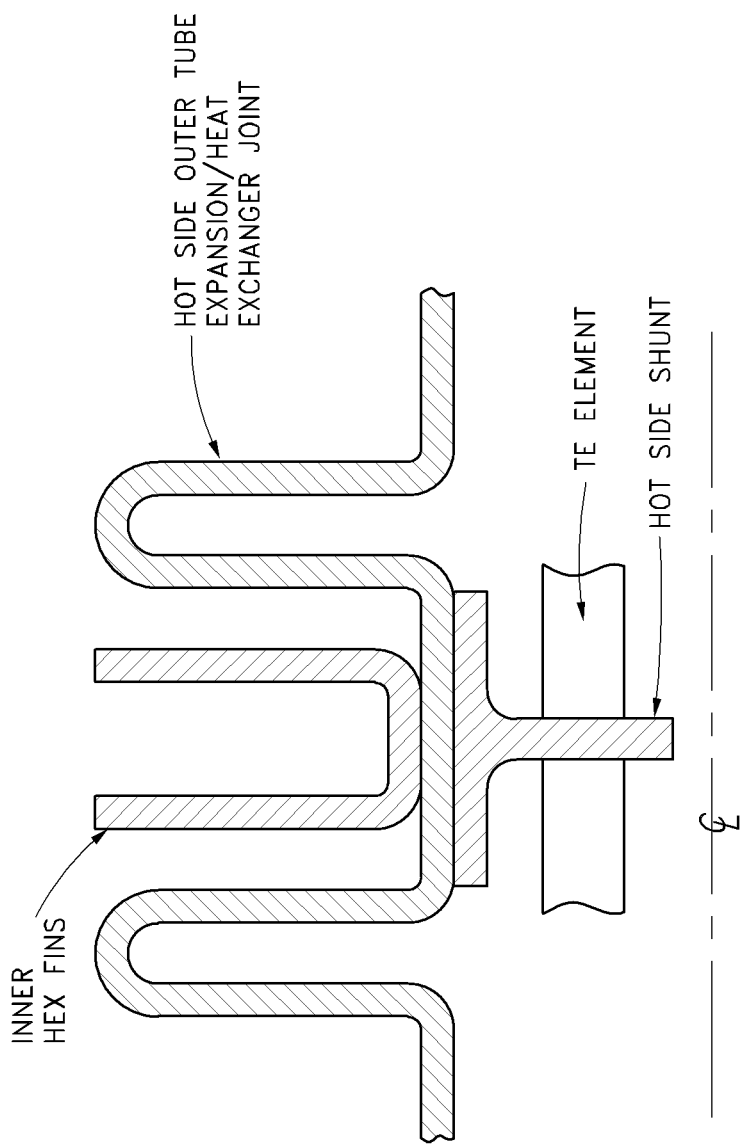
FIG. 27B schematically illustrates a flexure having an outer case which is a tube with flexures in it so that each hot side shunt can move independently with respect to other internal elements.

FIG. 27A shows a portion of example hot side heat exchanger fins (one section shown shaded dark) that have a bead weld near the largest diameter of the fin structure. Example purposes of the weld include provide structural support, align sections and provide a seal between the thermoelectric elements and the external environment. Advantageously, the fin structure depicted in FIG. 27A can be capable of flexing so as to accommodate dimensional changes within the system from the temperature difference between the hot and cold sides of the generator system during operation, provide a low resistance thermal path to collect thermal power from the hot side working fluid, and provide structural support and be an attachment surface with low thermal resistance to additional fins or other heat exchange elements (e.g., right side of FIG. 27A).

The right side of FIG. 27A shows one form of flexing motion that is accommodated and allows relative motion between the hot and cold sides. The shaded part of the left side of FIG. 27A is shown with large and small gap to show the flexure. Other flexural designs can be utilized in configurations described herein. As an example, the flexure depicted in FIG. 27B (e.g., expansion joints integrated into the tube segments), has an outer case which is a tube with flexures in it at desirable locations, such as between hot side shunts, so that each hot side shunt can move independently with respect to other internal elements. The sealing point is shown at near the outer most edge of the fin, but could also be at any other convenient location. The sealing surface could also be of any other suitable shape or construction, such as a bellows, diaphragm, or other shape. The mating parts need not be the same shape, for example the two surfaces can be shaped so as to form a rolled seal such as is done with beverage cans, projection welded assembles or any other suitable sealing system.

Figure 28A:
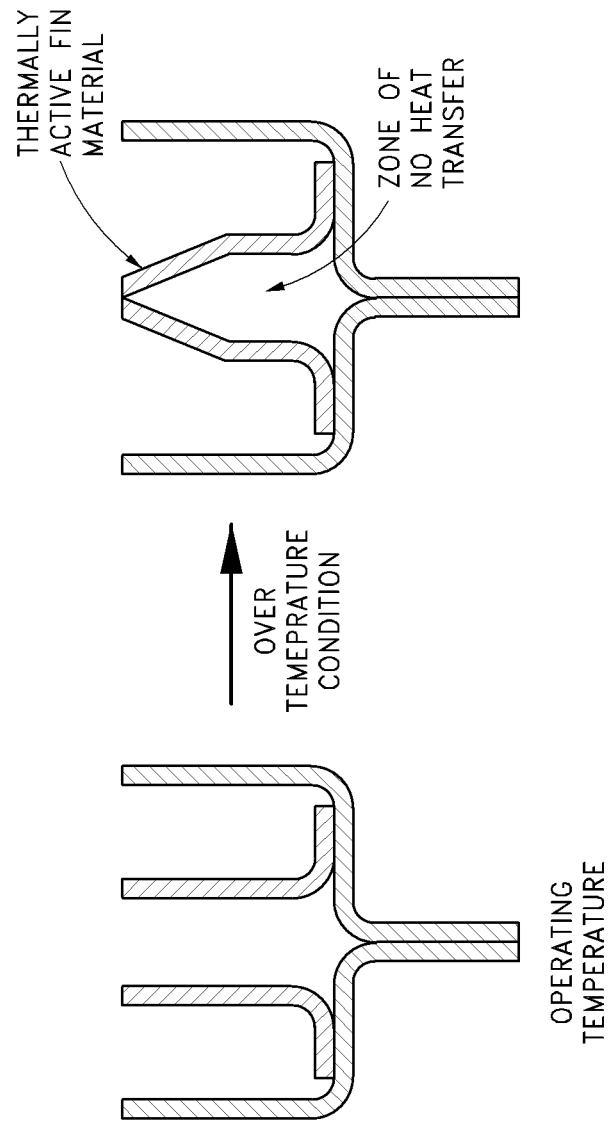
FIG. 28A schematically illustrates one example method for protecting the generator system from excess hot side fluid temperatures.
Figure 28B:
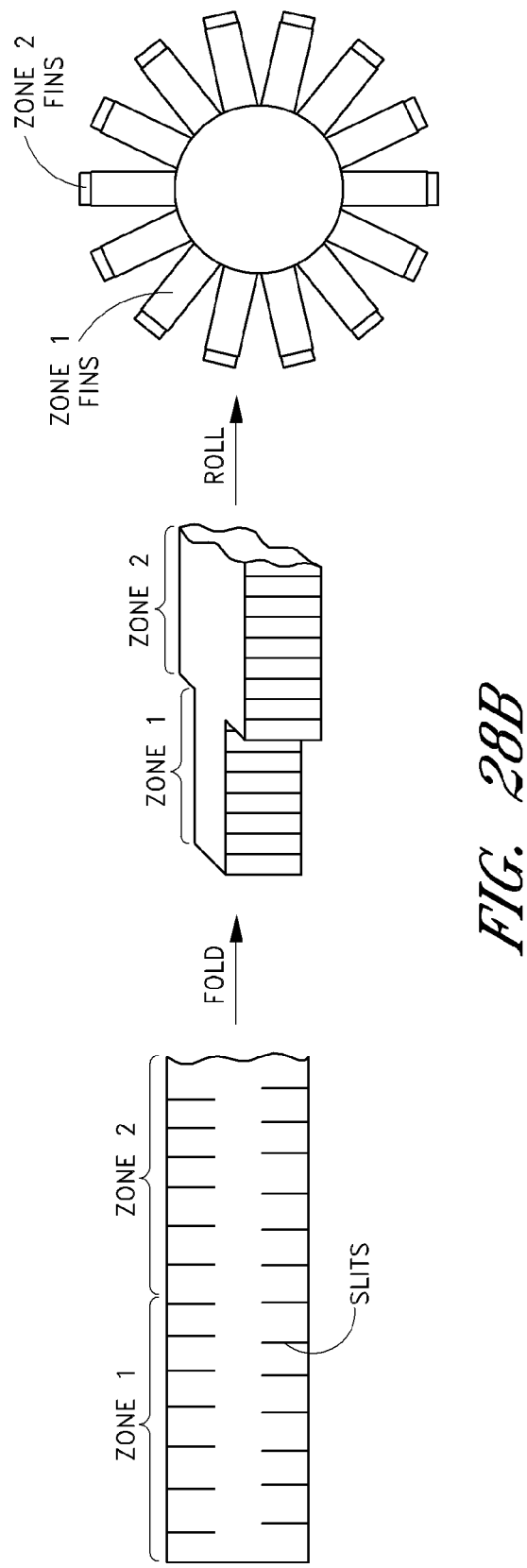
FIG. 28B schematically illustrates an example design for hot side inner heat exchange members that can be used to fabricate the heat exchanger structure depicted in FIG. 27B.

An example design for hot side inner heat exchange members is depicted in FIG. 28B, and can be used to fabricate the heat exchanger structure depicted in FIG. 27B. Flat stock, such as copper material, which may be clad with nickel, stainless steel or other suitable protective coating, can be formed into a strip. Slits can be formed, the material can be folded and then wrapped around the outer tube. The slits may have louvers, perforations or any other heat transfer enhancement features. The formed strip can be brazed, welded or otherwise attached to the outer hot side surface by any process that provides good thermal contact between the fin structure and the hot side thermoelectric elements.

It is noted that what is described herein as a "hot side" shunt, heat exchanger, or other component could be inverted in the sense that the position of the hot side could be in the interior and the corresponding "cold side" shunt, heat exchanger fins, and the like could be at the outside surface. Thus, the positions of the hot and cold sides could be switched. This can have several implications including the type of sealing that could be employed at the heat exchanger expansion feature depicted, for example, in FIGS. 27A and 27B. The seals can be, for example, an impermeable polymer, low temperature glass or and other low temperature suitable sealing compound, sealing method or combination of sealing mechanisms. The fins can be high thermal conductivity plastic, aluminum, any suitable composite material system or other suitable sealing structure. Also, it is noted that if the thermoelectric elements do not require sealing, for example, if they were sealed individually with a conformal coating, a design for the flexure to also provide sealing could be modified or eliminated. This design consideration can also be part of the configurations described herein. While several hot side configurations are discussed herein, the configurations described are not all of the possible configurations, as yet others are covered in other parts of the text and in drawings that are part of this disclosure but may not be depicted in this section.

High Temperature Operating Safety

FIG. 28A depicts one example method for protecting the generator system from excess hot side fluid temperatures. In this design, hot side heat exchanger elements can be constructed of a thermally active material such as a suitable bimetal, a phase change memory alloy, or any other suitable thermally active material or material system. At nominal operating temperature, the heat exchange elements collect hot side thermal power in an advantageous manner. As the hot side fluid temperature rises, the material system deforms so that heat transfer is reduced, slowing or halting temperature increase of the interior components, such as the hot side of the thermoelectric elements. The right side of FIG. 28B shows an example of the shape that could be taken by the hot side heat exchanger structure at higher temperatures. The fins can approach each other at their outermost surface, thereby reducing the surface area of the heat exchanger exposed to the hot side fluid, and effectively reducing the system's capacity to collect thermal power from the hot side fluid stream.

Figure 29A:
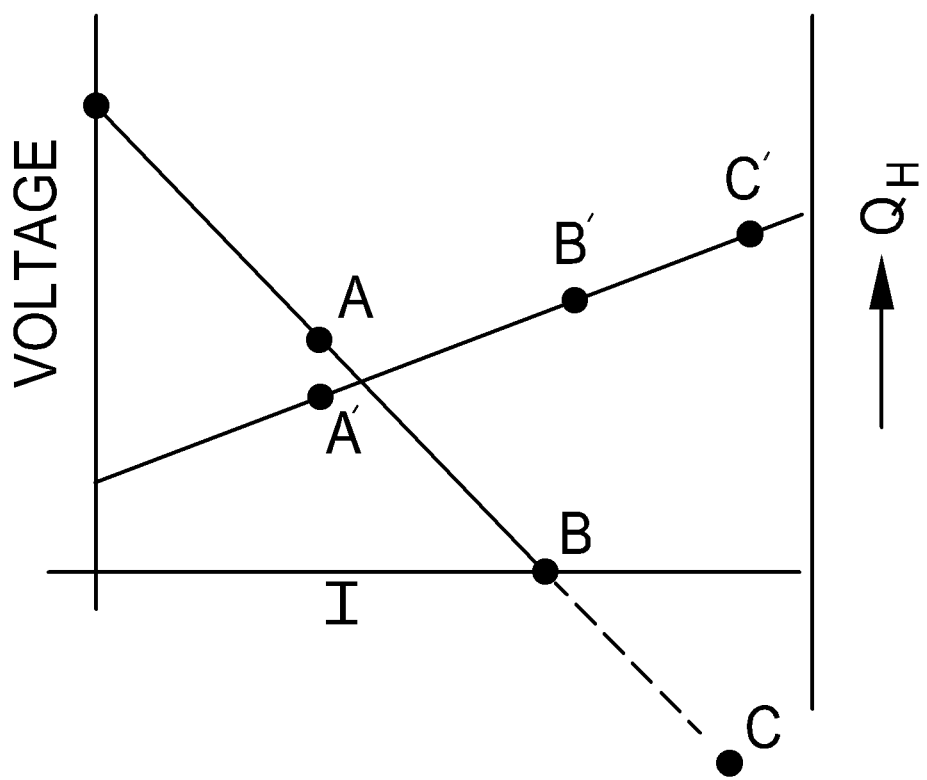
FIG. 29A shows the current versus voltage curve (I-V curve) for a thermoelectric device and on the same plot the current versus hot side heat flux ($Q_H$-I curve).
Figure 29B:
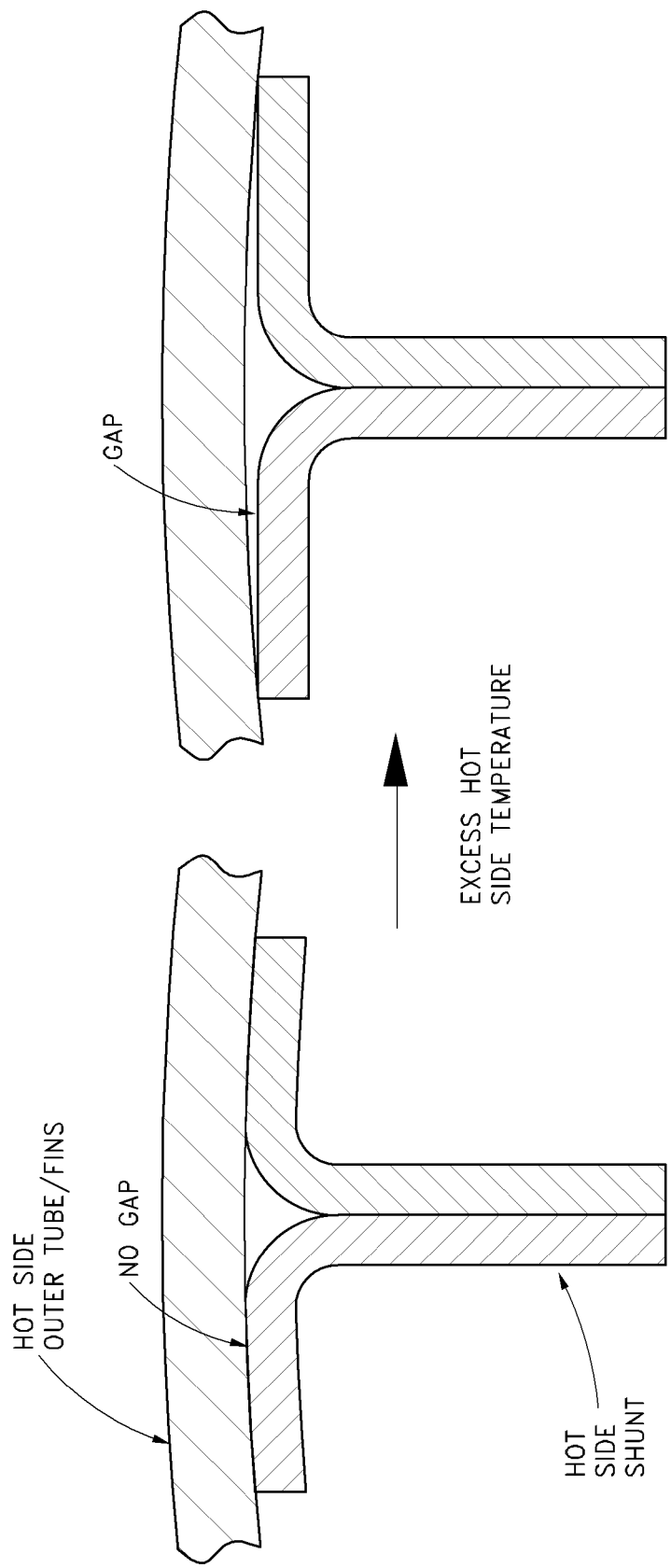
FIG. 29B schematically illustrates an example method for over temperature protection with a temperature active hot side thermal conductor.
Figure 29C:
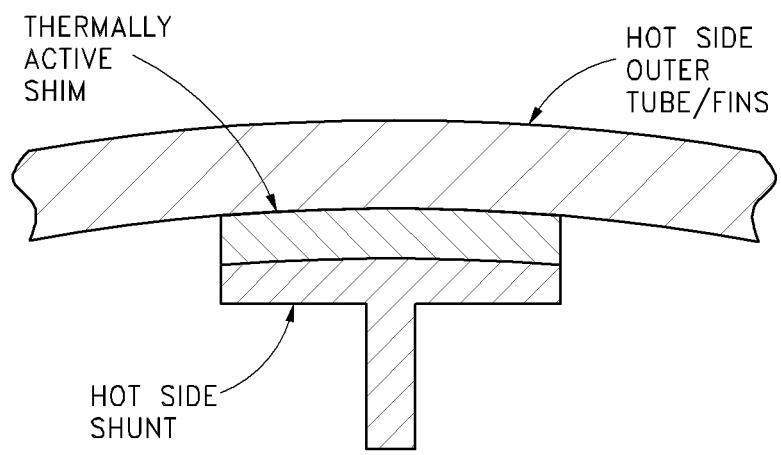
FIG. 29C schematically illustrates an example method for over temperature protection with a thermally active shim.

Other methods of protecting the system against excess hot side temperatures are described with the aid of FIG. 29A-29C. A part of certain configurations described herein is to utilize a property of thermoelectric element heat transport to protect the system. FIG. 29A shows the current versus voltage curve (I-V curve) for a thermoelectric device and on the same plot the current versus hot side heat flux ($Q_H$-I curve). The nominal operating condition is shown as point A on the I-V curve and A' on the I-$Q_H$ curve. At point A, power output of the system is high, often near optimum. Point B is the condition where the voltage is near zero, corresponding to the device operating with no external net voltage, hence in a shorted condition. The corresponding heat flux, $Q_H$, through the thermoelectric elements at B' is bigger, by about 10% to 50%. By external measurement, shorting the unit increases the apparent thermal conductance of thermoelectric elements. In turn, this will lower the hot side temperature of the thermoelectric element, helping protect it from higher external temperature. This effect can be somewhat further enhanced by applying electric power to the device (applying a reverse voltage). Overall, $Q_H$ can be increased by at least 15% by these mechanisms, giving a method of reducing the effect of higher external hot side fluid temperatures on the system. Shorting can be induced within the system by incorporating a thermally responsive safety switch, such as a bimetal snap disc switch, a positive temperature solid state switch or any other suitable mechanism.

An alternate method for over temperature protection is depicted in FIG. 29B which shows a temperature active hot side thermal conductor. A portion of the hot side shunt can be thermally active so that heat transfer from the hot side heat exchanger is reduced when the shunt is exposed to excessive temperatures. Another method is depicted in FIG. 29C, which shows a hot side shunt with a thermally active shim in which a material system is positioned so as to affect heat transfer between the hot side heat exchanger and the hot side of the TE element. Advantageously, the material can be a reversible phase change material with high thermal conductivity at nominal operating temperatures, but which drops at higher temperatures.

Cold Side Shunt and Heat Exchanger Configurations

Figure 30A:
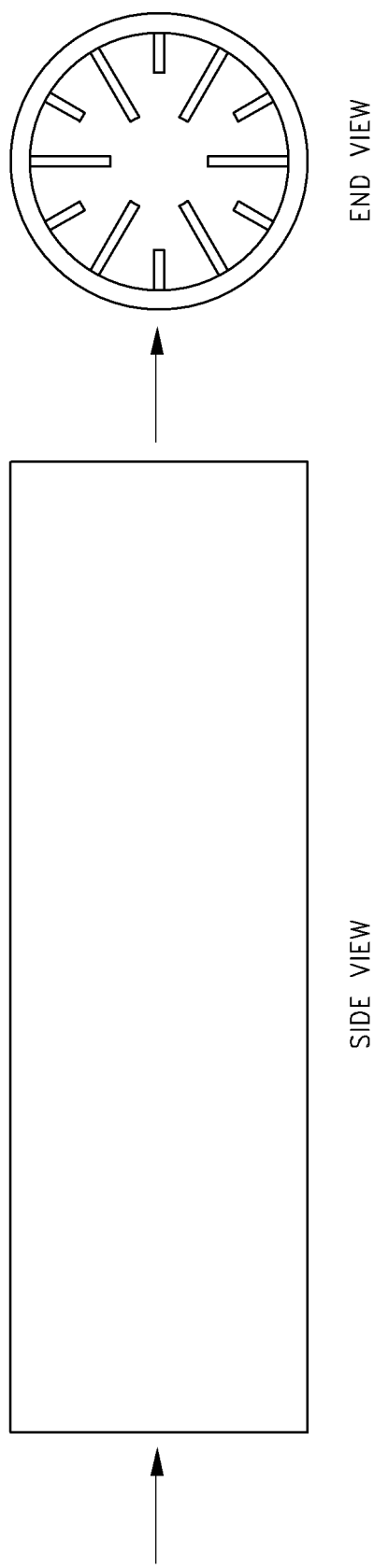
FIG. 30A schematically illustrates a cold side heat exchanger in which the conduit is a tube with an inlet at one end, an outlet at the other end, and internal heat exchange enhancement features.

FIG. 30A depicts a cold side heat exchanger in which the conduit is a tube with an inlet at one end, an outlet at the other end, and internal heat exchange enhancement features. For example, the tube could be an aluminum extrusion or a high thermal conductivity plastic injection molded assembly or extrusion. In the example design depicted, the cold side fluid enters one end and exits the opposite end. Advantageously, the cold side heat exchanger is anodized aluminum or aluminum otherwise fabricated to have a high thermal conductivity and electrical isolation connection to cold side shunts. For example, the cold side shunts could be permanently bonded to the anodized aluminum tube with highly thermally conductive epoxy. Alternately, a good thermal connection could be made with high thermal conductivity grease. Alternately, the shunt can be soldered or brazed to the tube to achieve good thermal contact with electrical isolation achieved with an electrically isolated insert in the cold side shunt as described elsewhere related to hot side shunt electrical isolation. These methods or any others that provide good thermal contact and electrical isolation can part of configurations described herein.

Figure 30B:
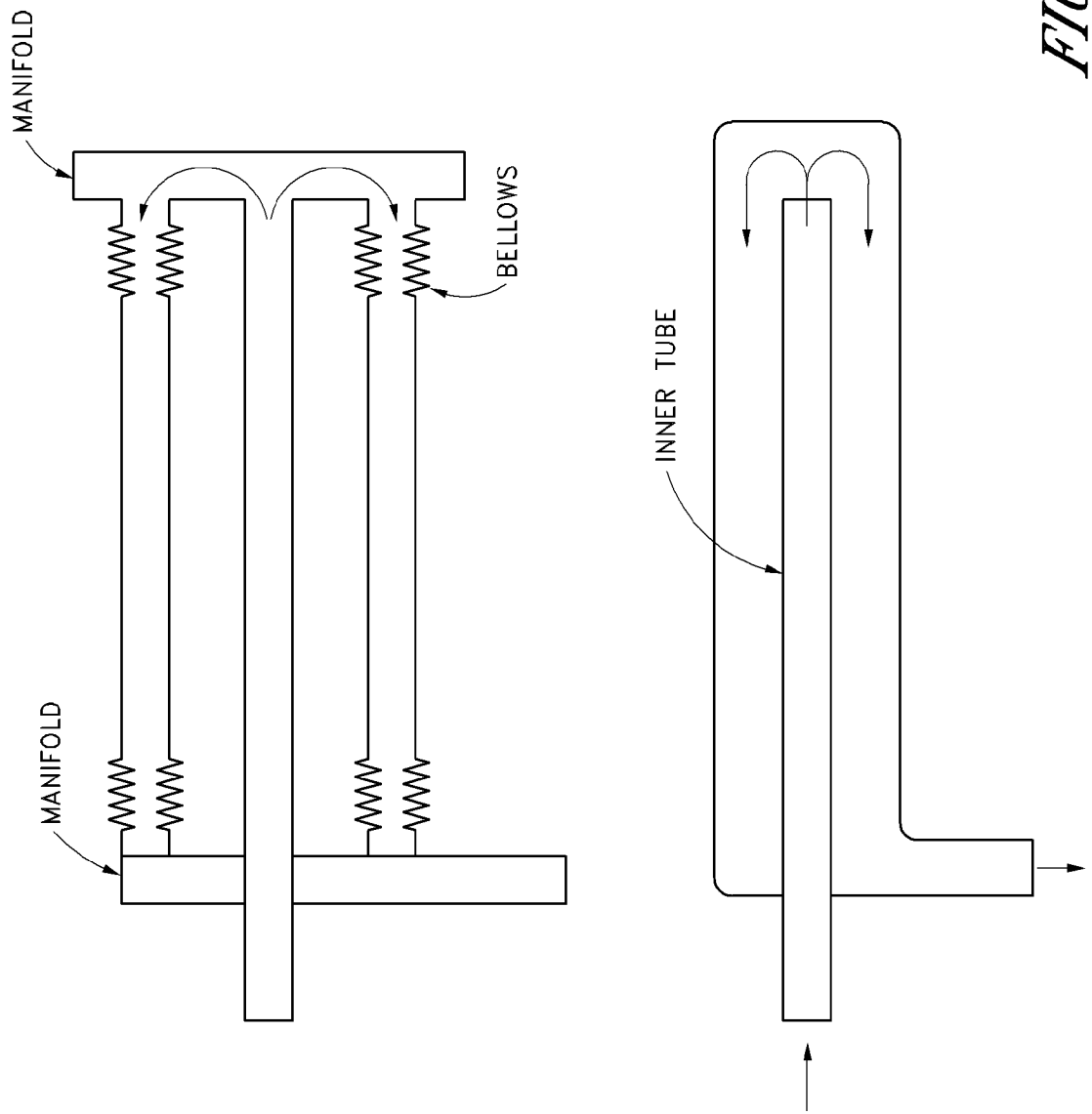
FIG. 30B schematically illustrates an example tube in a tube configuration in which both the cold side fluid inlets and outlets are from the same end.

FIG. 30B depicts a tube in a tube configured in which both the cold side fluid inlets and outlets are from the same end. FIG. 30B also shows a cold side heat exchanger system with a single source central tube (depicted) or the reverse, with multiple sources and a single central collector, (not pictured) for distribution of cold side working fluid. Bellows can be used in this design, as well as other tube designs to allow flexure to compensate for thermal movement of the cold side members in relation to hot side members during heating and cooling.

Figure 30C:
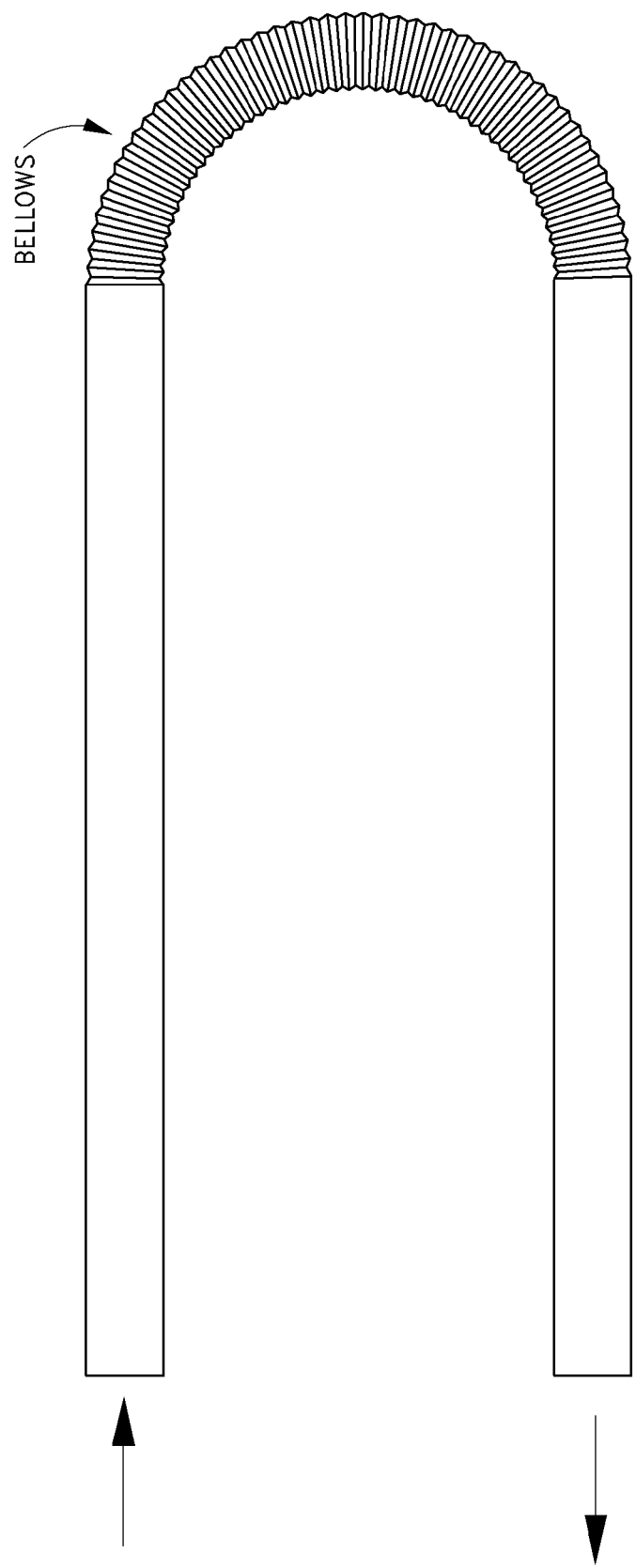
FIG. 30C schematically illustrates an example generally U shaped cold side heat exchanger system in which the inlet and outlet are at the same end but not generally coaxial.

FIG. 30C depicts a generally U shaped cold side heat exchanger system in which the inlet and outlet are at the same end but not generally coaxial. In addition to the two tubes depicted, fabrication with any other number of tubes can be part of configurations described herein. In any of the configurations, the cold side shunt heat exchanger systems can have internal heat transfer enhancements, and use construction materials and techniques as described under FIG. 30A.

The thermoelectric systems, assemblies, and components depicted in FIGS. 25-30 are shown as having round cross-sections. Alternate cross-sectional shapes, such as ovals, ellipses, rectangles, and any other useful shape can be part of the configurations described herein. Hot side thermoelectric elements and cold side components can be adjusted together to make alternate shapes. Further, all designs depicted in FIGS. 25-30 show external heat flow perpendicular or generally perpendicular to the principal axis of symmetry. The external heat exchanger fins or other thermal power gathering components can be arranged so the external working fluid flow is generally axial (e.g., in the general direction of internal fluid flow). Also, the components can be arrayed so that the system is relatively short or long, depending on the form factor of the application and the desired power output.

Figure 31:
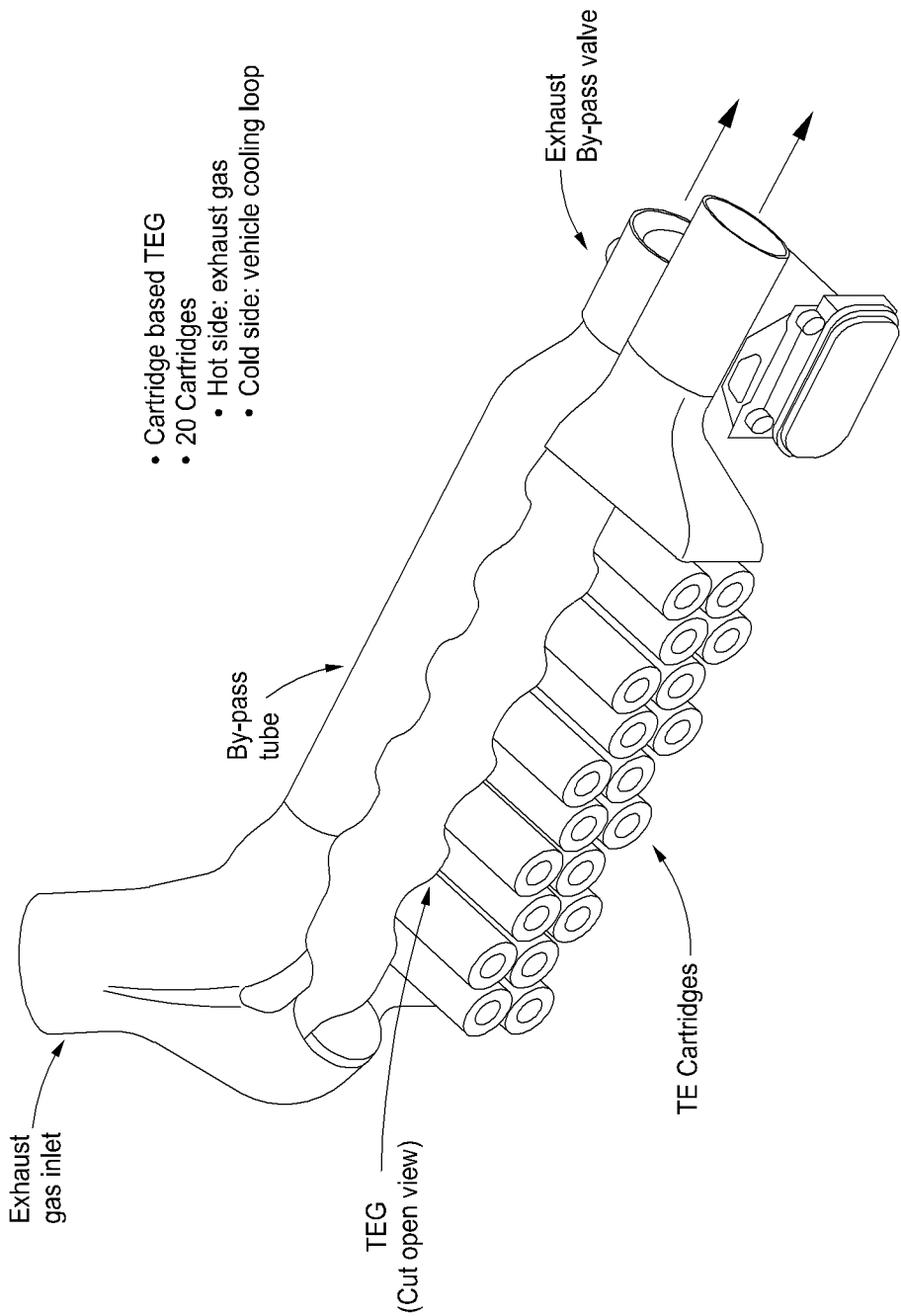
FIG. 31 schematically illustrates an example application of a TEG in fluid communication with an exhaust of an engine.

FIG. 31 illustrates an example application of a TEG such as those described above. An exhaust of an engine (e.g., engine of a vehicle) can be in fluid communication with a hot side input of the TEG. The hot side input can be in fluid communication with one or more thermoelectric assemblies or cartridges. For example, the TEG may have two or more TE cartridges. FIG. 31 is illustrated with twenty TE cartridges. The exhaust of the engine may include a bypass so that at least some of the exhaust can bypass the TEG. For example, the bypass may have a valve system (e.g., comprising at least one proportional valve configured to allow variable flow apportionment between the bypass and the TEG) so that fluid flow can be selected and/or varied to flow through the TEG or the bypass. For example, the valve system can comprise one or more valves configured to direct a portion of the fluid flow through the bypass and portions of the fluid flow through the TEG. The cold side inputs of the thermoelectric cartridges may be in fluid communication with a cold side input of the TEG. For example, the cold side input of the TEG may be in fluid communication with a vehicle's cooling loop.

Discussion of the various configurations herein has generally followed the configurations schematically illustrated in the figures. However, it is contemplated that the particular features, structures, or characteristics of any configurations discussed herein may be combined in any suitable manner in one or more separate configurations not expressly illustrated or described. In many cases, structures that are described or illustrated as unitary or contiguous can be separated while still performing the function(s) of the unitary structure. In many instances, structures that are described or illustrated as separate can be joined or combined while still performing the function(s) of the separated structures.

Various configurations have been described above. Although the invention has been described with reference to these specific configurations, the descriptions are intended to be illustrative and are not intended to be limiting. Various modifications and applications may occur to those skilled in the art without departing from the true spirit and scope of the invention as defined in the appended claims.

What is claimed is:

1. A thermoelectric system comprising:
   at least a portion of a tube configured to allow a first fluid to flow through the at least a portion of the tube along an axial direction of the tube;

a first thermoelectric assembly and a second thermoelectric assembly, wherein each of the first thermoelectric assembly and the second thermoelectric assembly is in thermal communication with the tube and with a second fluid and comprises:
  at least one first shunt extending around an outer perimeter of the tube generally perpendicularly to the axial direction;
  at least one first thermoelectric element in thermal communication and in electrical communication with the at least one first shunt;
  at least one second thermoelectric element in thermal communication and in electrical communication with the at least one first shunt, wherein at least a portion of the at least one first shunt is sandwiched between the at least one first thermoelectric element and the at least one second thermoelectric element, wherein the at least one first thermoelectric element and the at least one second thermoelectric element are electrically isolated from the tube; and
  at least one heat exchanger in thermal communication with the at least one first shunt and in thermal communication with the second fluid, the at least one heat exchanger comprising a plurality of fins extending generally outwardly from the at least one first shunt;
at least one compliant element between and mechanically coupled to the at least one heat exchanger of the first thermoelectric assembly and the at least one heat exchanger of the second thermoelectric assembly; and
at least one second shunt extending around the outer perimeter of the tube generally perpendicularly to the axial direction and in thermal communication with the tube, wherein at least a portion of the at least one second shunt is electrically isolated from the tube and is in thermal communication with, in electrical communication with, and sandwiched between the at least one second thermoelectric element of the first thermoelectric assembly and the at least one first thermoelectric element of the second thermoelectric assembly,
wherein the first thermoelectric assembly, the at least one second shunt, and the second thermoelectric assembly are in series electrical communication with one another such that the thermoelectric system has an electrical current flow path through the at least one first thermoelectric element of the first thermoelectric assembly, the at least one first shunt of the first thermoelectric assembly, the at least one second thermoelectric element of the first thermoelectric assembly, the at least one second shunt, the at least one first thermoelectric element of the second thermoelectric assembly, the at least one first shunt of the second thermoelectric assembly, and the at least one second thermoelectric element of the second thermoelectric assembly.

2. The thermoelectric system of claim 1, wherein the current flow path is in a direction generally parallel to the axial direction.

3. The thermoelectric system of claim 1, wherein the at least one first shunt encircles the tube, and the at least one second shunt encircles the tube.

4. The thermoelectric system of claim 1, wherein each of the first thermoelectric assembly and the second thermoelectric assembly further comprises at least one electrically insulating layer electrically isolating the at least one first shunt from the at least one heat exchanger.

5. The thermoelectric system of claim 1, wherein at least one of the at least one heat exchanger of the first thermoelectric assembly and the at least one heat exchanger of the second thermoelectric assembly is compliant in response to motion among portions of the thermoelectric system.

6. The thermoelectric system of claim 1, wherein the at least one second shunt is configured to slide along the tube and to remain in thermal communication with the tube in response to thermal expansion or contraction within the thermoelectric system.

7. The thermoelectric system of claim 1, wherein the at least one second shunt is responsive to increases of temperature by increasing a compressive force in a radial direction applied to the tube.

8. The thermoelectric system of claim 1, wherein the current flow path passes once through the first thermoelectric assembly, the at least one second shunt, and the second thermoelectric assembly.

9. The thermoelectric system of claim 1, wherein the at least one first shunt comprises a first segment, a second segment, and an electrically insulating material between the first segment and the second segment, the at least one first thermoelectric element comprising at least one first p-type thermoelectric element and at least one first n-type thermoelectric element, the at least one second thermoelectric element comprising at least one second p-type thermoelectric element and at least one second n-type thermoelectric element, wherein the first segment of the at least one first shunt is sandwiched between the at least one first p-type thermoelectric element and the at least one second n-type thermoelectric element, and the second segment of the at least one first shunt is sandwiched between the at least one first n-type thermoelectric element and the at least one second p-type thermoelectric element.

10. The thermoelectric system of claim 1, wherein the at least one first shunt comprises a plurality of first segments with electrically insulating material between at least some of the first segments, the at least one first thermoelectric element comprising a plurality of p-type thermoelectric elements and a plurality of n-type thermoelectric elements, the at least one second thermoelectric element comprising a plurality of p-type thermoelectric elements and a plurality of n-type thermoelectric elements, wherein each first segment of the plurality of first segments is sandwiched between a thermoelectric element of the at least one first thermoelectric element and a thermoelectric element of the at least one second thermoelectric element having different doping types.

11. The thermoelectric system of claim 10, wherein the at least one second shunt comprises a plurality of second segments with electrically insulating material between at least some of the second segments, wherein each second segment of the plurality of second segments is sandwiched between a thermoelectric element of the at least one second thermoelectric element of the first thermoelectric assembly and a thermoelectric element of the at least one first thermoelectric element of the second thermoelectric assembly having different doping types.

12. The thermoelectric system of claim 1, wherein the fins of the plurality of fins extend generally outwardly from the at least one first shunt generally parallel to one another perpendicularly to the axial direction.

13. The thermoelectric system of claim 1, wherein at least some of the fins of the plurality of fins are planar in a plane generally parallel to the axial direction.

14. The thermoelectric system of claim 1, wherein at least some of the fins of the plurality of fins are planar in a plane perpendicular to the axial direction.

15. The thermoelectric system of claim 1, wherein the at least one compliant element is between and mechanically coupled to a first fin of the at least one heat exchanger of the first thermoelectric assembly and a second fin of the at least one heat exchanger of the second thermoelectric assembly.

16. The thermoelectric system of claim 1, wherein, the at least one compliant element is compliant in response to thermal expansion or contraction of the first thermoelectric assembly and the second thermoelectric assembly, the thermoelectric system further comprising a first cap extending around the tube at a first end of the thermoelectric system and a second cap extending around the tube at a second end of the thermoelectric system, wherein the first cap, the second cap, the at least one heat exchanger of the first thermoelectric assembly, the at least one heat exchanger of the second thermoelectric assembly, and the at least one compliant element form at least a portion of an enclosure containing the at least one first thermoelectric element and the at least one second thermoelectric element.

17. The thermoelectric system of claim 16, wherein the enclosure hermetically seals the at least one first thermoelectric element and the at least one second thermoelectric element within the enclosure.

18. A thermoelectric system comprising:
at least a portion of a tube having a first fluid flowing through the at least a portion of the tube along an axial direction of the tube;
a plurality of thermoelectric assemblies, wherein each thermoelectric assembly of the plurality of thermoelectric assemblies is in thermal communication with the tube and with a second fluid different from the first fluid and comprises:
at least one first shunt extending around an outer perimeter of the tube in a plane generally perpendicular to the axial direction;
at least one first thermoelectric element in thermal communication and in electrical communication with the at least one first shunt; and
at least one second thermoelectric element in thermal communication and in electrical communication with the at least one first shunt, wherein at least a portion of the at least one first shunt is sandwiched between the at least one first thermoelectric element and the at least one second thermoelectric element, wherein the at least one first thermoelectric element and the at least one second thermoelectric element are electrically isolated from the tube; and
a plurality of heat exchangers in thermal communication with the at least one first shunt, in thermal communication with the second fluid, and comprising a plurality of fins extending generally outwardly from the at least one first shunt;
at least one compliant element between and mechanically coupled to the plurality of heat exchangers of a first thermoelectric assembly of the plurality of thermoelectric assemblies and the plurality of heat exchangers of a second thermoelectric assembly of the plurality of thermoelectric assemblies; and
a plurality of second shunts, wherein each second shunt of the plurality of second shunts extends around the outer perimeter of the tube in a plane generally perpendicular to the axial direction and is in thermal communication with the tube, wherein at least a portion of each second shunt of the plurality of second shunts is electrically isolated from the tube and is in thermal communication with, in electrical communication with, and sandwiched between the first and second thermoelectric assemblies of the plurality of thermoelectric assemblies, wherein at least some of the plurality of thermoelectric assemblies and at least some of the plurality of second shunts are in series electrical communication with one another.

19. The thermoelectric system of claim 18, wherein the at least one first shunt of each thermoelectric assembly of the plurality of thermoelectric assemblies encircles the tube, and each second shunt of the plurality of second shunts encircles the tube.

20. The thermoelectric assembly of claim 18, wherein the plurality of thermoelectric assemblies and the plurality of second shunts alternate with one another along the axial direction, and an electrical current flow path through the plurality of thermoelectric assemblies and the plurality of second shunts is in a direction generally parallel to the axial direction.

21. The thermoelectric system of claim 18, wherein each thermoelectric assembly of the plurality of thermoelectric assemblies further comprises at least one electrically insulating layer electrically isolating the at least one first thermoelectric element from the conduit and electrically isolating the at least one second thermoelectric element from the tube.

22. The thermoelectric system of claim 18, wherein each compliant element of the at least one compliant element is sandwiched between and mechanically coupled to the pluralities of heat exchangers of two adjacent thermoelectric assemblies of the plurality of thermoelectric assemblies.

23. The thermoelectric system of claim 18, further comprising at least one electrically insulating layer between the pluralities of heat exchangers of two adjacent thermoelectric assemblies of the plurality of thermoelectric assemblies.

24. The thermoelectric system of claim 18, wherein at least one heat exchanger of the plurality of heat exchangers is compliant in response to motion among portions of the thermoelectric system.

25. The thermoelectric system of claim 18, wherein at least some second shunts of the plurality of second shunts are configured to slide along the tube and to remain in thermal communication with the tube in response to thermal expansion or contraction within the thermoelectric system.

26. The thermoelectric system of claim 18, wherein the plurality of second shunts is responsive to increases of temperature by increasing a compressive force in a radial direction applied to the tube.

27. The thermoelectric system of claim 18, wherein the fins of the plurality of fins extend generally outwardly from the at least one first shunt generally parallel to one another perpendicularly to the axial direction.

28. The thermoelectric system of claim 18, wherein at least some of the fins of the plurality of fins are planar in a plane generally parallel to the axial direction.

29. The thermoelectric system of claim 18, wherein at least some of the fins of the plurality of fins are planar in a plane perpendicular to the axial direction.

30. The thermoelectric system of claim 18, wherein the at least one compliant element is between and mechanically coupled to a first fin of the plurality of heat exchangers of the first thermoelectric assembly and a second fin of the plurality of heat exchangers of the second thermoelectric assembly.

31. The thermoelectric system of claim 18, further comprising a plurality of compliant elements that comprises the at least one compliant element, each compliant element of the plurality of compliant elements between and mechanically coupled to the plurality of heat exchangers of adjacent thermoelectric assemblies, a first cap extending around the tube at a first end of the thermoelectric system, and a second cap extending around the tube at a second end of the thermoelectric system, wherein the first cap, the second cap, the plurality of heat exchangers, and the plurality of compliant elements form at least a portion of an enclosure containing the first thermoelectric elements and the second thermoelectric elements.

32. The thermoelectric system of claim 31, wherein the enclosure hermetically seals the first thermoelectric elements and the second thermoelectric elements within the enclosure.

33. The thermoelectric system of claim 18, wherein the at least one first shunt comprises a plurality of first segments with electrically insulating material between the first segments, the at least one first thermoelectric element comprising a plurality of p-type thermoelectric elements and a plurality of n-type thermoelectric elements, the at least one second thermoelectric element comprising a plurality of p-type thermoelectric elements and a plurality of n-type thermoelectric elements, wherein each first segment of the plurality of first segments is sandwiched between a thermoelectric element of the at least one first thermoelectric element and a thermoelectric element of the at least one second thermoelectric element having different doping types.

34. The thermoelectric system of claim 33, wherein each second shunt of the plurality of second shunts comprises a plurality of second segments with electrically insulating material between at least some of the second segments, wherein each second segment of the plurality of second segments is sandwiched between a thermoelectric element of the at least one second thermoelectric element of the first thermoelectric assembly and a thermoelectric element of the at least one first thermoelectric element of the second thermoelectric assembly having different doping types.

35. The thermoelectric system of claim 34, wherein a current flow path through the thermoelectric system passes multiple times through each thermoelectric assembly of the plurality of thermoelectric assemblies and each second shunt of the plurality of second shunts.

* * * * *